US012118333B2

(12) United States Patent
Ikeda et al.

(10) Patent No.: US 12,118,333 B2
(45) Date of Patent: Oct. 15, 2024

(54) SEMICONDUCTOR DEVICE

(71) Applicant: SEMICONDUCTOR ENERGY LABORATORY CO., LTD., Atsugi (JP)

(72) Inventors: Takayuki Ikeda, Kanagawa (JP); Roh Yamamoto, Toyama (JP); Shuichi Katsui, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1025 days.

(21) Appl. No.: 17/050,359

(22) PCT Filed: Apr. 15, 2019

(86) PCT No.: PCT/IB2019/053066
§ 371 (c)(1),
(2) Date: Feb. 9, 2021

(87) PCT Pub. No.: WO2019/207404
PCT Pub. Date: Oct. 31, 2019

(65) Prior Publication Data
US 2021/0318856 A1    Oct. 14, 2021

(30) Foreign Application Priority Data

Apr. 26, 2018   (JP) ................... 2018-084713

(51) Int. Cl.
*G06F 7/60*    (2006.01)
*G06F 7/57*    (2006.01)
(Continued)

(52) U.S. Cl.
CPC ................. *G06F 7/60* (2013.01); *G06F 7/57* (2013.01); *G06N 3/08* (2013.01); *H01L 27/1207* (2013.01);
(Continued)

(58) Field of Classification Search
CPC ......... G06F 7/60; G06F 7/57; H01L 27/1225; H01L 27/1255; H01L 29/7869;
(Continued)

(56) References Cited

U.S. PATENT DOCUMENTS 6,563,480 B1    5/2003 Nakamura
7,674,650 B2    3/2010 Akimoto et al.
(Continued)

FOREIGN PATENT DOCUMENTS

CN    101446723 A    6/2009
CN    102737586 A    10/2012
(Continued)

OTHER PUBLICATIONS

International Search Report (Application No. PCT/IB2019/053066) Dated Jun. 18, 2019.
(Continued)

*Primary Examiner* — Tan V Mai
(74) *Attorney, Agent, or Firm* — Fish & Richardson P.C.

(57) ABSTRACT

A semiconductor device that updates a weight coefficient used for arithmetic operation by an artificial neural network is provided. Each of the first to third memory cells draws a current corresponding to data of its retention node and changes the data in accordance with the potentials of first and second wirings. When a weight coefficient and first and second reference data are held in the retention nodes of the first to third memory cells, the first circuit supplies, to a third wiring, a constant currents drawn by the second and third memory cells. When input data is input to the first wiring, a difference current between the constant current and a current drawn by the first memory cell is changed, and the second circuit outputs arithmetic result data corresponding to the change. The third circuit inputs update data corresponding to the arithmetic result data to the second wiring.

20 Claims, 32 Drawing Sheets

(51) Int. Cl.
  *G06N 3/08* (2023.01)
  *H01L 27/12* (2006.01)
  *H01L 29/786* (2006.01)
  *H10B 12/00* (2023.01)

(52) U.S. Cl.
  CPC ........ *H01L 27/1225* (2013.01); *H01L 27/124* (2013.01); *H01L 27/1255* (2013.01); *H01L 29/78648* (2013.01); *H01L 29/7869* (2013.01); *H10B 12/00* (2023.02)

(58) Field of Classification Search
  CPC .. H01L 29/78696; H10B 12/00; G06N 3/048; G06N 3/065
  USPC .......................................................... 708/490
  See application file for complete search history.

(56) References Cited

U.S. PATENT DOCUMENTS

| | | | |
|---|---|---|---|
| 8,860,108 | B2 | 10/2014 | Yamazaki et al. |
| 9,934,826 | B2 | 4/2018 | Kurokawa |
| 10,140,940 | B2 | 11/2018 | Aoki |
| 10,141,069 | B2 | 11/2018 | Ikeda et al. |
| 10,699,794 | B2 | 6/2020 | Ikeda et al. |
| 2009/0135323 | A1 | 5/2009 | Yang. et al. |
| 2012/0249509 | A1 | 10/2012 | Kim et al. |
| 2016/0343452 | A1 | 11/2016 | Ikeda et al. |
| 2017/0045787 | A1 | 2/2017 | Kita et al. |
| 2017/0301376 | A1 | 10/2017 | Kurokawa |
| 2020/0176069 | A1 | 6/2020 | Ikeda et al. |
| 2020/0193928 | A1 | 6/2020 | Kawashima et al. |

FOREIGN PATENT DOCUMENTS

| | | |
|---|---|---|
| CN | 106462020 A | 2/2017 |
| EP | 2506247 A | 10/2012 |
| JP | 2007-096055 A | 4/2007 |
| JP | 2007-123861 A | 5/2007 |
| JP | 2009-128900 A | 6/2009 |
| JP | 2010-156963 A | 7/2010 |
| JP | 2011-119674 A | 6/2011 |
| JP | 2012-058335 A | 3/2012 |
| JP | 2016-219011 A | 12/2016 |
| JP | 2017-027012 A | 2/2017 |
| JP | 2017-194963 A | 10/2017 |
| JP | 2019-045613 A | 3/2019 |
| JP | 2019-045614 A | 3/2019 |
| KR | 2009-0054300 A | 5/2009 |
| KR | 2012-0110387 A | 10/2012 |
| TW | 201741942 | 12/2017 |
| WO | WO-2015/163255 | 10/2015 |
| WO | WO-2017/178947 | 10/2017 |
| WO | WO-2019/030595 | 2/2019 |
| WO | WO-2019/043483 | 3/2019 |

OTHER PUBLICATIONS

Written Opinion (Application No. PCT/IB2019/053066) Dated Jun. 18, 2019.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Morie. T et al., "An All-Analog Expandable Neural Network LSI with On-Chip Backpropagation Learning", IEEE Journal of Solid-State Circuits, Sep. 1, 1994, vol. 29, No. 9, pp. 1086-1093.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Maeda. Y et al., "A Learning Rule of Neural Networks via Simultaneous Perturbation and Its Hardware Implementation", Neural Networks, Mar. 1, 1995, vol. 8, No. 2, pp. 251-259.
International Search Report (Application No. PCT/IB2018/056715) Dated Dec. 18, 2018.
Written Opinion (Application No. PCT/IB2018/056715) Dated Dec. 18, 2018.

ACTV

ACTV

CMP

FDA

500A

500A

500A

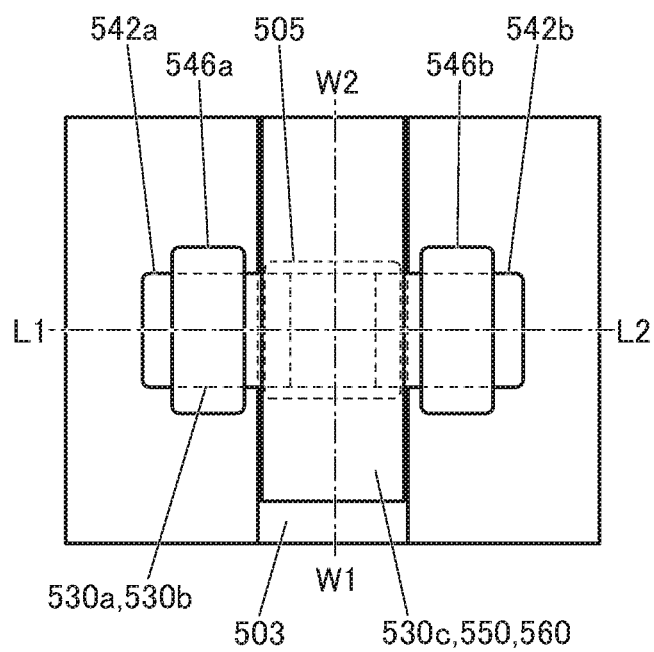
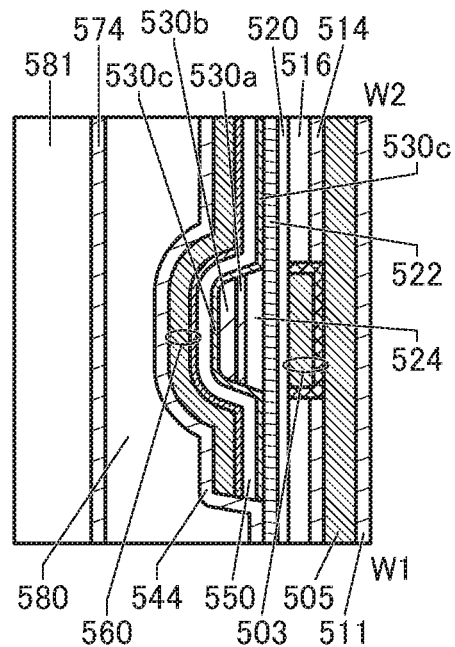
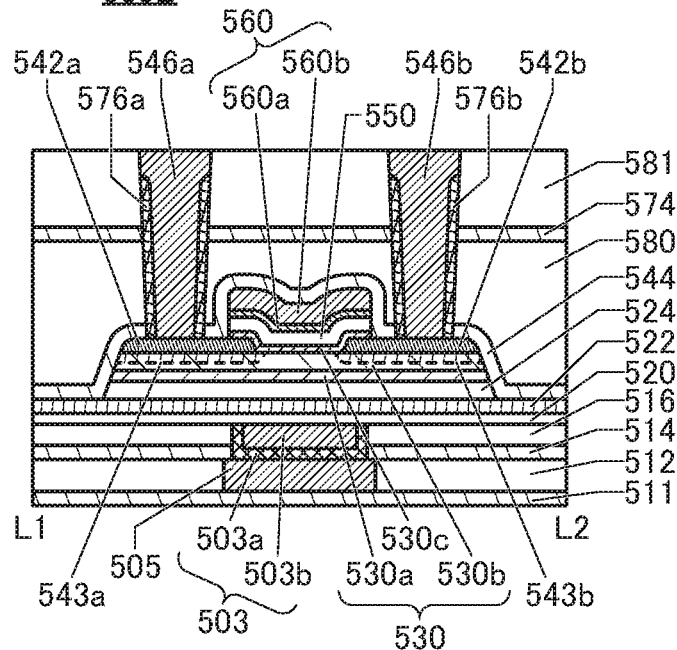

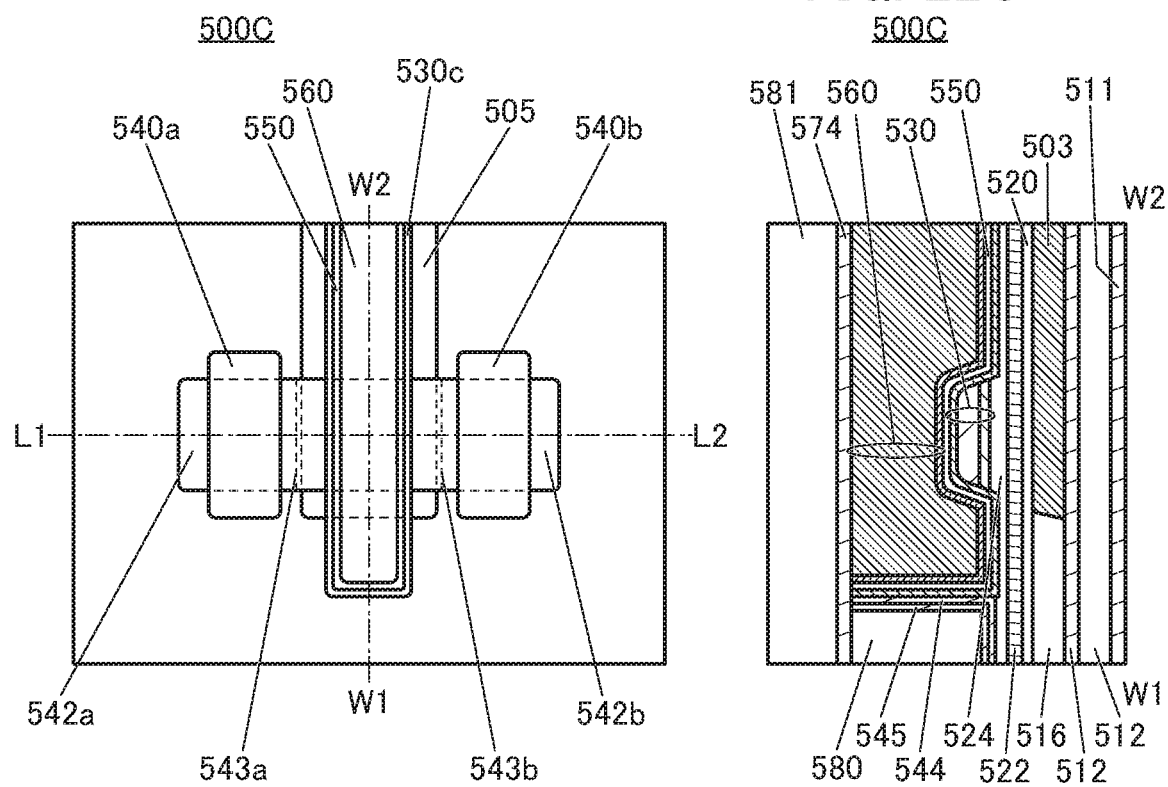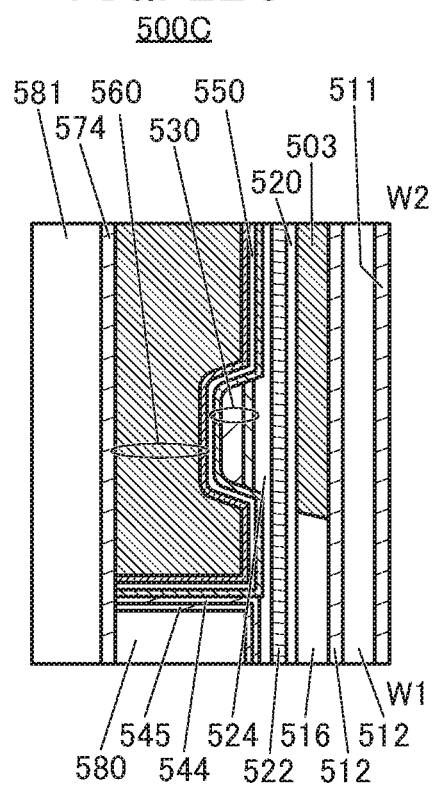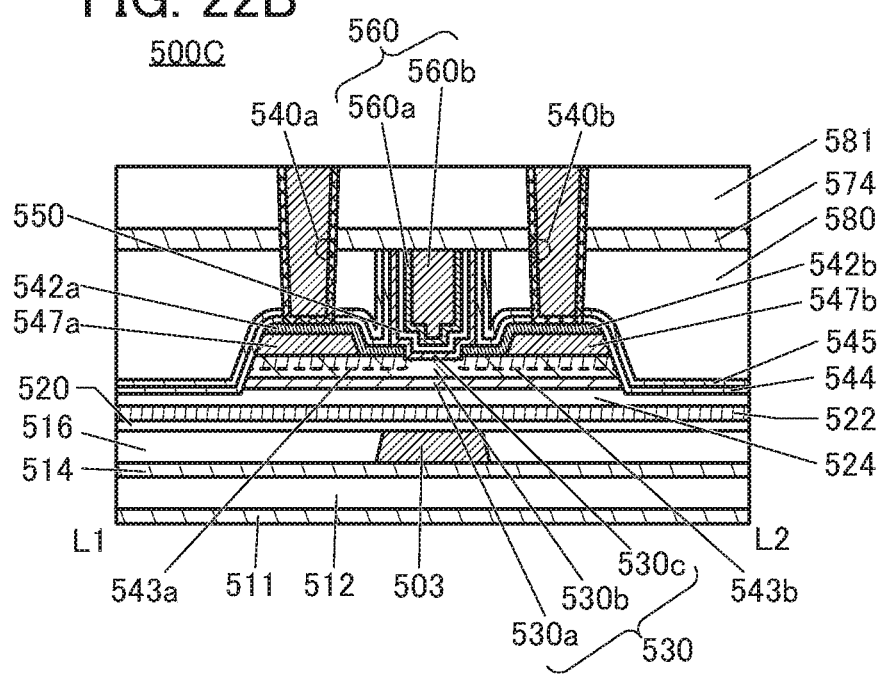

500D

500D

500D

500E

500E

500E

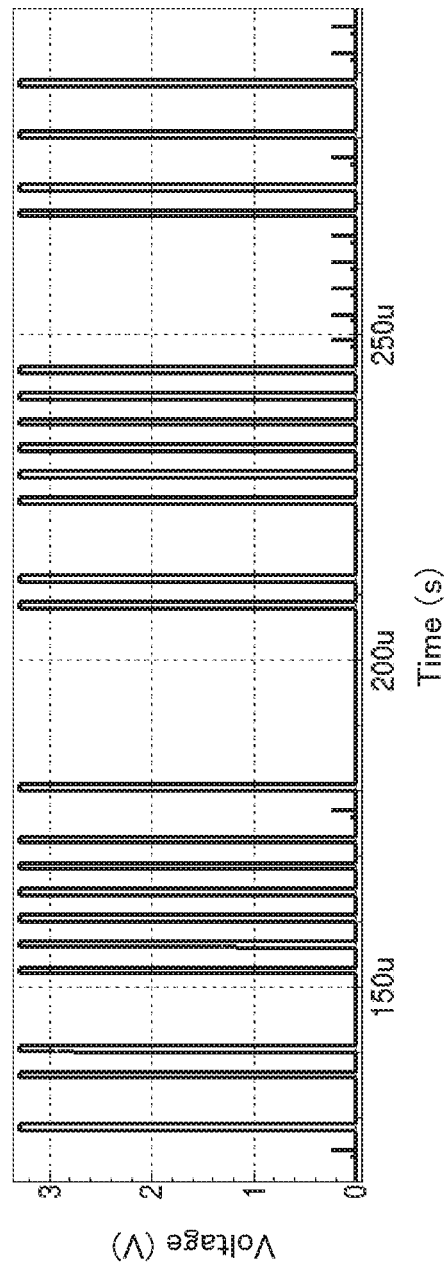
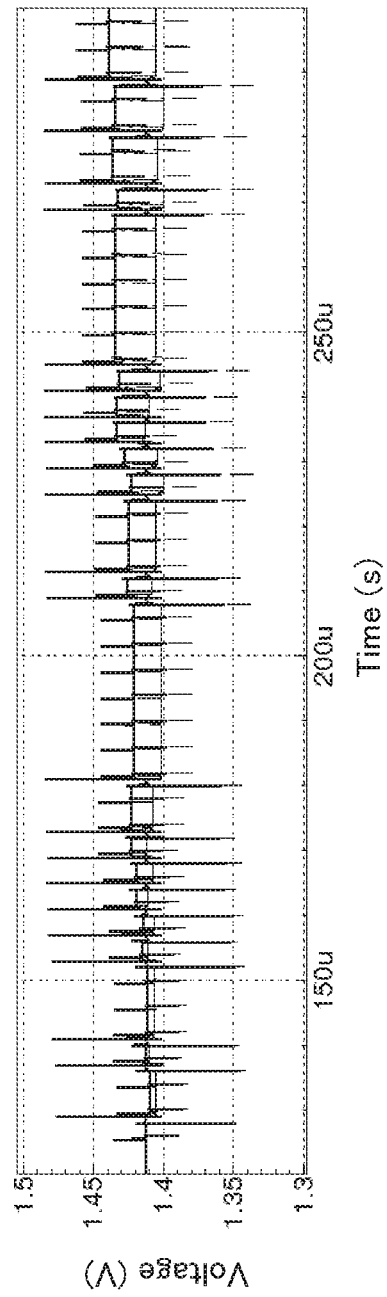

SEMICONDUCTOR DEVICE

CROSS REFERENCE TO RELATED APPLICATIONS

This application is a U.S. National Phase application under 35 U.S.C. § 371 of International Application PCT/IB2019/053066, filed on Apr. 15, 2019, which is incorporated by reference and claims the benefit of a foreign priority application filed in Japan on Apr. 26, 2018, as Application No. 2018-084713.

TECHNICAL FIELD

One embodiment of the present invention relates to a semiconductor device. Another embodiment of the present invention relates to a method for operating a semiconductor device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a processor, an electronic device, a system, a driving method thereof, a manufacturing method thereof, and a testing method thereof.

BACKGROUND ART

An artificial neural network is an information processing system modeled on a biological neural network. With the use of an artificial neural network, computers with higher performance than conventional von Neumann computers are expected to be achieved, and in recent years, a variety of researches for building artificial neural networks in electronic circuits have been carried out.

In particular, Patent Document 1 discloses an invention in which weight data necessary for computation in an artificial neural network is retained in a memory device using a transistor that contains an oxide semiconductor in its channel formation region.

Examples of the oxide semiconductor include not only single-component metal oxides, such as indium oxide and zinc oxide, but also multi-component metal oxides. Among the multi-component metal oxides, an In—Ga—Zn oxide (hereinafter also referred to as IGZO) in particular has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). Non-Patent Document 1 and Non-Patent Document 2 also disclose a technique for fabricating a transistor using an oxide semiconductor having a CAAC structure. Moreover, Non-Patent Document 4 and Non-Patent Document 5 show that a fine crystal is included even in an oxide semiconductor that has lower crystallinity than the CAAC structure or the nc structure.

A transistor using IGZO for an active layer has an extremely low off-state current (see Non-Patent Document 6), and an LSI and a display device utilizing the characteristics have been reported (see Non-Patent Document 7 and Non-Patent Document 8). Patent Document 2 discloses an invention in which a transistor including IGZO in an active layer is used in a pixel circuit of a display device.

REFERENCE

Patent Document

[Patent Document 1] United States Patent Application Publication No. 2016/0343452 [Patent Document 2] Japanese Published Patent Application No. 2010-156963

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

In order to construct a hierarchical artificial neural network as a semiconductor device, it is necessary to achieve a product-sum operation circuit in which the connection strength between a plurality of first neurons in a first layer and one of second neurons in a second layer is stored, the output of each of the first neurons in the first layer and the corresponding connection strength are multiplied, and the products are summed. In other words, a memory that holds the connection strength, a multiplier circuit and an adder circuit that perform product-sum operation, and the like need to be mounted on the semiconductor device.

In the case where the memory, the multiplier circuit, the adder circuit, and the like are configured with digital circuits, the memory needs to be able to store multi-bit data and moreover, the multiplier circuit and the adder circuit need to be able to perform multi-bit arithmetic operation. In other words, a large-scale memory, a large-scale multiplier circuit, and a large-scale adder circuit are required to construct a hierarchical artificial neural network using digital circuits; thus, the chip area of the digital circuits is increased.

On the other hand, in the case where the memory, the multiplier circuit, the adder circuit, and the like are configured with analog circuits, the chip area of the analog circuits can be made smaller than the chip area of the digital circuits because the analog circuits do not need to configure large-scale arithmetic circuits, compared to the case using the digital circuits.

In the case where learning is performed on a hierarchical artificial neural network, it is necessary to perform arithmetic operation repeatedly and change the connection strength stored in a memory each time. Specifically, in a hierarchical artificial neural network having an existing connection strength (sometimes referred to as weight coefficient, weight data, and the like), an arithmetic operation result is output, a new connection strength is calculated based on the arithmetic operation result, and the existing connection strength stored in the memory is updated to the new connection strength. Then, in the hierarchical artificial neural network having the new connection strength, once again, an arithmetic operation result is output, a connection strength is calculated based on the arithmetic operation result, and the connection strength in the memory is updated. In other words, the connection strength in the memory needs to be rewritten for each arithmetic operation; thus, it sometimes takes long time to perform learning on the hierarchical artificial neural network.

An object of one embodiment of the present invention is to provide a semiconductor device including a hierarchical artificial neural network capable of learning. Another object of one embodiment of the present invention is to provide a semiconductor device that updates a weight coefficient in a short time. Another object of one embodiment of the present invention is to provide a semiconductor device with low power consumption.

Note that the objects of one embodiment of the present invention are not limited to the objects listed above. The objects listed above do not preclude the existence of other objects. The other objects are objects that are not described in this section and will be described below. The objects that are not described in this section will be derived from the descriptions of the specification, the drawings, and the like by those skilled in the art and can be extracted as appropriate from these descriptions. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a semiconductor device including first to third circuits, first to third memory cells, and first to fifth wirings. The first circuit is electrically connected to the first memory cell and the second circuit through the first wiring. The first circuit is electrically connected to the second memory cell through the fourth wiring. The first circuit is electrically connected to the third memory cell through the fifth wiring. The second circuit is electrically connected to the third circuit. The third circuit is electrically connected to the first memory cell and the second memory cell through the second wiring. The third circuit is electrically connected to the first memory cell and the third memory cell through the third wiring. The third circuit includes an input terminal. Each of the first to third memory cells includes a retention node. The first memory cell has a function of changing a potential of the retention node of the first memory cell in accordance with a change in a potential of the second wiring, a function of changing the potential of the retention node of the first memory cell in accordance with a change in a potential of the third wiring, and a function of making a current corresponding to the potential of the retention node of the first memory cell flow between the first memory cell and the first wiring. The second memory cell has a function of changing a potential of the retention node of the second memory cell in accordance with the change in the potential of the second wiring, and a function of making a current corresponding to the potential of the retention node of the second memory cell flow between the second memory cell and the fourth wiring. The third memory cell has a function of changing a potential of the retention node of the third memory cell in accordance with the change in the potential of the third wiring, and a function of making a current corresponding to the potential of the retention node of the third memory cell flow between the third memory cell and the fifth wiring. The first circuit has a function of supplying, to the first wiring, a current corresponding to the current flowing through the fourth wiring and the current flowing through the fifth wiring. The second circuit has a function of generating a first potential corresponding to a first current that flows between the first wiring and the second circuit and outputting the first potential to the third circuit. A second potential is input to the input terminal of the third circuit. The third circuit has a function of changing the potential of the third wiring when the first potential, the second potential, and the potential of the second wiring are input to the third circuit.

(2)

One embodiment of the present invention is the semiconductor device with the above configuration of (1), in which the third circuit includes an integrator circuit; and an output terminal of the integrator circuit is electrically connected to the third wiring.

(3)

One embodiment of the present invention is the semiconductor device with the above configuration of (1) or (2), in which the second circuit includes a comparator and a resistor; one of an inverting input terminal and a non-inverting input terminal of the comparator is electrically connected to the resistor and the first wiring; and an output terminal of the comparator is electrically connected to the third circuit.

(4)

One embodiment of the present invention is the semiconductor device with the above configuration of any one of (1) to (3), in which a potential corresponding to first data is held in the retention node of the first memory cell; the amount of the change in the potential of the second wiring is a potential difference corresponding to second data; the first current is a current corresponding to a product of the first data and the second data; the second potential is a potential corresponding to teacher data; and the amount of the change in the potential of the third wiring is a potential difference corresponding to update data.

(5)

One embodiment of the present invention is the semiconductor device with the above configuration of (4), including a plurality of first memory cells, a plurality of second memory cells, a plurality of third memory cells, a plurality of third circuits, a plurality of second wirings, and a plurality of third wirings. Each of the plurality of first memory cells is electrically connected to the first wiring. Each of the plurality of second memory cells is electrically connected to the fourth wiring. Each of the plurality of third memory cells is electrically connected to the fifth wiring. Each of the plurality of third circuits is electrically connected to one of the plurality of first memory cells and one of the plurality of second memory cells through one of the plurality of second wirings. Each of the plurality of third circuits is electrically connected to one of the plurality of first memory cells and one of the plurality of third memory cells through one of the plurality of third wirings. Potentials corresponding to a plurality of pieces of first data are held in the retention nodes of the plurality of first memory cells. Potential differences corresponding to a plurality of pieces of second data are input to the plurality of second wirings. The first current is a current corresponding to a product-sum of the plurality of pieces of first data and the plurality of pieces of second data. The plurality of third circuits output potential differences corresponding to a plurality of pieces of update data to the plurality of third wirings.

(6)

One embodiment of the present invention is the semiconductor device with the above configuration of any one of (1) to (5), in which each of the first to third memory cells includes a first transistor, a second transistor, a first capacitor, and a second capacitor. In the first to third memory cells, a first terminal of the first transistor is electrically connected to a gate of the second transistor, a first terminal of the first capacitor, and a first terminal of the second capacitor; a second terminal of the first capacitor is electrically connected to the second wiring; and a second terminal of the second capacitor is electrically connected to the third wiring. In the first memory cell, a first terminal of the second transistor is electrically connected to the first wiring. In the second memory cell, a first terminal of the second transistor is electrically connected to the fourth wiring. In the third memory cell, a first terminal of the second transistor is electrically connected to the fifth wiring.

(7)

One embodiment of the present invention is a semiconductor device including first to third circuits, a first memory cell, and first to third wirings. The first circuit is electrically connected to the first memory cell and the second circuit through the first wiring. The second circuit is electrically connected to the third circuit. The third circuit is electrically connected to the first memory cell through the second wiring. The third circuit is electrically connected to the first memory cell through the third wiring. The third circuit includes an input terminal. The first memory cell includes a retention node. The first memory cell has a function of changing a potential of the retention node of the first memory cell in accordance with a change in a potential of the second wiring, a function of changing the potential of the retention node of the first memory cell in accordance with a change in a potential of the third wiring, and function of making a current corresponding to the potential of the retention node of the first memory cell flow between the first memory cell and the first wiring. The first circuit has a function of supplying a current to the first wiring. The second circuit has a function of generating a first potential corresponding to a first current that flows between the first wiring and the second circuit and outputting the first potential to the third circuit. A second potential is input to the input terminal of the third circuit. The third circuit has a function of changing the potential of the third wiring in accordance with the first potential, the second potential, and the potential of the second wiring when the first potential, the second potential, and the potential of the second wiring are input to the third circuit.

(8)

One embodiment of the present invention is the semiconductor device with the above configuration of (7), in which the third circuit includes an integrator circuit, and an output terminal of the integrator circuit is electrically connected to the third wiring.

(9)

One embodiment of the present invention is the semiconductor device with the above configuration of (7) or (8), in which the second circuit includes a comparator, a resistor, and a first switch; one of an inverting input terminal and a non-inverting input terminal of the comparator is electrically connected to the resistor; the one of the inverting input terminal and the non-inverting input terminal of the comparator is electrically connected to the first wiring through the first switch; and an output terminal of the comparator is electrically connected to the third circuit.

(10)

One embodiment of the present invention is the semiconductor device with the above configuration of any one of (7) to (9), in which the first circuit includes a first constant current circuit, a second constant current circuit, and a current sink circuit; the first constant current circuit has a function of supplying a current to the current sink circuit or supplying a current to the first wiring; the second constant current circuit has a function of supplying a current to the first wiring; and the current sink circuit has a function of drawing a current from the first constant current circuit or drawing a current from the first wiring.

(11)

One embodiment of the present invention is the semiconductor device with the above configuration of (10), in which the first constant current circuit has a function of generating a second current that flows from the first circuit to the first wiring, as a constant current, when a first retention potential is held in the retention node of the first memory cell, a first initial potential is input from the second wiring, and a second initial potential is input from the third wiring. The second constant current circuit has a function of generating a third current that flows from the first circuit to the first wiring, as the constant current, when the first retention potential is held in the retention node of the first memory cell, a third potential is input from the second wiring, and the second initial potential is input from the third wiring. The current sink circuit has a function of drawing the second current that flows from the first constant current circuit, as the constant current, when the first retention potential is held in the retention node of the first memory cell, the third potential is input from the second wiring, and the second initial potential is input from the third wiring. The first constant current circuit has a function of generating a fourth current that flows from the first circuit to the first wiring, as the constant current, when a second retention potential is held in the retention node of the first memory cell, the first initial potential is input from the second wiring, and the second initial potential is input from the third wiring. The first memory cell has a function of making a fifth current corresponding to the second retention potential, the third potential, and the second initial potential flow between the first memory cell and the first wiring, when the second retention potential is held in the retention node of the first memory cell, the third potential is input from the second wiring, and the second initial potential is input from the third wiring. The first circuit has a function of making a sum of the second to fourth currents generated by the first constant current circuit, the second constant current circuit, and the current sink circuit flow through the first wiring, when the second retention potential is held in the retention node of the first memory cell, the third potential is input from the second wiring, and the second initial potential is input from the third wiring. The first current is a difference current between the sum of the second to fourth currents and the fifth current. The third circuit has a function of changing the second initial potential of the third wiring to a fourth potential corresponding to the first potential, the second potential, and a potential difference between the first initial potential of the second wiring and the third potential.

(12)

One embodiment of the present invention is the semiconductor device with the above configuration of (11), in which a difference between the first retention potential and the second retention potential is a potential difference corresponding to first data; a difference between the first initial potential and the third potential is a potential difference corresponding to second data; the first current is a current corresponding to a product of the first data and the second data; the second potential is a potential corresponding to teacher data; and a difference between the second initial potential and the fourth potential is a potential difference corresponding to update data.

(13)

One embodiment of the present invention is the semiconductor device with the above configuration of (12), including a plurality of first memory cells, a plurality of third circuits, a plurality of second wirings, and a plurality of third wirings. Each of the plurality of first memory cells is electrically connected to the first wiring. Each of the plurality of third circuits is electrically connected to one of the plurality of first memory cells through one of the plurality of second wirings. Each of the plurality of third circuits is electrically connected to one of the plurality of first memory cells through one of the plurality of third wirings. Potential differences corresponding to a plurality of pieces of first data are held in the retention nodes of the plurality of first memory cells. Potential differences corresponding to a plurality of pieces of second data are applied to the plurality of second wirings. The first current is a current corresponding to a product-sum of the plurality of pieces of first data and the plurality of pieces of second data. The plurality of third circuits output potential differences corresponding to a plurality of pieces of update data to the plurality of third wirings.

(14)

One embodiment of the present invention is the semiconductor device with the above configuration of any one of (7) to (13), in which the first memory cell includes a first transistor, a second transistor, a first capacitor, and a second capacitor. A first terminal of the first transistor is electrically connected to a gate of the second transistor, a first terminal of the first capacitor, and a first terminal of the second capacitor. A second terminal of the first capacitor is electrically connected to the second wiring. A second terminal of the second capacitor is electrically connected to the third wiring. A first terminal of the second transistor is electrically connected to the first wiring.

(15)

One embodiment of the present invention is the semiconductor device with the above configuration of (6) or (14), in which a channel formation region of each of the first transistor and the second transistor contains a metal oxide; and each of the first to third circuits is configured as a single-polarity circuit.

(16)

One embodiment of the present invention is a method for operating a semiconductor device including first to third circuits, a first memory cell, and first to third wirings, wherein the first circuit is electrically connected to the first memory cell and the second circuit through the first wiring; the second circuit is electrically connected to the third circuit; the third circuit is electrically connected to the first memory cell through the second wiring; the third circuit is electrically connected to the first memory cell through the third wiring; the first circuit includes a first constant current circuit, a second constant current circuit, and a current sink circuit; the third circuit includes an input terminal; and the first memory cell includes a retention node. The operation method includes first to fourth periods. In the first period, a first retention potential is held in the retention node of the first memory cell; a first initial potential from the second wiring and a second initial potential from the third wiring are input to the first memory cell; a current corresponding to the first retention potential, the first initial potential, and the second initial potential flows between the first memory cell and the first wiring; and a second current that flows from the first circuit to the first wiring is generated by the first constant current circuit as a constant current. In the second period, the first retention potential is held in the retention node of the first memory cell; a third potential from the second wiring and the second initial potential from the third wiring are input to the first memory cell; a current corresponding to the first retention potential, the third potential, and the second initial potential flows between the first memory cell and the first wiring; a third current that flows from the first circuit to the first wiring is generated by the second constant current as a constant current; and the second current that flows from the first constant current circuit is drawn by the current sink circuit as a constant current. In the third period, a second retention potential is held in the retention node of the first memory cell; the first initial potential from the second wiring and the second initial potential from the third wiring are input to the first memory cell; a current corresponding to the second retention potential, the first initial potential, and the second initial potential flows between the first memory cell and the first wiring; and a fourth current that flows from the first circuit to the first wiring is generated by the first constant current circuit as a constant current. In the fourth period, the second retention potential is held in the retention node of the first memory cell; the third potential from the second wiring and the second initial potential from the third wiring are input to the first memory cell; a fifth current corresponding to the second retention potential, the third potential, and the second initial potential flows between the first memory cell and the first wiring; and when the first current flows between the second circuit and the first wiring as a difference current between the sum of the fourth current and the fifth current that are supplied to the first wiring and the sum of the second current and the third current that are drawn from the first wiring, a first potential corresponding to the first current is generated by the second circuit and is output to the third circuit. A second potential is input to the input terminal of the third circuit. When the first potential, the second potential, and a potential difference between the first initial potential of the second wiring and the third potential are input to the third circuit, the second initial potential of the third wiring is changed by the third circuit to a fourth potential corresponding to the first potential, the second potential, and the potential difference between the first initial potential and the third potential.

(17)

One embodiment of the present invention is the method for operating the semiconductor device according to the above operation method of (16), in which the third circuit includes an integrator circuit; and an output terminal of the integrator circuit is electrically connected to the third wiring.

(18)

One embodiment of the present invention is the method for operating the semiconductor device according to the above operation method of (16) or (17), in which the second circuit includes a comparator, a resistor, and a first switch; one of an inverting input terminal and a non-inverting input terminal of the comparator is electrically connected to the resistor; the one of the inverting input terminal and the non-inverting input terminal of the comparator is electrically connected to the first wiring through the first switch; and an output terminal of the comparator is electrically connected to the third circuit.

(19)

One embodiment of the present invention is the method for operating the semiconductor device according to the above operation method of any one of (16) to (18), in which a difference between the first retention potential and the second retention potential is a potential difference corresponding to first data; a difference between the first initial potential and the third potential is a potential difference corresponding to second data; the first current is a current corresponding to a product of the first data and the second data; the second potential is a potential corresponding to teacher data; and a difference between the second initial potential and the fourth potential is a potential difference corresponding to update data.

(20)

One embodiment of the present invention is the method for operating the semiconductor device according to the above operation method of (19), including a plurality of first memory cells, a plurality of third circuits, a plurality of second wirings, and a plurality of third wirings. Each of the plurality of first memory cells is electrically connected to the first wiring. Each of the plurality of third circuits is electrically connected to one of the plurality of first memory cells through one of the plurality of second wirings. Each of the plurality of third circuits is electrically connected to one of the plurality of first memory cells through one of the plurality of third wirings. Potential differences corresponding to a plurality of pieces of first data are held in the retention nodes of the plurality of first memory cells. Potential differences corresponding to a plurality of pieces of second data are applied to the plurality of second wirings. The first current is a current corresponding to a product-sum of the plurality of pieces of first data and the plurality of pieces of second data. The plurality of third circuits output potential differences corresponding to a plurality of pieces of update data to the plurality of third wirings.

(21)

One embodiment of the present invention is the method for operating the semiconductor device according to the above operation method of any one of (16) to (20), in which the first memory cell includes a first transistor, a second transistor, a first capacitor, and a second capacitor. A first terminal of the first transistor is electrically connected to a gate of the second transistor, a first terminal of the first capacitor, and a first terminal of the second capacitor. A second terminal of the first capacitor is electrically connected to the second wiring. A second terminal of the second capacitor is electrically connected to the third wiring. A first terminal of the second transistor is electrically connected to the first wiring.

(22)

One embodiment of the present invention is the method for operating the semiconductor device according to the above operation method of (21), in which a channel formation region of each of the first transistor and the second transistor contains a metal oxide; and each of the first to third circuits is configured as a single-polarity circuit.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relation shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, the switch has a function of being in a conduction state (on state) or a non-conduction state (off state) to determine whether current flows therethrough or not.

For example, in the case where X and Y are functionally connected, at least one circuit that enables functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween). That is, the explicit expression "X and Y are electrically connected" is the same as the explicit simple expression "X and Y are connected".

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples, and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a transistor includes three terminals called a gate, a source, and a drain. The gate functions as a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" are interchangeable in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". The ground potential does not necessarily mean 0 V. Note that potentials are relative values, and a potential applied to a wiring or the like is sometimes changed depending on the reference potential.

In general, "current" is defined as a charge transfer (electrical conduction) accompanied by transfer of positively charged objects; the description "electrical conduction of positively charged objects occurs" can be rephrased as "electrical conduction of negatively charged objects occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the carrier differs between current flow systems (e.g., a semiconductor, a metal, an electrolyte solution, and a vacuum). In general, "the direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. Moreover, the description "current is input to element A" can be rephrased as "current is output from element A", for example.

Ordinal numbers such as "first," "second," and "third" in this specification and the like are used in order to avoid confusion among components. Thus, the terms do not limit the number of components. In addition, the terms do not limit the order of components. In this specification and the like, for example, a "first" component in one embodiment (or example) can be referred to as a "second" component in other embodiments (or example) or claims. Furthermore, in this specification and the like, for example, a "first" component in one embodiment (or example) can be omitted in other embodiments or claims.

In this specification and the like, terms for describing arrangement, such as "over" and "under", are sometimes used for convenience to describe the positional relation between components with reference to drawings. The positional relation between components is changed as appropriate in accordance with a direction in which the components are described. Thus, terms for the description are not limited to those used in this specification and the like, and the description can be rephrased appropriately depending on the situation. For example, the expression "an insulator over (on) a top surface of a conductor" can be replaced with the expression "an insulator on a bottom surface of a conductor" when the direction of a drawing showing these components is rotated by 180°.

The term "over" or "under" does not necessarily mean that a component is placed directly on or directly under and in direct contact with another component. For example, the expression "electrode B over insulating layer A" does not necessarily mean that the electrode B is formed on and in direct contact with the insulating layer A and can mean the case where another component is provided between the insulating layer A and the electrode B.

In this specification and the like, the terms "film," "layer," and the like can be interchanged with each other according to circumstances. For example, the term "conductive layer" can be changed into the term "conductive film" in some cases. As another example, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. As another example, the term "insulating layer" or "insulating film" can be changed into the term "insulator" in some cases.

In this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" provided in an integrated manner.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to, for example, an element other than the main component of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main component; specific examples are hydrogen (contained also in water), lithium, sodium, silicon, boron, phosphorus, carbon, and nitrogen. In the case of an oxide semiconductor, oxygen vacancies might be formed by entry of impurities such as hydrogen. Furthermore, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch is in a conduction state (on state) or in a non-conduction state (off state) to determine whether current flows therethrough or not. Alternatively, a switch has a function of selecting and changing a current path. For example, an electrical switch or a mechanical switch can be used. That is, a switch can be any element capable of controlling current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode that can be moved mechanically, and operates by controlling conduction and non-conduction with movement of the electrode.

Effect of the Invention

One embodiment of the present invention can provide a semiconductor device including a hierarchical artificial neural network capable of learning. Alternatively, one embodiment of the present invention can provide a semiconductor device that updates a weight coefficient in a short time. Alternatively, one embodiment of the present invention can provide a semiconductor device with low power consumption.

Note that the effects of one embodiment of the present invention are not limited to the effects listed above. The effects listed above do not preclude the existence of other effects. The other effects are effects that are not described in this section and will be described below. The other effects that are not described in this section will be derived from the descriptions of the specification, the drawings, and the like by those skilled in the art and can be extracted as appropriate from these descriptions. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIGS. 21A to 21C A top view and cross-sectional views illustrating a structure example of a transistor.

FIGS. 22A to 22C A top view and cross-sectional views illustrating a structure example of a transistor.

FIGS. 32A and 32B Graphs showing a change in internal voltage of a circuit used for calculation in Example.

MODE FOR CARRYING OUT THE INVENTION

Figure 1:
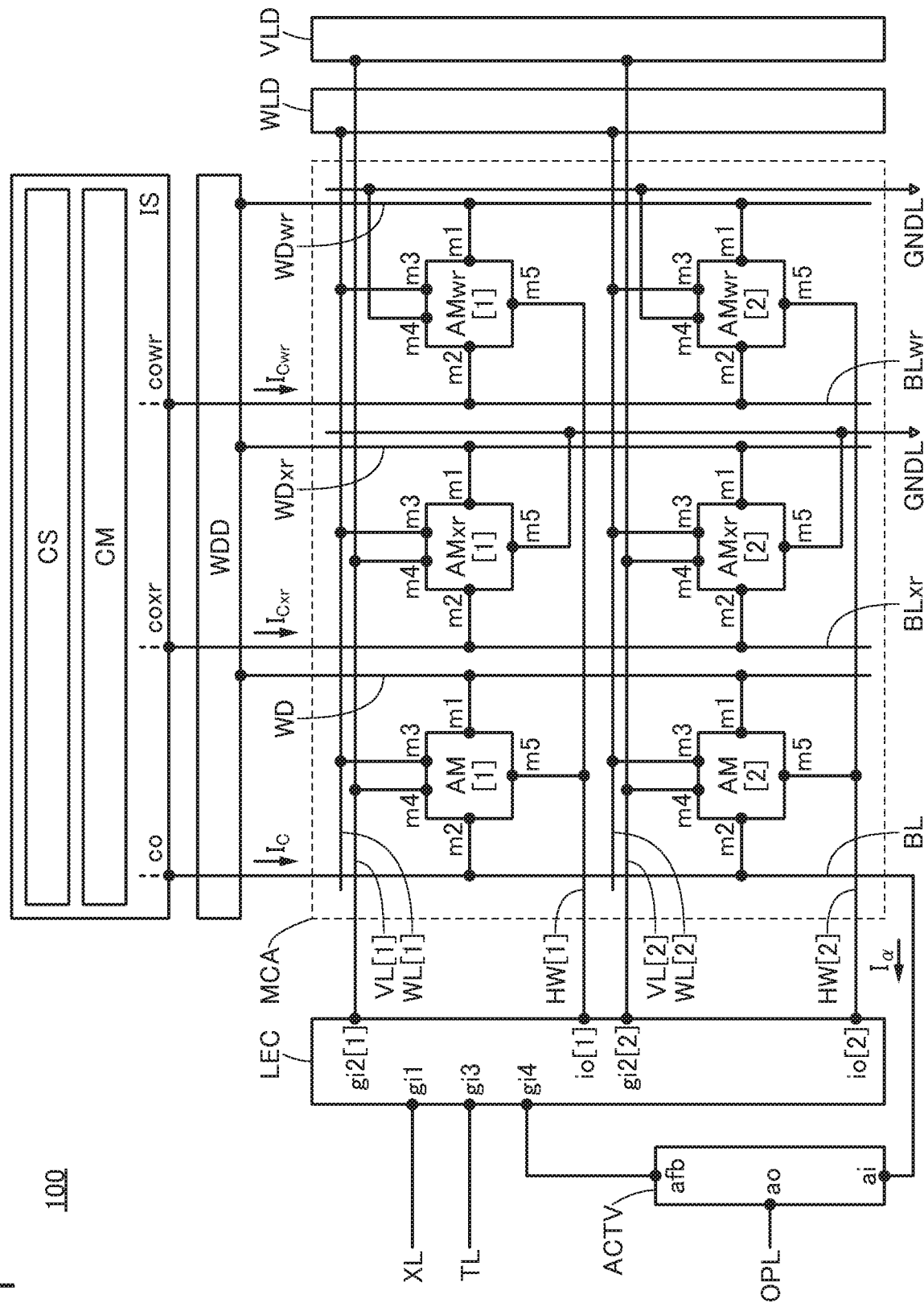
FIG. 1 A block diagram illustrating an example of a semiconductor device.

In this specification and the like, an artificial neural network (ANN, hereinafter referred to as a neural network) generally means a model that imitates a biological neural network. In general, a neural network has a structure in which units that imitate neurons are connected to each other through a unit that imitates a synapse.

The connection strength of the synapse (the connection strength of neurons) can be changed by providing the neural network with existing data. The processing for determining a connection strength by providing a neural network with existing data in such a manner is called "learning" in some cases.

Furthermore, when a neural network in which "learning" has been performed (a connection strength has been determined) is provided with some type of data, new data can be output on the basis of the connection strength. The processing for outputting new data on the basis of provided data and a connection strength in a neural network in such a manner is called "inference" or "recognition" in some cases.

Examples of the model of a neural network include a Hopfield type and a hierarchical type. In particular, a neural network with a multilayer structure is referred to as a "deep neural network" (DNN), and machine learning using the deep neural network is referred to as "deep learning".

In this specification and the like, a metal oxide is an oxide of metal in a broad sense. Metal oxides are classified into an oxide insulator, an oxide conductor (including a transparent oxide conductor), an oxide semiconductor, and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. Moreover, an OS FET or an OS transistor can also be referred to as a transistor including a metal oxide or an oxide semiconductor.

Furthermore, in this specification and the like, a metal oxide containing nitrogen is in some cases also collectively referred to as a metal oxide. A metal oxide containing nitrogen may be referred to as a metal oxynitride.

In this specification and the like, one embodiment of the present invention can be constituted by appropriately combining the structure described in an embodiment (or an example) with any of the structures described in the other embodiments (or the other examples). In addition, in the case where a plurality of structure examples are described in one embodiment, the structure examples can be combined as appropriate Note that a content (or part thereof) described in one embodiment (or example) can be applied to, combined with, or replaced with at least one of another content (or part thereof) described in the embodiment (or the example) and a content (or part thereof) described in one or more of different embodiments (or one or more of different examples).

Note that in each embodiment (or example), a content described in the embodiment (or the example) is a content described with reference to a variety of diagrams or a content described with text in the specification.

Note that by combining a diagram (or part thereof) described in one embodiment (or example) with at least one of another part of the diagram, a different diagram (or part thereof) described in the embodiment (or the example), and a diagram (or part thereof) described in one or more of different embodiments (or one or more of different examples), much more diagrams can be formed.

Embodiments (or example) in this specification are described with reference to drawings. However, the embodiments (or example) can be implemented with various different modes. It is readily understood by those skilled in the art that modes and details can be changed in various ways without departing from the spirit and scope of the present invention. Thus, the present invention should not be interpreted as being limited to the description of the embodiments (or example). Note that in the structures of the invention in the embodiments (or the structure in the example), the same portions or portions having similar functions are denoted by the same reference numerals in different drawings, and a repetitive description of such portions is omitted in some cases. Also, in perspective views and the like, some components might not be illustrated for clarity of the drawings.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, the following can be included: variation in signal, voltage, or current due to noise or difference in timing.

Embodiment 1

In this embodiment, a structure example and an operation example of an arithmetic circuit that is a semiconductor device of one embodiment of the present invention will be described.

FIG. 1 illustrates a structure example of an arithmetic circuit 100. The arithmetic circuit 100 illustrated in FIG. 1 is a circuit that performs product-sum operation of first data retained in a memory cell described later and second data input to the memory cell, and outputs the value of an activation function corresponding to the result of the product-sum operation. Note that the first data and the second data can be analog data or multilevel data (discrete data).

The arithmetic circuit 100 illustrated in FIG. 1 includes a current supply circuit IS, a circuit WDD, a circuit WLD, a circuit VLD, an activation function circuit ACTV, a learning circuit LEC, and a memory cell array MCA.

<<Memory Cell Array MCA>>

The memory cell array MCA includes a memory cell AM[1], a memory cell AM[2], a memory cell AMxr[1], a memory cell AMxr[2], a memory cell AMwr[1], and a memory cell AMwr[2]. The memory cell AM[1] and the memory cell AM[2] have a function of retaining the first data, and the memory cell AMxr[1] and the memory cell AMxr[2] have a function of retaining first reference data that is needed to perform product-sum operation. The memory cell AMwr[1] and the memory cell AMwr[2] have a function of retaining second reference data that is needed to perform product-sum operation. That is, the memory cell array MCA also serves as a nonvolatile local memory. For that reason, providing the memory portion that retains data in the circuit that performs arithmetic operation can omit the time for reading out data necessary for the calculation from the outside of the arithmetic circuit 100 and transmitting it to the arithmetic circuit every time the calculation is performed. Note that the reference data can also be analog data or multilevel data (discrete data), like the first data and the second data.

The memory cell array MCA in FIG. 1 has a configuration in which memory cells are arranged in a matrix of two rows and three columns; alternatively, the memory cell array MCA may have a configuration in which memory cells are arranged in a matrix of three or more rows and four or more columns. In the case where not product-sum operation but multiplication is performed, the memory cell array MCA may have a configuration in which memory cells are arranged in a matrix of three rows and one or more columns.

The memory cell AM[1], the memory cell AM[2], the memory cell AMxr[1], the memory cell AMxr[2], the memory cell AMwr[1], and the memory cell AMwr[2] can have the same circuit configuration. Therefore, in this specification and the like, the memory cell AM[1], the memory cell AM[2], the memory cell AMxr[1], the memory cell AMxr[2], the memory cell AMwr[1], and the memory cell AMwr[2] are sometimes collectively referred to as memory cells AM, unless otherwise specified.

[Memory Cell AM]

Next, a configuration example of the memory cell AM is described.

The memory cell AM includes a terminal m1 to a terminal m5, as illustrated in FIG. 1.

Figure 2A:
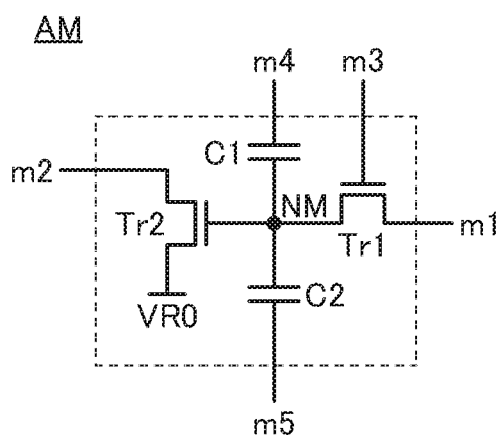
FIGS. 2A and 2B Circuit diagrams illustrating examples of a memory cell included in a semiconductor device.

The memory cell AM can have a configuration illustrated in FIG. 2(A), for example. The memory cell AM includes a transistor Tr1, a transistor Tr2, a capacitor C1, and a capacitor C2.

Note that the transistor Tr1 is preferably an OS transistor. In addition, it is further preferable that a channel formation region of the transistor Tr1 be an oxide containing at least one of indium, an element M (examples of the element M include aluminum, gallium, yttrium, and tin), and zinc. It is further preferable that the transistor Tr1 have a structure of the transistor described particularly in Embodiment 3.

With the use of an OS transistor as the transistor Tr1, the leakage current of the transistor Tr1 can be suppressed, so that a product-sum operation circuit with high computation accuracy can be obtained in some cases. Furthermore, with the use of an OS transistor as the transistor Tr1, the amount of leakage current from a retention node to a writing word line can be extremely small when the transistor Tr1 is in a non-conduction state. In other words, the frequency of refresh operation for the potential at the retention node can be reduced; thus, power consumption of the product-sum operation circuit can be reduced.

The use of an OS transistor also as the transistor Tr2 allows the transistor Tr2 to be formed concurrently with the transistor Tr1, in which case the manufacturing process for the arithmetic circuit can be shortened in some cases. The transistor Tr2 may be a transistor whose channel formation region contains silicon such as amorphous silicon or polycrystalline silicon instead of an oxide (hereinafter referred to as a Si FET, a Si transistor, and the like).

In the memory cell AM, a first terminal of the transistor Tr1 is electrically connected to a gate of the transistor Tr2, a first terminal of the capacitor C1, and a first terminal of the capacitor C2. A first terminal of the transistor Tr2 is electrically connected to a wiring VR0.

The wiring VR0 is a wiring for making current flow between the first terminal and a second terminal of the transistor Tr2. Thus, the wiring VR0 functions as a wiring for supplying a predetermined potential. For example, a potential supplied by the wiring VR0 can be a ground potential or a potential lower than the ground potential, for example.

In the memory cell AM, a second terminal of the transistor Tr1 is electrically connected to the terminal m1, the second terminal of the transistor Tr2 is electrically connected to the terminal m2, and a gate of the transistor Tr1 is electrically connected to the terminal m3. A second terminal of the capacitor C1 is electrically connected to the terminal m4, and a second terminal of the capacitor C2 is electrically connected to the terminal m5.

A portion where the first terminal of the transistor Tr1, the gate of the transistor Tr2, the first terminal of the capacitor C1, and the first terminal of the capacitor C2 are connected serves as a retention node of the memory cell AM and is shown as a node NM in FIG. 2(A). In particular, to represent the node NM of a specified memory cell in this specification and the like, the expression "the node NM (the reference symbol of the specified memory cell)" is used. For example, a node NM(AM[1]) is used to represent the node NM of the memory cell AM[1], and a node NM(AMxr[2]) is used to represent the node NM of the memory cell AMxr[2].

The configuration of the memory cell AM included in the memory cell array MCA of the arithmetic circuit 100 according to one embodiment of the present invention is not limited to the configuration shown in FIG. 2(A). In the configuration of the memory cell AM, it is possible to select which circuit elements are provided or omitted and/or to change an electrical connection structure, according to circumstances.

Figure 2B:
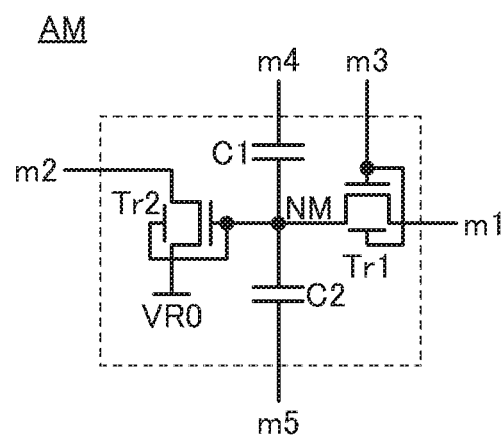

For example, the transistor Tr1 and the transistor Tr2 in the memory cell AM illustrated in FIG. 2(A) may include a back gate. FIG. 2(B) illustrates a configuration of the memory cell AM in which the transistor Tr1 and the transistor Tr2 each include a back gate. Specifically, the back gate of the transistor Tr1 is electrically connected to the gate of the transistor Tr1, and the back gate of the transistor Tr2 is electrically connected to the gate of the transistor Tr2. With such a connection structure, the on-state current flowing between the source and the drain of the transistor Tr1 and/or the transistor Tr2 can be increased, and the operating speed of the memory cell AM can be increased.

Next, a connection structure between each of the memory cell AM[1], the memory cell AM[2], the memory cell AMxr[1], the memory cell AMxr[2], the memory cell AMwr[1], and the memory cell AMwr[2] and wirings is described.

In the memory cell AM[1], the terminal m1 is electrically connected to a wiring WD, the terminal m2 is electrically connected to a wiring BL, the terminal m3 is electrically connected to a wiring WL[1], the terminal m4 is electrically connected to a wiring VL[1], and the terminal m5 is electrically connected to a wiring HW[1].

In the memory cell AM[2], the terminal m1 is electrically connected to the wiring WD, the terminal m2 is electrically connected to the wiring BL, the terminal m3 is electrically connected to a wiring WL[2], the terminal m4 is electrically connected to a wiring VL[2], and the terminal m5 is electrically connected to a wiring HW[2].

In the memory cell AMxr[1], the terminal m1 is electrically connected to a wiring WDxr, the terminal m2 is electrically connected to a wiring BLxr, the terminal m3 is electrically connected to the wiring WL[1], the terminal m4 is electrically connected to the wiring VL[1], and the terminal m5 is electrically connected to a wiring GNDL.

In the memory cell AMxr[2], the terminal m1 is electrically connected to the wiring WDxr, the terminal m2 is electrically connected to the wiring BLxr, the terminal m3 is electrically connected to the wiring WL[2], the terminal m4 is electrically connected to the wiring VL[2], and the terminal m5 is electrically connected to the wiring GNDL.

In the memory cell AMwr[1], the terminal m1 is electrically connected to a wiring WDwr, the terminal m2 is electrically connected to a wiring BLwr, the terminal m3 is electrically connected to the wiring WL[1], the terminal m4 is electrically connected to the wiring GNDL, and the terminal m5 is electrically connected to the wiring HW[1].

In the memory cell AMwr[2], the terminal m1 is electrically connected to the wiring WDwr, the terminal m2 is electrically connected to the wiring BLwr, the terminal m3 is electrically connected to the wiring WL[2], the terminal m4 is electrically connected to the wiring GNDL, and the terminal m5 is electrically connected to the wiring HW[2].

Note that the wiring GNDL is a wiring for supplying a ground potential GND to a component to which the wiring GNDL is electrically connected. Accordingly, the ground potential GND is lower than a high power supply potential VDD.

<<Current Supply Circuit IS>>

The current supply circuit IS includes a terminal co, a terminal coxr, and a terminal cowr. The terminal co is electrically connected to the wiring BL, the terminal coxr is electrically connected to the wiring BLxr, and the terminal cowr is electrically connected to the wiring BLwr. The current supply circuit IS has a function of supplying a current to the wiring BL, the wiring BLxr, and the wiring BLwr. In this specification and the like, a current flowing from the terminal co to the wiring BL is referred to as $I_C$, a current flowing from the terminal coxr to the wiring BLxr is referred to as $I_{Cxr}$, and a current flowing from the terminal cowr to the wiring BLwr is referred to as $I_{Cwr}$.

In FIG. 1, the current supply circuit IS is shown to include a bias circuit CS and a current mirror circuit CM as an example. The details of a structure example of the current supply circuit IS in this case are shown in FIG. 3(A).

Figure 3A:
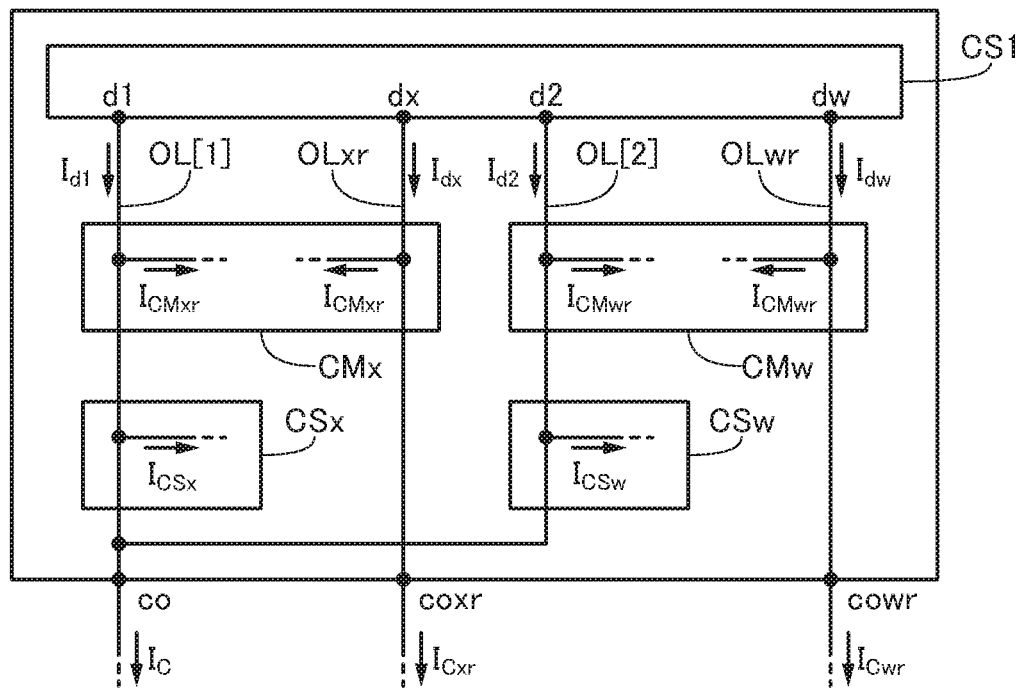
FIGS. 3A and 3B Block diagrams illustrating examples of a current supply circuit included in a semiconductor device.

The current supply circuit IS illustrated in FIG. 3(A) includes a circuit CS1, a circuit CSx, and a circuit CSw as the bias circuit CS, and includes a circuit CMx and a circuit CMw as the current mirror circuit CM.

The circuit CS1 includes a terminal d1, a terminal d2, a terminal dx, a terminal dw, and a plurality of constant current sources. In the circuit CS1, the terminal d1, the terminal d2, the terminal dx, and the terminal dw are electrically connected to different constant current sources. The terminal d1 is electrically connected to a wiring OL[1], the terminal dx is electrically connected to a wiring OLxr, the terminal d2 is electrically connected to a wiring OL[2], and the terminal dw is electrically connected to a wiring OLwr. The wiring OL[1] and the wiring OL[2] are electrically connected to the terminal co, the wiring OLxr is electrically connected to the terminal coxr, and the wiring OLwr is electrically connected to the terminal cowr. Note that in this structure example, the circuit CS1 outputs a current $I_{d1}$ from the terminal d1, outputs a current $I_{dx}$ from the terminal dx, outputs a current $I_{d2}$ from the terminal d2, and outputs a current $I_{dw}$ from the terminal dw.

The circuit CMx is a current mirror circuit for drawing a current corresponding to the potential of the wiring OLxr from the wiring OL[1] and the wiring OLxr. In this structure example, a current $I_{CMxr}$ is drawn from each of the wiring OL[1] and the wiring OLxr. Note that depending on the circuit configuration, the circuit CMx may be a current mirror circuit that supplies a current corresponding to the potential of the wiring OLxr to the wiring OL[1] and the wiring OLxr.

The circuit CMw is a current mirror circuit for drawing a current corresponding to the potential of the wiring OLwr from the wiring OL[2] and the wiring OLwr. In this structure example, a current $I_{CMwr}$ is drawn from each of the wiring OL[2] and the wiring OLwr. Note that depending on the circuit configuration, the circuit CMw may be a current mirror circuit that supplies a current corresponding to the potential of the wiring OLwr to the wiring OL[2] and the wiring OLwr.

The circuit CSx is a current sink circuit that samples the potential of the wiring OL[1] and draws a current corresponding to the potential from the wiring OL[1]. In this structure example, a current $I_{CSx}$ is drawn from the wiring OL[1]. Note that depending on the circuit configuration, the circuit CSx may be a current source circuit that samples the potential of the wiring OL[1] and supplies a current corresponding to the potential. The circuit CSx may be a circuit that performs both current supply and current drawing on the wiring OL[1]. In the current supply circuit IS illustrated in FIG. 3(A), the circuit CSx may be omitted according to circumstances.

The circuit CSw is a current sink circuit that samples the potential of the wiring OL[2] and draws a current corresponding to the potential from the wiring OL[2]. In this structure example, a current $I_{CSw}$ is drawn from the wiring OL[2]. Note that depending on the circuit configuration, the circuit CSw may be a current source circuit that samples the potential of the wiring OL[2] and supplies a current corresponding to the potential. The circuit CSw may be a circuit that performs both current supply and current drawing on the wiring OL[2]. In the current supply circuit IS illustrated in FIG. 3(A), the circuit CSw may be omitted according to circumstances.

Figure 3B:
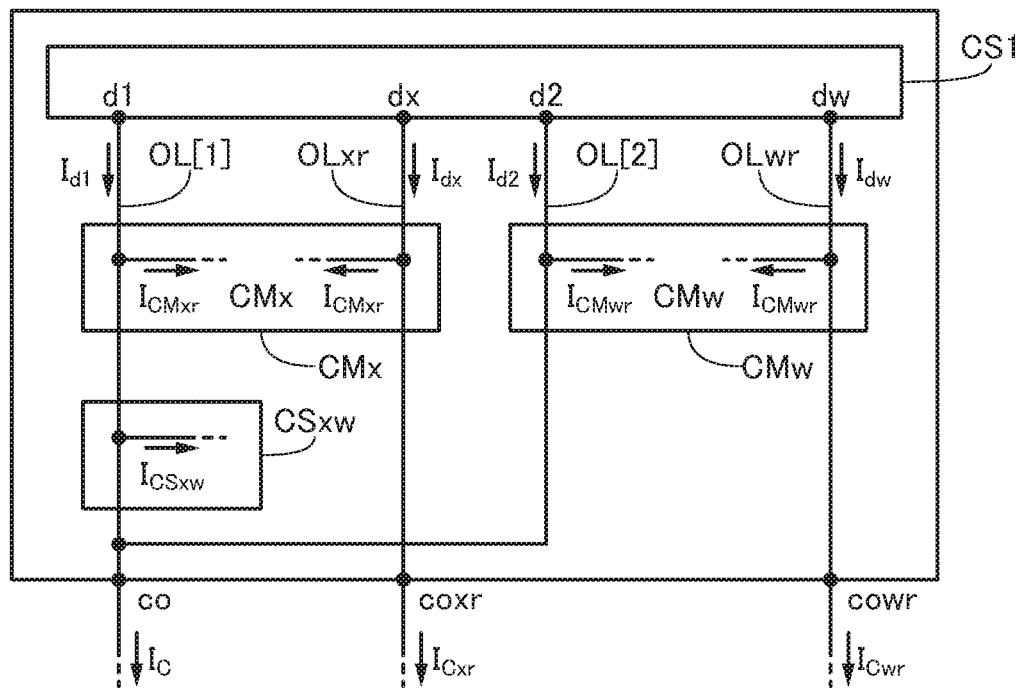

Since the wiring OL[1] and the wiring OL[2] are electrically connected to each other, the circuit CSx and the circuit CSw may be integrated into one circuit. FIG. 3(B) illustrates a structure example of the current supply circuit IS in which the circuit CSx and the circuit CSw are integrated as a circuit CSxw. In FIG. 3(B), the circuit CSxw is a current sink circuit that samples the potential of the wiring OL[1] and draws a current $I_{CSxw}$ corresponding to the potential from the wiring OL[1]. Note that depending on the circuit configuration, the circuit CSxw may be a current source circuit that samples the potential of the wiring OL[1] and supplies a current corresponding to the potential. The circuit CSxw may be a circuit that performs both current supply and current drawing on the wiring OL[1]. In the current supply circuit IS illustrated in FIG. 3(B), the circuit CSxw may be omitted according to circumstances.

Next, a specific configuration example of the current supply circuit IS is described.

Figure 4:
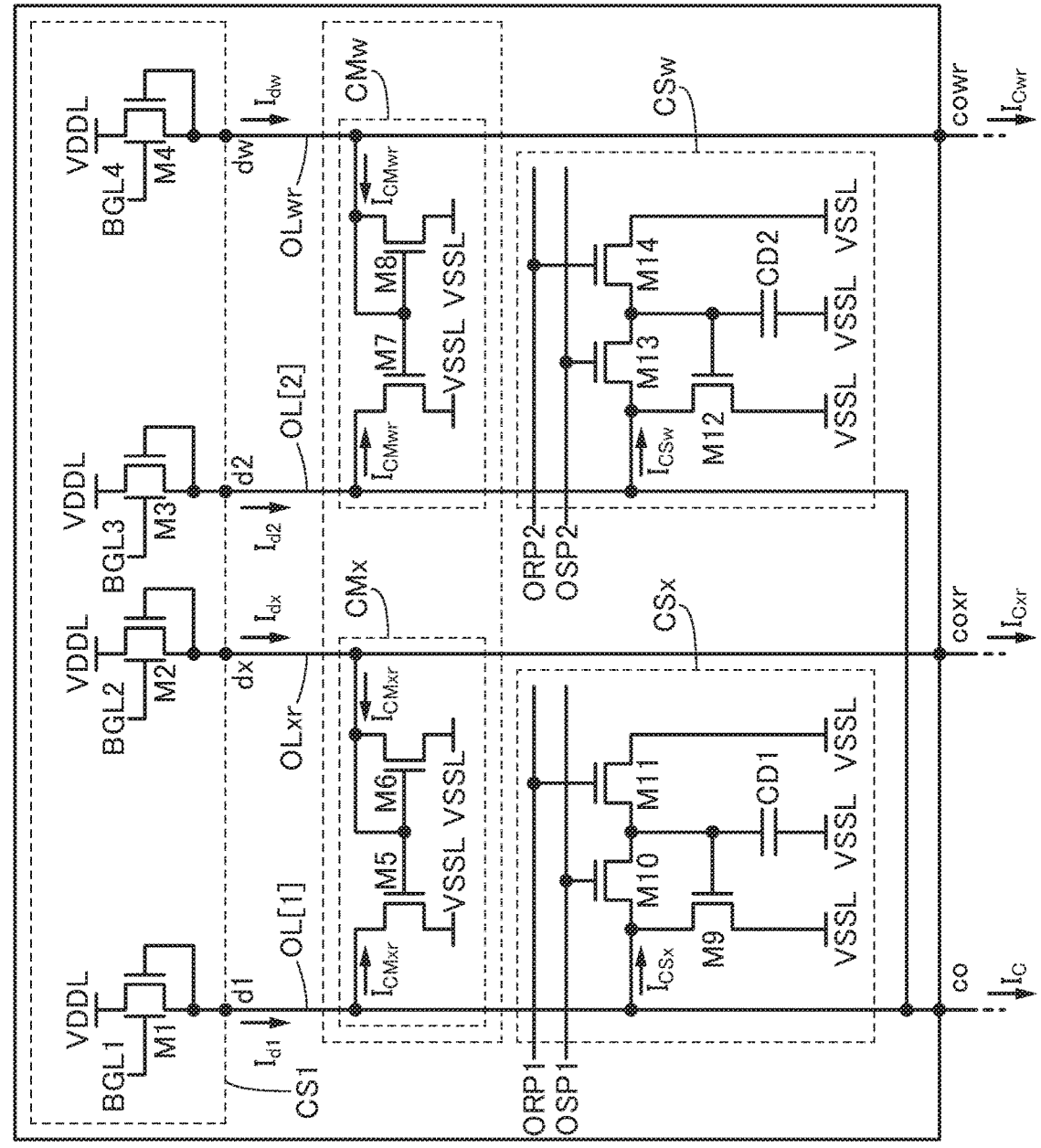
FIG. 4 A circuit diagram illustrating an example of a current supply circuit included in a semiconductor device.

FIG. 4 illustrates an example of a circuit diagram of the current supply circuit IS in FIG. 3(A). In the current supply circuit IS in FIG. 4, the circuit CS1 includes a transistor M1 to a transistor M4; the circuit CMx includes a transistor M5 and a transistor M6; the circuit CMw includes a transistor M7 and a transistor M8; the circuit CSx includes a transistor M9 to a transistor M11 and a capacitor CD1; and the circuit CSw includes a transistor M12 to a transistor M14 and a capacitor CD2. Note that in the current supply circuit IS illustrated in FIG. 4, the transistor M1 to the transistor M14 are n-channel transistors. Accordingly, the current supply circuit IS can be configured as a single-polarity circuit.

The transistor M1 to the transistor M14 are preferably OS transistors like the transistor Tr1 and the transistor Tr2. The description of the transistor Tr1 is referred to for the OS transistor. Alternatively, the transistor M1 to the transistor M14 may be Si transistors.

In the circuit CS1, first terminals of the transistor M1 to the transistor M4 are electrically connected to the wiring OL[1], the wiring OLxr, the wiring OL[2], and the wiring OLwr, respectively; and gates of the transistor M1 to the transistor M4 are electrically connected to the wiring OL[1], the wiring OLxr, the wiring OL[2], and the wiring OLwr, respectively. A second terminal of each of the transistor M1 to the transistor M4 is electrically connected to the wiring VDDL. Furthermore, the transistor M1 to the transistor M4 each include a back gate, and the back gates of the transistor M1 to the transistor M4 are electrically connected to a wiring BGL1 to a wiring BGL4, respectively.

The wiring VDDL is a wiring for supplying the high power supply potential VDD to a component to which the wiring VDDL is electrically connected.

The gate-source voltage of each of the transistor M1 to the transistor M4 is 0 V; hence, when a high-level potential is supplied to the wiring BGL1 to the wiring BGL4, a current can flow between the source and the drain of each of the transistor M1 to the transistor M4. By this operation, the circuit CS1 illustrated in FIG. 4 can be a circuit that supplies a constant current to the wiring OL[1], the wiring OLxr, the wiring OL[2], and the wiring OLwr. Note that the currents $I_{d1}$, $I_{d2}$, $I_{dx}$, and $I_{dw}$ in FIG. 4 are not necessarily equal to each other; specifically, the sum of $I_{d1}$ and $I_{d2}$ is preferably larger than each of $I_{dx}$ and $I_{dw}$. Accordingly, the sizes of the transistor M1 to the transistor M4 may be different from each other. The wirings VDDL connected to the second terminals of the transistor M1 to the transistor M4 may be supplied with different high power supply potentials.

In the circuit CMx, a first terminal of the transistor M5 is electrically connected to the wiring OL[1], a first terminal of the transistor M6 is electrically connected to the wiring OLxr, a second terminal of each of the transistor M5 and the transistor M6 is electrically connected to a wiring VSSL, and a gate of the transistor M5 is electrically connected to a gate of the transistor M6 and the wiring OLxr.

In the circuit CMw, a first terminal of the transistor M7 is electrically connected to the wiring OL[2], a first terminal of the transistor M8 is electrically connected to the wiring OLwr, a second terminal of each of the transistor M7 and the transistor M8 is electrically connected to the wiring VSSL, and a gate of the transistor M7 is electrically connected to a gate of the transistor M8 and the wiring OLwr.

Note that the wiring VSSL is a wiring for supplying a low power supply potential VSS to a component to which the wiring VSSL is electrically connected. Accordingly, the low power supply potential VSS is lower than the high power supply potential VDD. Moreover, the low power supply potential VSS is preferably the ground potential GND or a potential lower than the ground potential.

The circuit CMx illustrated in FIG. 4 functions as a current mirror circuit that references the potential of the first terminal of the transistor M6, that is, the potential of the wiring OLxr and draws the current $I_{CMxr}$ corresponding to the potential from the wiring OL[1] and the wiring OLxr. Similarly, the circuit CMw illustrated in FIG. 4 functions as a current mirror circuit that references the potential of the first terminal of the transistor M8, that is, the potential of the wiring OLwr and draws the current $I_{CMwr}$ corresponding to the potential from the wiring OL[2] and the wiring OLwr.

In the circuit CSx, a first terminal of the transistor M9 is electrically connected to a first terminal of the transistor M10 and the wiring OL[1]; and a gate of the transistor M9 is electrically connected to a second terminal of the transistor M10, a first terminal of the transistor M11, and a first terminal of the capacitor CD1. A second terminal of the transistor M9, a second terminal of the transistor M11, and a second terminal of the capacitor CD1 are electrically connected to the wiring VSSL. A gate of the transistor M10 is electrically connected to a wiring OSP1, and a gate of the transistor M11 is electrically connected to a wiring ORP1.

In the circuit CSW, a first terminal of the transistor M12 is electrically connected to a first terminal of the transistor M13 and the wiring OL[2]; and a gate of the transistor M12 is electrically connected to a second terminal of the transistor M13, a first terminal of the transistor M14, and a first terminal of the capacitor CD2. The second terminal of the transistor M13, a second terminal of the transistor M14, and a second terminal of the capacitor CD2 are electrically connected to the wiring VSSL. A gate of the transistor M13 is electrically connected to a wiring OSP2, and a gate of the transistor M14 is electrically connected to a wiring ORP2.

The circuit CSx illustrated in FIG. 4 functions as a current sink circuit that samples the potential of the wiring OL[1] and draws the current $I_{CSx}$ corresponding to the potential from the wiring OL[1]. In the circuit CSx, first, a low-level potential is applied to the wiring OSP1 to turn off the transistor M10 and a high-level potential is applied to the wiring ORP1 to turn on the transistor M11, whereby the potential held in the first terminal of the capacitor CD1 is made to VSS. Next, a low-level potential is applied to the wiring ORP1 to turn off the transistor M11 and a high-level potential is applied to the wiring OSP1 to turn on the transistor M10, whereby the potential of the wiring OL[1] or the vicinity of the potential is held in the first terminal of the capacitor CD1. After that, a low-level potential is applied to the wiring ORP1 and the wiring OSP1 to turn off the transistor M10 and the transistor M11, whereby the current $I_{CSx}$ can be drawn from the wiring OL[1] through the source and the drain of the transistor M9.

The circuit CSw illustrated in FIG. 4 functions as a current sink circuit that samples the potential of the wiring OL[2] and draws the current $I_{CSw}$ corresponding to the potential from the wiring OL[2]. The operation of the circuit CSw can be regarded as the same as the operation of the circuit CSx when the wiring OSP1 and the wiring ORP1 are replaced with the wiring OSP2 and the wiring ORP2, the transistor M9 to the transistor M11 are replaced with the transistor M12 to the transistor M14, and the capacitor CD1 is replaced with the capacitor CD2. Accordingly, the current $I_{CSw}$ can be drawn from the wiring OL[2] through the source and the drain of the transistor M12.

<<Circuit WDD, Circuit WLD, and Circuit VLD>>

Next, the circuit WDD, the circuit WLD, and the circuit VLD included in peripheral circuits of the memory cell array MCA are described.

The circuit WDD is electrically connected to the wiring WD, the wiring WDxr, and the wiring WDwr. The circuit WDD has a function of transmitting the first data that is to be stored in each memory cell AM included in the memory cell array MCA.

The circuit WLD is electrically connected to the wiring WL[1] and the wiring WL[2]. The circuit WLD has a function of selecting the memory cell AM targeted for data writing at the time of writing data (the first data, the first reference data, or the second data) to the memory cell AM included in the memory cell array MCA.

The circuit VLD is electrically connected to the wiring VL[1] and the wiring VL[2]. The circuit VLD has a function of applying a potential corresponding to the second data to the second terminal of each capacitor C1 included in the memory cell array MCA. The circuit VLD also has a function of transmitting a potential corresponding to the second data to the learning circuit LEC, which will be described later.

<<Activation Function Circuit ACTV>>

The activation function circuit ACTV includes a terminal ai, a terminal afb, and a terminal ao. Specifically, the terminal ai is electrically connected to the wiring BL, and the terminal afb is electrically connected to a terminal gi4 of the learning circuit LEC, which will be described later. In particular, in FIG. 1, a current flowing to the terminal ai from the wiring BL electrically connected to the memory cell array MCA is denoted as Ia. The terminal ao is electrically connected to a wiring OPL, and the wiring OPL can function as a wiring for outputting the result of the arithmetic circuit 100 to the outside.

The activation function circuit ACTV has a function of generating a potential in accordance with a current input from the wiring BL to the terminal ai or a change in the current, and performs arithmetic operation based on a previously defined function on the potential. As the function, for example, a sigmoid function, a tan h function, a softmax function, a ReLU (Rectified Linear Unit) function, a threshold function, or the like can be used, and these functions are used as activation functions in a neural network. The output result of the activation function circuit ACTV is output to the terminal afb and the terminal ao. Since the terminal afb and the terminal gi4 are electrically connected to each other, the output result of the activation function circuit ACTV is input to the learning circuit LEC. Note that in this specification and the like, the output result is referred to as arithmetic result data.

Figure 5A:
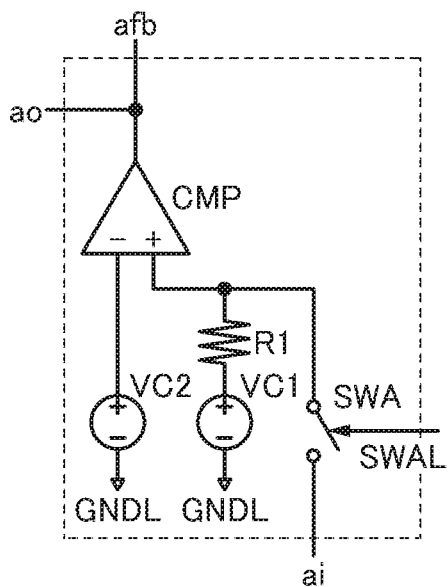
FIGS. 5A to 5C Circuit diagrams illustrating examples of an activation function circuit included in a semiconductor device.

FIG. 5(A) illustrates a configuration example of the activation function circuit ACTV. The activation function circuit ACTV in FIG. 5(A) is a circuit having a function of generating a potential in accordance with an input current, and includes a comparator CMP, a constant voltage source VC1, a constant voltage source VC2, a resistor R1, and a switch SWA.

A plus-side input terminal of the comparator CMP is electrically connected to a first terminal of the switch SWA and a first terminal of the resistor R1; a minus-side input terminal of the comparator CMP is electrically connected to a positive electrode terminal of the constant voltage source VC2; and an output terminal of the comparator CMP is electrically connected to the terminal afb and the terminal ao. A negative electrode terminal of the constant voltage source VC2 is electrically connected to the wiring GNDL; a second terminal of the resistor R1 is electrically connected to a positive electrode terminal of the constant voltage source VC1; a negative electrode terminal of the constant voltage source VC1 is electrically connected to the wiring GNDL; and a second terminal of the switch SWA is electrically connected to the terminal ai.

A wiring SWAL is electrically connected to the activation function circuit ACTV illustrated in FIG. 5(A). The wiring SWAL is a wiring for switching the on state and the off state of the switch SWA.

In the activation function circuit ACTV in FIG. 5(A), when the input impedance of the comparator CMP is sufficiently higher than the resistance of the resistor R1 and a current is input from the terminal ai, the current flows to the resistor R1. At this time, a voltage is generated between the first terminal and the second terminal of the resistor R1. In particular, the potential of the first terminal of the resistor R1 depends on the amount of this current. In other words, an input potential to the plus-side input terminal of the comparator CMP depends on the current input from the terminal ai.

The constant voltage source VC1 and the constant voltage source VC2 are constant voltage sources that output the same voltage. At this time, the potential of the positive electrode of the constant voltage source VC2 serves as a reference potential input to the minus-side input terminal of the comparator CMP. Accordingly, the comparator CMP compares the input potential to the plus-side input terminal and the reference potential to the minus-side input terminal, and outputs a potential corresponding to the comparison result from the output terminal. Note that the potential output from the output terminal of the comparator CMP can be a binary potential, that is, one of a low-level potential and a high-level potential. Here, as the comparator CMP included in the activation function circuit ACTV, a differential amplifier may be used instead; in that case, a potential output from the differential amplifier has an analog value.

The potential output from the output terminal of the comparator CMP is output to the terminal ao and the terminal afb as the arithmetic result data. Specifically, the arithmetic result data is input to the learning circuit LEC because the terminal afb is electrically connected to the terminal gi4 of the learning circuit LEC.

Note that in the case where the activation function circuit ACTV in FIG. 5(A) is not driven, electrical continuity between the terminal ai and the plus-side input terminal of the comparator CMP is broken by the switch SWA. With such a structure, a potential corresponding to the current input to the terminal ai can be output at a predetermined timing. Alternatively, a structure may be employed in which the switch SWA is not provided, and instead a power supply potential for driving the comparator CMP stops being applied to the comparator CMP to prevent the active function circuit ACTV from being driven.

Figure 5B:
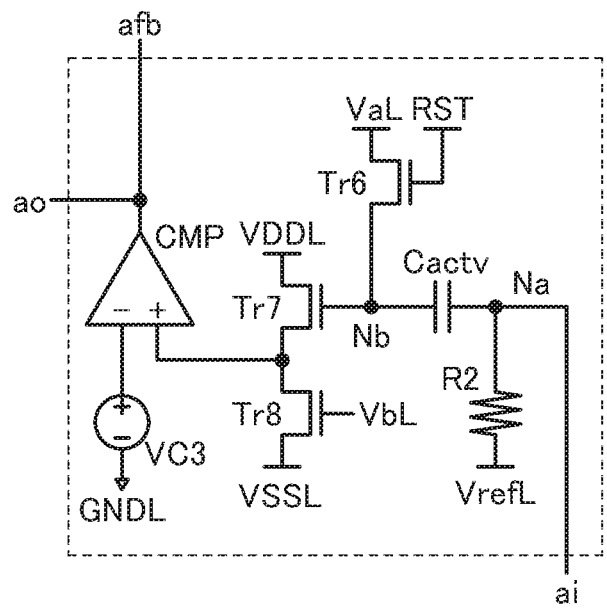

FIG. 5(B) illustrates another structure example of the activation function circuit ACTV different from that in FIG. 5(A). The activation function circuit ACTV in FIG. 5(A) is a circuit having a function of generating a potential in accordance with a change in current that is input, and includes a transistor Tr6 to a transistor Tr8, a capacitor Cactv, a resistor R2, the comparator CMP, and a constant voltage source VC3. In FIG. 5(B), the transistor Tr6 to the transistor Tr8 are n-channel transistors.

The transistor Tr6 to the transistor Tr8 are preferably OS transistors like the transistor Tr1 and the transistor Tr2. The description of the transistor Tr1 is referred to for the OS transistor. Alternatively, the transistor Tr6 to the transistor Tr8 may be Si transistors.

The terminal ai is electrically connected to a first terminal of the capacitor Cactv and a first terminal of the resistor R1. A second terminal of the capacitor Cactv is electrically connected to a first terminal of the transistor Tr6 and a gate of the transistor Tr7. A first terminal of the transistor Tr7 is electrically connected to a first terminal of the transistor Tr8 and the plus-side input terminal of the comparator CMP. An electrical connection point of the first terminal of the capacitor Cactv, the first terminal of the resistor R1, and the terminal ai is a node Na, and an electrical connection point of the second terminal of the capacitor Cactv, the first terminal of the transistor Tr6, and the gate of the transistor Tr7 is a node Nb.

A second terminal of the resistor R2 is electrically connected to a wiring VrefL. A second terminal of the transistor Tr6 is electrically connected to a wiring VaL, and a gate of the transistor Tr7 is electrically connected to a wiring RST. A second terminal of the transistor Tr7 is electrically connected to the wiring VDDL. A second terminal of the transistor Tr8 is electrically connected to the wiring VSSL, and a gate of the transistor Tr8 is electrically connected to a wiring VbL.

The wiring VrefL is a wiring for supplying a potential Vref, the wiring VaL is a wiring for supplying a potential Va, and the wiring VbL is a wiring for supplying a potential Vb. The wiring RST is a wiring for supplying a potential for switching the conduction state and the non-conduction state of the transistor Tr6.

In the activation function circuit ACTV illustrated in FIG. 5(B), a source follower circuit is composed of the transistor Tr7, the transistor Tr8, the wiring VDDL, the wiring VSSL, and the wiring VbL.

In the activation function circuit ACTV illustrated in FIG. 5(B), the node Na is supplied with a potential corresponding to a current flowing from the terminal ai and the resistance of the resistor R2, owing to the resistor R2 and the wiring VrefL.

An operation example of the activation function circuit ACTV in FIG. 5(B) is described. When a first-time current (hereinafter referred to as first current) flows from the terminal ai, a potential corresponding to the first current and the resistance of the resistor R1 is supplied to the node Na owing to the resistor R2 and the wiring VrefL. At this time, the transistor Tr6 is brought into a conduction state so that the potential Va is supplied to the node Nb. After that, the transistor Tr6 is brought into a non-conduction state.

Next, when a second-time current (hereinafter referred to as second current) flows from the terminal ai, a potential corresponding to the second current and the resistance of the resistor R2 is supplied to the node Na owing to the resistor R2 and the wiring VrefL in a manner similar to that when the first current flows. At this time, the node Nb is in a floating state; thus, a change in the potential of the node Na changes the potential of the node Nb because of capacitive coupling. When the change in the potential of the node Na is $\Delta V_{Na}$ and the capacitive coupling coefficient is K, the potential of the node Nb is Va+K·$\Delta V_{Na}$. When the threshold voltage of the transistor Tr7 is denoted as $V_{th}$, a potential Va+K·$\Delta V_{Na}$−$V_{th}$ is output through the wiring OL. Here, by setting the potential Va to the threshold voltage $V_{th}$, a potential K·$\Delta V_{Na}$ can be input to the plus-side input terminal of the comparator CMP.

Note that the capacitive coupling coefficient K is a constant depending on the gate capacitance of the transistor Tr7, the wiring material around the node Nb, the parasitic resistance, and the like. The potential change amount $\Delta V_{Na}$ depends on the amount of change from the first current to the second current, the resistance of the resistor R1, and the potential Vref. Hence, the capacitive coupling coefficient K, the resistance of the resistor R1, and the potential Vref can each be a constant; thus, the potential K·$\Delta V_{Na}$ input to the plus-side input terminal of the comparator CMP depends on the amount of change from the first current to the second current.

The constant voltage source VC3 is a constant voltage source, and the potential of the positive electrode of the constant voltage source VC3 serves as a reference potential input to the minus-side input terminal of the comparator CMP. Accordingly, the comparator CMP compares the input potential K·$\Delta V_{Na}$ to the plus-side input terminal and the reference potential to the minus-side input terminal, and outputs a potential corresponding to the comparison result from the output terminal. Note that the potential output from the output terminal of the comparator CMP can be a binary potential, that is, one of a low-level potential and a high-level potential. The voltage between the positive electrode and the negative electrode of the constant voltage source VC3 can be set as appropriate in accordance with the capacitive coupling coefficient K, the resistance of the resistor R1, and the potential Vref.

In the activation function circuit ACTV in FIG. 5(B), the potential output from the output terminal of the comparator CMP is output to the terminal ao and the terminal afb as the arithmetic result data. Specifically, the arithmetic result data is input to the learning circuit LEC because the terminal afb is electrically connected to the terminal gi4 of the learning circuit LEC.

Figure 5C:
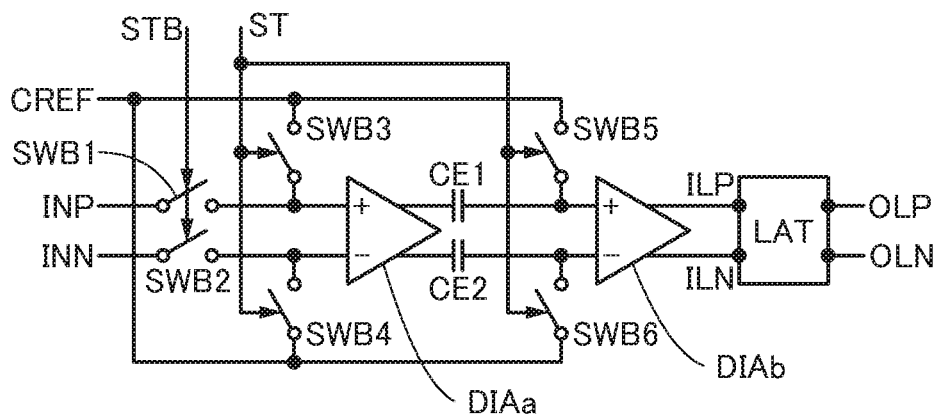

The comparator CMP illustrated in each of FIGS. 5(A) and 5(B) can be configured as a single-polarity circuit. Specifically, the comparator CMP configured as a single-polarity circuit can be a circuit illustrated in FIG. 5(C), for example. The comparator CMP illustrated in FIG. 5(C) includes a differential amplifier DIAa, a differential amplifier DIAb, a circuit LAT, a capacitor CE1, a capacitor CE2, and a switch SWB1 to a switch SWB6. The circuit LAT includes a terminal ILP and a terminal ILN. Note that a terminal INP corresponds to the plus-side input terminal of the comparator CMP, a terminal INN corresponds to the minus-side input terminal of the comparator CMP, and a terminal OLP corresponds to a plus-side output terminal of the comparator CMP. In particular, the terminal OLP corresponds to the output terminal of the comparator CMP illustrated in each of FIGS. 5(A) and 5(B), so that the terminal OLP is electrically connected to the terminal ao and the terminal afb. In the comparator CMP illustrated in FIG. 5(C), which is a circuit performing differential output, a terminal OLN corresponding to a minus-side output terminal of the comparator CMP is also shown; when the comparator CMP in FIG. 5(C) is used in the activation function circuit ACTV in each of FIGS. 5(A) and 5(B), which does not use an output potential output from a minus-side output terminal, the terminal OLN is not electrically connected to an element, a wiring, a circuit, and the like.

A non-inverting input terminal of the differential amplifier DIAa is electrically connected to one of two pairs of terminals of the switch SWB1 and one of two pairs of terminals of the switch SWB3; an inverting input terminal of the differential amplifier DIAa is electrically connected to one of two pairs of terminals of the switch SWB2 and one of two pairs of terminals of the switch SWB4; a non-inverting output terminal of the differential amplifier DIAa is electrically connected to one of two pairs of electrodes of the capacitor CE1; and an inverting output terminal of the differential amplifier DIAb is electrically connected to one of two pairs of electrodes of the capacitor CE1.

A non-inverting input terminal of the differential amplifier DIAb is electrically connected to one of two pairs of terminals of the switch SWB5 and the other of the two pairs of electrodes of the capacitor CE1; an inverting input terminal of the differential amplifier DIAb is electrically connected to one of two pairs of terminals of the switch SWB6 and the other of the two pairs of electrodes of the capacitor CE2; a non-inverting output terminal of the differential amplifier DIAb is electrically connected to the terminal ILP of the circuit LAT; and an inverting output terminal of the differential amplifier DIAb is electrically connected to the terminal ILN of the circuit LAT.

The other of the two pairs of terminals of the switch SWB1 is electrically connected to the terminal INP, and the other of the two pairs of terminals of the switch SWB2 is electrically connected to the terminal INN. The other of the two pairs of terminals of each of the switch SWB3 to the switch SWB6 is electrically connected to a wiring CREF.

A control terminal of each of the switch SWB1 and the switch SWB2 is electrically connected to a wiring STB. A control terminal of each of the switch SWB3 to the switch SWB6 is electrically connected to a wiring ST. Note that the switch SWB1 to the switch SWB6 can be n-channel transistors, and here, the control terminals of the switch SWB1 to the switch SWB6 are gates of the respective transistors.

The wiring CREF is a wiring for supplying a comparison potential to the comparator CMP. Thus, although not illustrated in FIG. 5(C), the comparison potential supplied to the wiring CREF can be a potential supplied to the terminal INN. Note that depending on the configuration of the activation function circuit ACTV, the comparison potential supplied to the wiring CREF may be a potential supplied to the terminal INP.

Figure 6A:
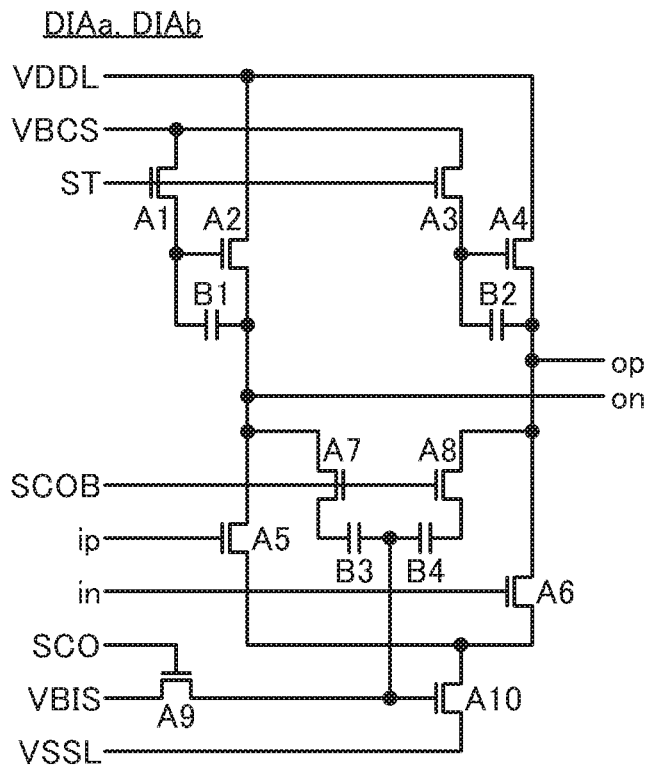
FIGS. 6A and 6B Circuit diagrams each illustrating an example of a circuit included in a semiconductor device.

Next, the differential amplifier DIAa and the differential amplifier DIAb are described. When the differential amplifier DIAa and the differential amplifier DIAb are configured as a single-polarity circuit, the differential amplifier DIAa and the differential amplifier DIAb can be a circuit illustrated in FIG. 6(A). The differential amplifier DIAa and the differential amplifier DIAb illustrated in FIG. 6(A) include a transistor A1 to a transistor A10 that are n-channel transistors, and a capacitor B1 to a capacitor B4. Moreover, the differential amplifier DIAa and the differential amplifier DIAb include an inverting input terminal in, a non-inverting input terminal ip, and a non-inverting output terminal op. Furthermore, the differential amplifier DIAa and the differential amplifier DIAb illustrated in FIG. 6(A) are electrically connected to the wiring VDDL, the wiring VSSL, a wiring VBCS, a wiring VBIS, a wiring SCO, a wiring SCOB, and the wiring ST.

The transistor A1 to the transistor A10 are preferably OS transistors like the transistor Tr1 and the transistor Tr2. The description of the transistor Tr1 is referred to for the OS transistor. Alternatively, the transistor A1 to the transistor A10 may be Si transistors.

The wiring VDDL is a wiring for supplying a high power supply potential to the differential amplifier DIAa and the differential amplifier DIAb, and the wiring VSSL is a wiring for supplying a low power supply potential to the differential amplifier DIAa and the differential amplifier DIAb.

The wiring VBCS is a wiring for applying a first constant potential to a gate of a predetermined transistor and one of two pairs of terminals of a predetermined capacitor. The wiring VBIS is a wiring for applying a second constant potential to a gate of a predetermined transistor and one of two pairs of terminals of a predetermined capacitor.

The wiring ST, the wiring SCO, and the wiring SCOB are wirings for applying a potential to a gate of a transistor used as a switching element and are used to switch conduction and non-conduction of the transistor. The transistors used as the switching element are the transistor A1, the transistor A3, the transistor A7, the transistor A8, and the transistor A9.

Next, the circuit LAT is described. The circuit LAT includes a circuit that samples and holds potentials input to the terminal ILP and the terminal ILN, a latch circuit, a circuit that holds a potential amplified by the latch circuit, and a buffer circuit for outputting the potential. When the circuit LAT is configured as a single-polarity circuit, the circuit LAT can be a circuit illustrated in FIG. 6(B). The circuit LAT illustrated in FIG. 6(B) includes a transistor A11 to a transistor A30 that are n-channel transistors, and a capacitor B5 to a capacitor B10. The circuit LAT is electrically connected to the wiring VDDL, the wiring VSSL, the wiring VBCS, the wiring ST, the wiring STB, a wiring LT, a wiring LTB, and a wiring SH.

The transistor A11 to the transistor A30 are preferably OS transistors like the transistor Tr1 and the transistor Tr2. The description of the transistor Tr1 is referred to for the OS transistor. Alternatively, the transistor A11 to the transistor A30 may be Si transistors.

Here, an operation example of the comparator CMP illustrated in FIG. 5(C) is described. First, a high-level potential is applied to the wiring ST, and a low-level potential is applied to the wiring STB. Thus, the switch SWB1 and the switch SWB2 are turned off, and the switch SWB3 to the switch SWB6 are turned on. Moreover, in the differential amplifier DIAa and the differential amplifier DIAb illustrated in FIG. 6(A), the transistor A1 and the transistor A3 are turned on, and a potential from the wiring VBCS is applied to a gate of each of the transistor A2 and the transistor A4 and one of two pairs of electrodes of each of the capacitor B1 and the capacitor B2. Furthermore, in the circuit LAT illustrated in FIG. 6(B), the transistor A11 and the transistor A13 are turned on, and a potential from the wiring VBCS is applied to a gate of each of the transistor A12 and the transistor A14 and one of two pairs of electrodes of each of the capacitor B5 and the capacitor B6.

In addition, a high-level potential is applied to the wiring SCO, and a low-level potential is applied to the wiring SCOB. Thus, in the differential amplifier DIAa and the differential amplifier DIAb illustrated in FIG. 6(A), the transistor A7 and the transistor A9 are turned on, and in particular, a potential from the wiring VBIS is applied to a gate of the transistor A10 and one of two pairs of electrodes of each of the capacitor B3 and the capacitor B4.

At this time, the comparison potential from the wiring CREF is supplied to the non-inverting input terminal ip and the inverting input terminal in of each of the differential amplifier DIAa and the differential amplifier DIAb. Thus, almost the same potentials are output from the non-inverting output terminal op and an inverting output terminal on of the differential amplifier DIAa. The potentials at this time are referred to as a first differential output potential and a second differential output potential. Similarly, almost the same potentials are output from the terminal op and the terminal on of the differential amplifier DIAb.

Figure 6B:
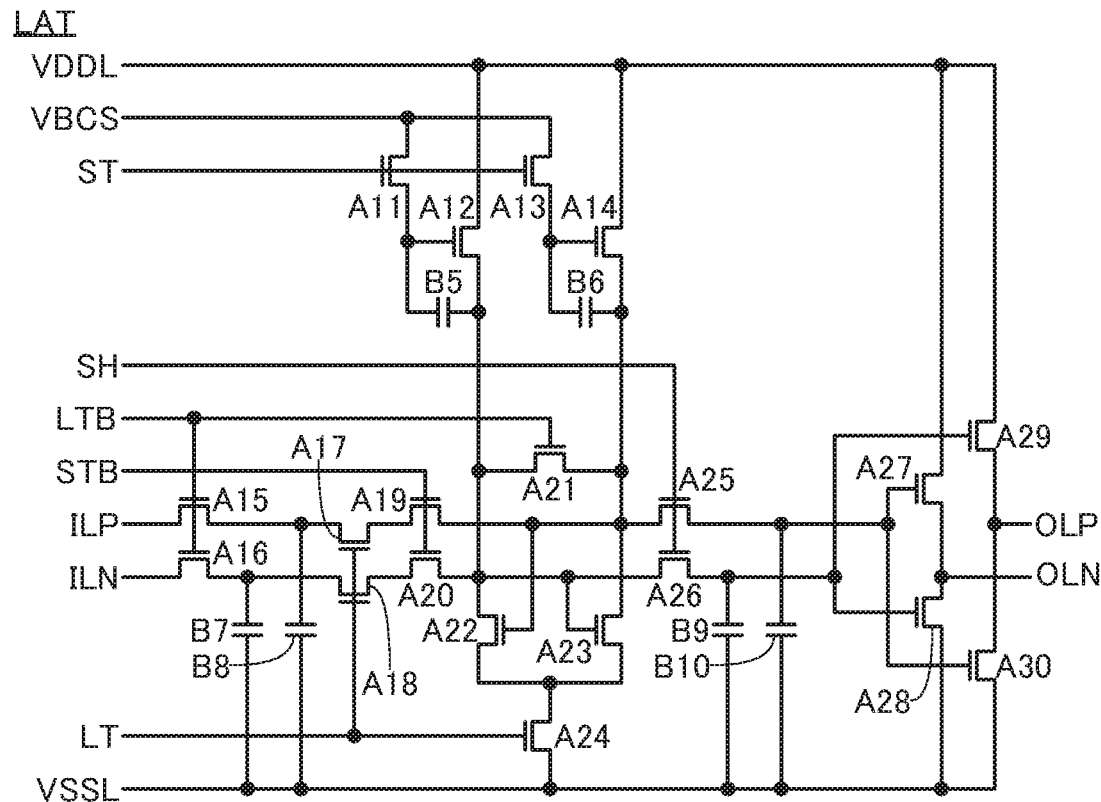

In the circuit LAT in FIG. 6(B), a high-level potential is applied to the wiring LT and the wiring LTB. Thus, the transistor A15 to the transistor A18 are turned on, and the comparison potential from the wiring CREF is applied to one of two pairs of electrodes of each of the capacitor B7 and the capacitor B8. Moreover, the transistor A21 and the transistor A24 are turned on, so that the potentials of a first terminal and a second terminal of the transistor A21 become substantially equal to each other. Since a low-level potential is supplied to the wiring STB, the transistor A19 and the transistor A20 are off.

Next, a low-level potential is applied to the wiring ST, and a low-level potential is applied to the wiring SCO. Thus, the switch SWB3 to the switch SWB6 are turned off. Furthermore, in the differential amplifier DIAa and the differential amplifier DIAb in FIG. 6(A), the transistor A1, the transistor A3, and the transistor A9 are turned off; in the circuit LAT in FIG. 6(B), the transistor A11 and the transistor A13 are turned off. Accordingly, the potential of one of two pairs of electrodes of each of the capacitor B1 to the capacitor B6 is held.

Next, a high-level potential is applied to the wiring STB. At this time, the potentials of the terminal INP and the terminal INN of the comparator CMP are input to the non-inverting input terminal ip and the inverting input terminal in of the differential amplifier DIAa. Thus, potentials based on differential input are output from the non-inverting output terminal op and the inverting output terminal on of the differential amplifier DIAa. At this time, the potentials based on differential input are referred to as a third differential output potential and a fourth differential output potential. The other of the two pairs of electrodes of each of the capacitor CE1 and the capacitor CE2 is in an electrically floating state; hence, the potential of the other of the two pairs of electrodes of the capacitor CE1 varies in accordance with a difference between the third differential output potential and the first differential output potential, and the potential of the other of the two pairs of electrodes of the capacitor CE2 varies in accordance with a difference between the fourth differential output potential and the second differential output potential. Accordingly, potentials that vary from the comparison potential are input to the non-inverting input terminal ip and the inverting input terminal in of the differential amplifier DIAb, and differential output potentials corresponding to the potentials are output from the non-inverting output terminal op and the inverting output terminal on of the differential amplifier DIAb.

Consequently, the differential output potentials are input to the terminal ILP and the terminal ILN of the circuit LAT. Thus, in the circuit LAT, the differential output potentials are applied to the one of the two pairs of electrodes of each of the capacitor B7 and the capacitor B8. A low-level potential is applied to the wiring LT at the timing when a high-level potential is applied to the wiring STB. Thus, the differential output potentials are not applied to the first terminal and the second terminal of the transistor A21 through the transistor A17 and the transistor A18.

Here, a high-level potential is applied to the wiring LT and a low-level potential is applied to the wiring LTB, whereby the differential output potentials held in the one of the two pairs of electrodes of the capacitor B7 and the capacitor B8 are input to the first terminal and the second terminal of the transistor A21. In the circuit LAT illustrated in FIG. 6(B), the latch circuit is composed of the transistor A11 to the transistor A14, the transistor A22 to the transistor A24, the capacitor B5, and the capacitor B6. Therefore, by the latch circuit, one of the differential output potentials that have been input is changed to a high-level potential, and the other is changed to a low-level potential.

Next, a high-level potential is applied to the wiring SH, whereby the transistor A25 and the transistor A26 are turned on, and the high-level potential and the low-level potential, which have been changed from the differential output potentials, are held in one of the two pairs of electrodes of the capacitor B9 and the capacitor B10. In the circuit LAT illustrated in FIG. 6(B), the buffer circuit is composed of the transistor A27 to the transistor A30. When a high-level potential is applied to gates of the transistor A27 and the transistor A30 and a low-level potential is applied to gates of the transistor A28 and the transistor A29, a low-level potential is output from the terminal OLP and a high-level potential is output from the terminal OLN. Meanwhile, when a low-level potential is applied to the gates of the transistor A27 and the transistor A30 and a high-level potential is applied to the gates of the transistor A28 and the transistor A29, a high-level potential is output from the terminal OLP and a low-level potential is output from the terminal OLN. Note that the high-level potential and the low-level potential input to the gates of the transistor A27 to the transistor A30 may be different from the high-level potential and the low-level potential output from the terminal OLP and the terminal OLN.

At this time, when the transistor A25 and the transistor A26 are turned off by applying a low-level potential to the wiring SH, the high-level potential and the low-level potential that are output from the latch circuit can be held in the one of the two pairs of electrodes of the capacitor B9 and the capacitor B10. Thus, the input potentials to the buffer circuit are held, so that the contents of the latch circuit can be initialized.

As described above, as the comparator CMP illustrated in each of FIGS. 5(A) and 5(B), the comparator CMP that is a single-polarity circuit illustrated in FIG. 5(C) and FIGS. 6(A) and 6(B) can be used. Note that although the n-channel transistors are used in the circuit diagrams illustrated in FIGS. 6(A) and 6(B), the configurations in the circuit diagrams illustrated in FIGS. 6(A) and 6(B) may be changed using p-channel transistors instead.

When the polarity of all the transistors included in the comparator CMP, the constant voltage source VC1, and the constant voltage source VC2 illustrated in FIG. 5(A) is one of the re-channel type and the p-channel type, the activation function circuit ACTV illustrated in FIG. 5(A) can be configured as a single-polarity circuit. When the polarity of all the transistors included in the comparator CMP and the constant voltage source VC3 illustrated in FIG. 5(B) is the n-channel type, the activation function circuit ACTV illustrated in FIG. 5(B) can be configured as a single-polarity circuit.

Note that the configuration of the activation function circuit ACTV included in the arithmetic circuit 100 according to one embodiment of the present invention is not limited to the configurations illustrated in FIGS. 5(A) and 5(B). The configuration of the activation function circuit ACTV included in the arithmetic circuit 100 can be changed as appropriate depending on the contents of intended arithmetic operation or the like. The arithmetic circuit 100 may include a plurality of activation function circuits ACTV having different circuit configurations and be configured to perform arithmetic operation with one intended circuit selected from the plurality of activation function circuits ACTV.

<<Learning Circuit LEC>>

The learning circuit LEC is a circuit for updating the first data held in the memory cell AM.

To update the first data, it is necessary to perform arithmetic operation one time in the memory cell array MCA of the arithmetic circuit 100. The second data, teacher data, and arithmetic result data that are used for the arithmetic operation are required. Here, one of a plurality of pieces of the first data is defined as w, one of a plurality of pieces of the second data as x, the teacher data as t, and the arithmetic result data as y. When the update amount of the first data is $\Delta w$, $\Delta w$ can be expressed by Formula (A1) below.

[Formula 1]

$$\Delta w = \Theta(y-t)x \tag{A1}$$

Note that $\eta$ is a constant representing a learning rate and is a real number more than or equal to 0 and less than or equal to 1. When the value of the learning rate $\eta$ increases, the update amount per update increases; however, the first data and the arithmetic result data may diverge owing to repetition of updates. On the other hand, when the value of the learning rate $\eta$ decreases, the first data and the arithmetic result data are likely to converge; however, the number of updates necessary for convergence becomes large.

The learning circuit LEC is a circuit that calculates the update amount $\Delta w$ by supply of the first data w, the second data x, the teacher data t, and the arithmetic result data y.

The learning circuit LEC includes a terminal gi1, a terminal gi2[1], a terminal gi2[2], a terminal gi3, a terminal gi4, a terminal io[1], and a terminal io[2], as illustrated in FIG. 1.

The terminal gi1 is electrically connected to a wiring XL; the terminal gi2[1] is electrically connected to the wiring VL[1]; the terminal gi2[2] is electrically connected to the wiring VL[2]; the terminal gi3 is electrically connected to a wiring TL; and the terminal gi4 is electrically connected to the terminal afb.

The terminal io[1] is electrically connected to the wiring HW[1], and the terminal io[2] is electrically connected to the wiring HW[2].

The wiring XL is a wiring for inputting input data to the learning circuit LEC, and the wiring TL is a wiring for inputting teacher data to the learning circuit LEC. Note that the input data here is treated as reference data to be compared with the second data x.

To the terminal gi[1], the second data output from the circuit VLD is input through the wiring VL[1]. Similarly, to the terminal gi[2], the second data output from the circuit VLD is input through the wiring VL[2].

When receiving the second data from the wiring VL[1], the learning circuit LEC generates the update amount of the first data by using the second data, input data input from the wiring XL, teacher data input from the wiring TL, and arithmetic result data input to the terminal gi4 and transmits it to the wiring HW[1]. Moreover, when receiving the second data from the wiring VL[2], the learning circuit LEC generates the update amount of the first data by using the second data, input data input from the wiring XL, teacher data input from the wiring TL, and arithmetic result data input to the terminal gi4 and transmits it to the wiring HW[2].

Figure 7:
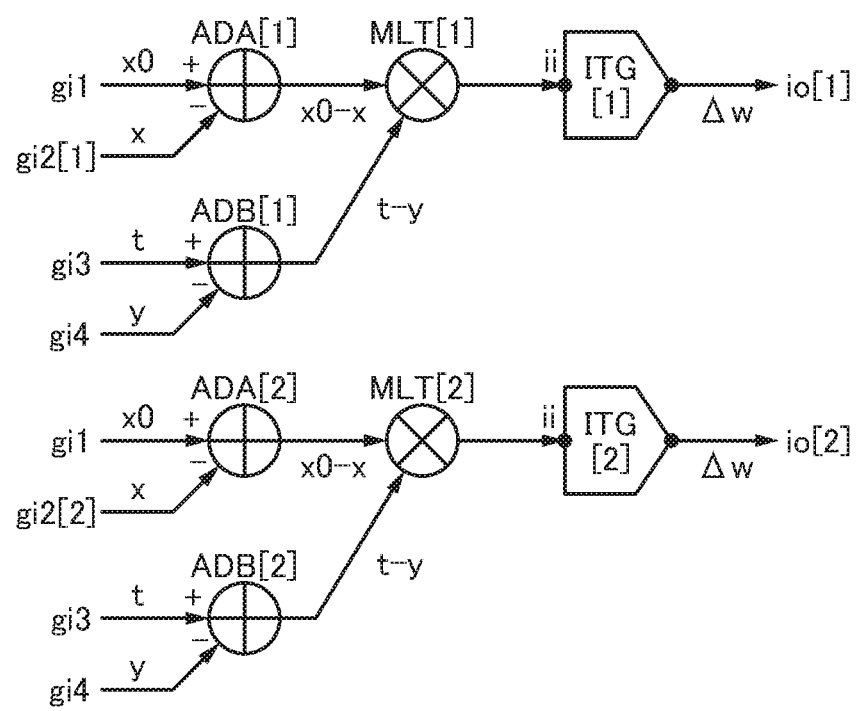
FIG. 7 A block diagram illustrating an example of a learning circuit included in a semiconductor device.

FIG. 7 illustrates a structure example of the learning circuit LEC. The learning circuit LEC illustrated in FIG. 7 includes an adder circuit ADA[1], an adder circuit ADA[2], an adder circuit ADB[1], an adder circuit ADB[2], a multiplier circuit MLT[1], a multiplier circuit MLT[2], an integrator circuit ITG[1], and an integrator circuit ITG[2].

The integrator circuit ITG[1] and the integrator circuit ITG[2] each include a terminal ii. An output terminal of the multiplier circuit MLT[1] is electrically connected to the terminal ii of the integrating circuit ITG[1], and an output terminal of the multiplier circuit MLT[1] is electrically connected to the terminal ii of the integrating circuit ITG[2].

First, the description is made on the operation of outputting the update amount $\Delta w$ from the terminal io[1] by inputting the second data to the terminal gi2[1] and inputting arithmetic result data to the terminal gi4.

The adder circuit ADA[1] has a function of obtaining a difference between data input to the terminal gi1 and data input to the terminal gi2[1]. That is, the adder circuit ADA[1] generates data $x_0-x$ from input data $x_0$ input to the terminal gi1 and the second data x input to the terminal gi2[1]. The generated data $x_0-x$ is input to the multiplier circuit MLT[1].

The adder circuit ADB[1] has a function of obtaining a difference between data input to the terminal gi3 and data input to the terminal gi4. That is, the adder circuit ADB[1] generates data t−y from the teacher data t input to the terminal gi3 and the arithmetic result data y input to the terminal gi4. The generated data t−y is input to the multiplier circuit MLT[1].

The multiplier circuit MLT[1] has a function of generating the product of the data $x_0-x$ and the data t−y, which are respectively generated by the adder circuit ADA[1] and the adder circuit ADB[1]. Thus, the data $\Delta w$ is generated. The generated $\Delta w$ is input to the terminal ii of the integrator circuit ITG[1].

At this time, when the data output from the multiplier circuit MLT[1] is input to the integrator circuit ITG[1], it is desirable to employ a method in which, with the use of a resistor, a voltage is generated across the resistor from the current output from the multiplier circuit MLT[1] and then the voltage is input to the integrator circuit ITG[1]. In this case, the learning rate $\eta$ can act on the product of the data $x_0-x$ and the data t−y by adjusting the resistance of the resistor.

A method for the action of the learning rate $\eta$ is not limited to the above. For example, may be added to arithmetic operation as an integral coefficient of the integrator circuit ITG[1]. In that case, the learning rate $\eta$ can have an action by adjusting the capacitance of a capacitor included in the integrator circuit ITG[1].

As described above, by the adder circuit ADA[1], the adder circuit ADB[1], and the multiplier circuit MLT[1], the product of two pairs can be calculated, regarding a difference between two inputs as one pair. Accordingly, as the adder circuit ADA[1], the adder circuit ADB[1], and the multiplier circuit MLT[1], a multiplier circuit called the Gilbert cell can be used, for example.

In the case of using the Gilbert cell, an error due to a differential pair of $x_0$ and x and a differential pair of t and y might occur. For this reason, the Gilbert cell is preferably configured to cancel the offset by alternating the input differential of the Gilbert cell at high speed and alternating the output differential of the Gilbert cell at high speed. At this time, the output differential includes a high-frequency component; thus, it is preferably configured to remove a high-frequency component from the data $\Delta w$ through a low-pass filter or the like before the data $\Delta w$ is input to the integrator circuit ITG[1].

The integrator circuit ITG[1] outputs the sum of the data $\Delta w$ that is input and the total of update amounts that have been input until the previous update, as update data $\Delta w$.

When the first data is determined by learning, the first data needs to be updated a plurality of times. Accordingly, the learning circuit LEC calculates the update amount $4w$ by the adder circuit ADA[1], the adder circuit ADB[1], and the multiplier circuit MLT[1] every time the first data is updated. Then, the update data $\Delta w$ is generated by the integrator circuit IGT[1] with the use of the update amount $\Delta w$ and the total of update amounts that have been calculated every update until the previous update.

An output terminal of the integrator circuit IGT[1] is electrically connected to the terminal io[1]. Since the terminal io[1] is electrically connected to the wiring HW[1], a potential $V_{\Sigma \Delta w}$ corresponding to the update data $\Delta w$ output from the integrator circuit IGT[1] is applied to the wiring HW[1].

In the case where the second data is input to the terminal gi2[2] and the arithmetic result data is input to the terminal gi4, the potential $V_{\Sigma \Delta w}$ corresponding to the update data $\Delta w$ is output from the terminal io[2] by operation similar to the above.

Note that as described above, the learning circuit LEC updates the first data of the memory cells AM in the first row of the memory cell array MCA by the adder circuit ADA[1], the adder circuit ADB[1], the multiplier circuit MLT[1], and the integrator circuit ITG[1], and updates the first data of the memory cells AM in the second row of the memory cell array MCA by the adder circuit ADA[2], the adder circuit ADB[2], the multiplier circuit MLT[2], and the integrator circuit ITG[2]. Therefore, when the memory cell array MCA is configured to have three or more rows, an adder circuit, a multiplier circuit, a low-pass filter, and an integrator circuit are provided in the learning circuit LEC as necessary.

The learning circuit LEC can be configured as a single-polarity circuit that only includes n-channel transistors.

Figure 8A:
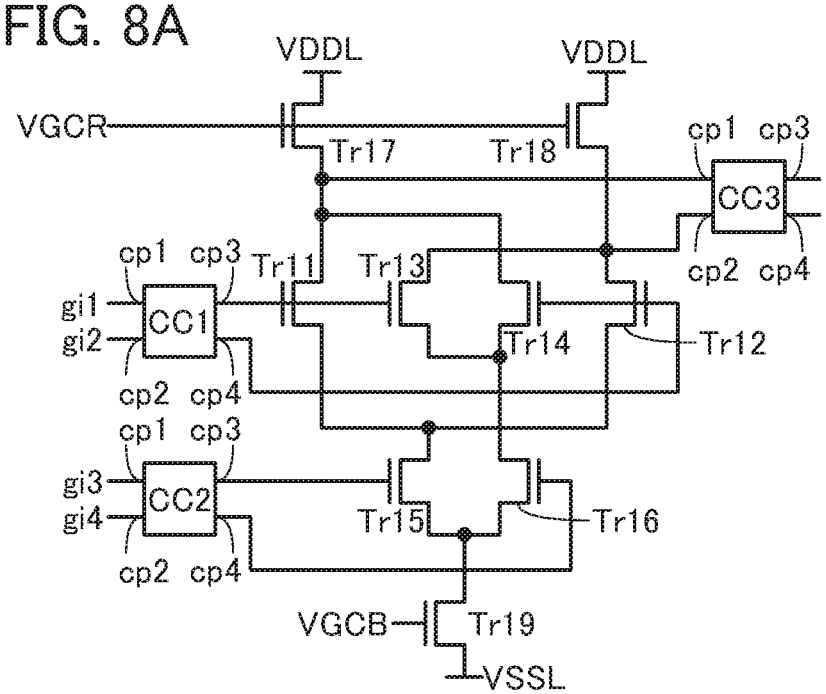
FIGS. 8A and 8B Circuit diagrams each illustrating an example of a circuit included in a learning circuit.

FIG. 8(A) is a circuit diagram illustrating a configuration example of a Gilbert cell that can be used in the adder circuit ADA[1], the adder circuit ADB[1], and the multiplier circuit MLT[1] (the adder circuit ADA[2], the adder circuit ADB [2], and the multiplier circuit MLT[2]) illustrated in FIG. 7. With the use of the configuration example of the Gilbert cell illustrated in FIG. 8, the adder circuit ADA[1], the adder circuit ADB[1], and the multiplier circuit MLT[1] (the adder circuit ADA[2], the adder circuit ADB[2], and the multiplier circuit MLT[2]) can be configured as single-polarity circuits.

Figure 8B:
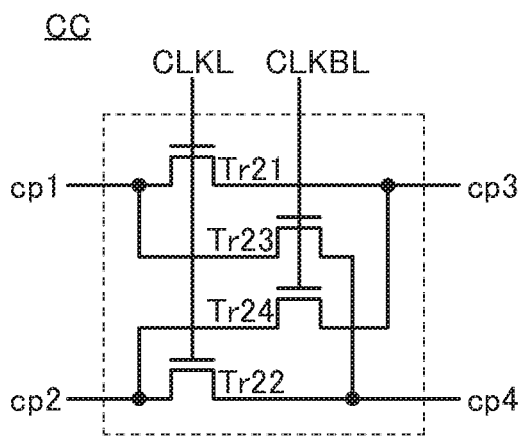

The Gilbert cell in FIG. 8(A) includes a chopper circuit CC1 to a chopper circuit CC3 for two input differentials and an output differential. Each of the chopper circuit CC1 to the chopper circuit CC3 includes a terminal cp1 to a terminal cp4, and functions as a circuit that establishes electrical continuity between the terminal cp1 and one of the terminal cp3 and the terminal cp4 and establishes electrical continuity between the terminal cp2 and the other of the terminal cp3 and the terminal cp4. FIG. 8(B) is a circuit diagram illustrating a configuration example of a chopper circuit CC that can be used as the chopper circuit CC1 to the chopper circuit CC3.

The Gilbert cell in FIG. 8(A) includes a transistor Tr11 to a transistor Tr19. The transistor Tr11 and the transistor Tr12 function as a first differential pair; the transistor Tr13 and the transistor Tr14 function as a second differential pair; and the transistor Tr15 and the transistor Tr16 function as a third differential pair. In FIG. 8(A), the transistor Tr11 to the transistor Tr19 are n-channel transistors.

The transistor Tr11 to the transistor Tr19 are preferably OS transistors like the transistor Tr1 and the transistor Tr2. The description of the transistor Tr1 is referred to for the OS transistor. Alternatively, the transistor Tr11 to the transistor Tr19 may be Si transistors.

To the first differential pair, the input data $x_0$ and the second data are input through the chopper circuit CC1. To the second differential pair, the input data $x_0$ and the second data are input through the chopper circuit CC1. To the third differential pair, the teacher data t and the arithmetic result data y are input through the chopper circuit CC2. Accordingly, the terminal cp1 of the chopper circuit CC1 is electrically connected to the terminal gi1; the terminal cp2 of the chopper circuit CC1 is electrically connected to the terminal gi2[1] (the terminal gi2[2]); the terminal cp1 of the chopper circuit CC2 is electrically connected to the terminal gi3; and the terminal cp2 of the chopper circuit CC2 is electrically connected to the terminal gi4.

The outputs of the Gilbert cell in FIG. 8(A) are the voltages of the terminal cp3 and the terminal cp4 of the chopper circuit CC3, and a difference voltage between the terminal cp3 and the terminal cp4 has a value corresponding to the results of addition and multiplication.

A first terminal of each of the transistor Tr17 and the transistor Tr18 is electrically connected to the wiring VDDL, and a gate of each of the transistor Tr17 and the transistor Tr18 is electrically connected to a wiring VGCR. The transistor Tr17 and the transistor Tr18 function as a current source that inputs a current to the Gilbert cell when a bias voltage is supplied to the wiring VGCR.

A first terminal of the transistor Tr19 is electrically connected to a wiring VGCB, and a first terminal of the transistor Tr19 is electrically connected to the wiring GNDL. The transistor Tr19 has a function of drawing a current from the Gilbert cell when a bias voltage is applied to the wiring VGCB.

The chopper circuit CC illustrated in FIG. 8(B) includes a transistor Tr21 to a transistor Tr24 and the terminal cp1 to the terminal cp4. A wiring CLKL is a wiring for transmitting a clock signal, and a wiring CLKLB is a wiring for transmitting an inverted signal of the clock signal transmitted to the wiring CLKL. In FIG. 8(B), the transistor Tr21 to the transistor Tr24 are n-channel transistors.

The transistor Tr21 to the transistor Tr24 are preferably OS transistors like the transistor Tr1 and the transistor Tr2. The description of the transistor Tr1 is referred to for the OS transistor. Alternatively, the transistor Tr21 to the transistor Tr24 may be Si transistors.

When a high-level potential is applied to the wiring CLKL, a low-level potential is applied to the wiring CLKLB; thus, the transistor Tr21 and the transistor Tr22 are turned on, and the transistor Tr23 and the transistor Tr24 are turned off. As a result, electrical connection is established between the terminal cp1 and the terminal cp3 and between the terminal cp2 and the terminal cp4.

Meanwhile, when a low-level potential is applied to the wiring CLKL, a high-level potential is applied to the wiring CLKLB; thus, the transistor Tr21 and the transistor Tr22 are turned off, and the transistor Tr23 and the transistor Tr24 are turned on, whereby electrical connection is established between the terminal cp1 and the terminal cp4 and between the terminal cp2 and the terminal cp3.

When the potential of the wiring CLKL is switched between a high-level potential and a low-level potential at high speed in the chopper circuit CC1 to the chopper circuit CC3, offset cancelation can be performed on an error due to the differential pairs in the Gilbert cell.

Since the Gilbert cell in FIG. 8(A) and the chopper circuit in FIG. 8(B) do not include p-channel transistors and only include n-channel transistors, the Gilbert cell in FIG. 8(A) and the chopper circuit in FIG. 8(B) can be configured as single-polarity circuits.

Next, an example in which the integrator circuit ITG[1] (the integrator circuit ITG[2]) is composed only of n-channel transistors is described.

Figure 9A:
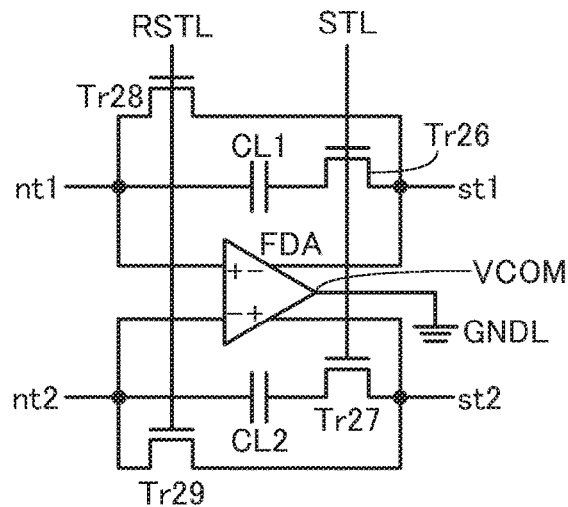
FIGS. 9A and 9B Circuit diagrams each illustrating an example of a circuit included in a learning circuit.

FIG. 9(A) is a diagram illustrating an example of a circuit configuration that can be used for the integrator circuit ITG[1] (the integrator circuit ITG[2]) illustrated in FIG. 7. The integrator circuit illustrated in FIG. 9(A) includes a transistor Tr26 to a transistor Tr29, a capacitor CL1, a capacitor CL2, and a fully differential amplifier FDA. Note that in the integrator circuit ITG[1] (the integrator circuit ITG[2]) illustrated in FIG. 9, the transistor Tr26 to the transistor Tr29 are n-channel transistors.

The transistor Tr26 to the transistor Tr29 are preferably OS transistors like the transistor Tr1 and the transistor Tr2. The description of the transistor Tr1 is referred to for the OS transistor. Alternatively, the transistor Tr26 to the transistor Tr29 may be Si transistors.

A non-inverting input terminal of the fully differential amplifier FDA is electrically connected to an input terminal nt1, a first terminal of the transistor Tr28, and the capacitor CL1; and an inverting input terminal of the fully differential amplifier FDA is electrically connected to an input terminal nt2, a first terminal of the transistor Tr29, and the capacitor CL2. An inverting output terminal of the fully differential amplifier FDA is electrically connected to an output terminal st1, a first terminal of the transistor Tr26, and a second terminal of the transistor Tr28; and a non-inverting output terminal of the fully differential amplifier FDA is electrically connected to an output terminal st2, a first terminal of the transistor Tr27, and a second terminal of the transistor Tr29. A second terminal of the capacitor CL1 is electrically connected to the first terminal of the transistor Tr27, and a second terminal of the capacitor CL2 is electrically connected to a second terminal of the transistor Tr27. An output in-phase voltage input terminal of the fully differential amplifier FDA is electrically connected to a wiring to which the ground potential is supplied.

Gates of the transistor Tr26 and the transistor Tr27 are electrically connected to a wiring STL, and gates of the transistor Tr28 and the transistor Tr29 are electrically connected to a wiring RSTL.

The integrator circuit illustrated in FIG. 9(A) can be driven by applying a low-level potential to the wiring RSTL and applying a high-level potential to the wiring STL.

The transistor Tr26 and the transistor Tr27 hold a potential in the second terminal of the capacitor CL1 and the second terminal of the capacitor CL2, respectively, when a high-level potential is applied to the wiring STL.

Note that the potentials held in the second terminal of the capacitor CL1 and the second terminal of the capacitor CL2 can be reset by applying a high-level potential to the wiring RSTL and applying a low-level potential to the wiring STL.

Figure 9B:
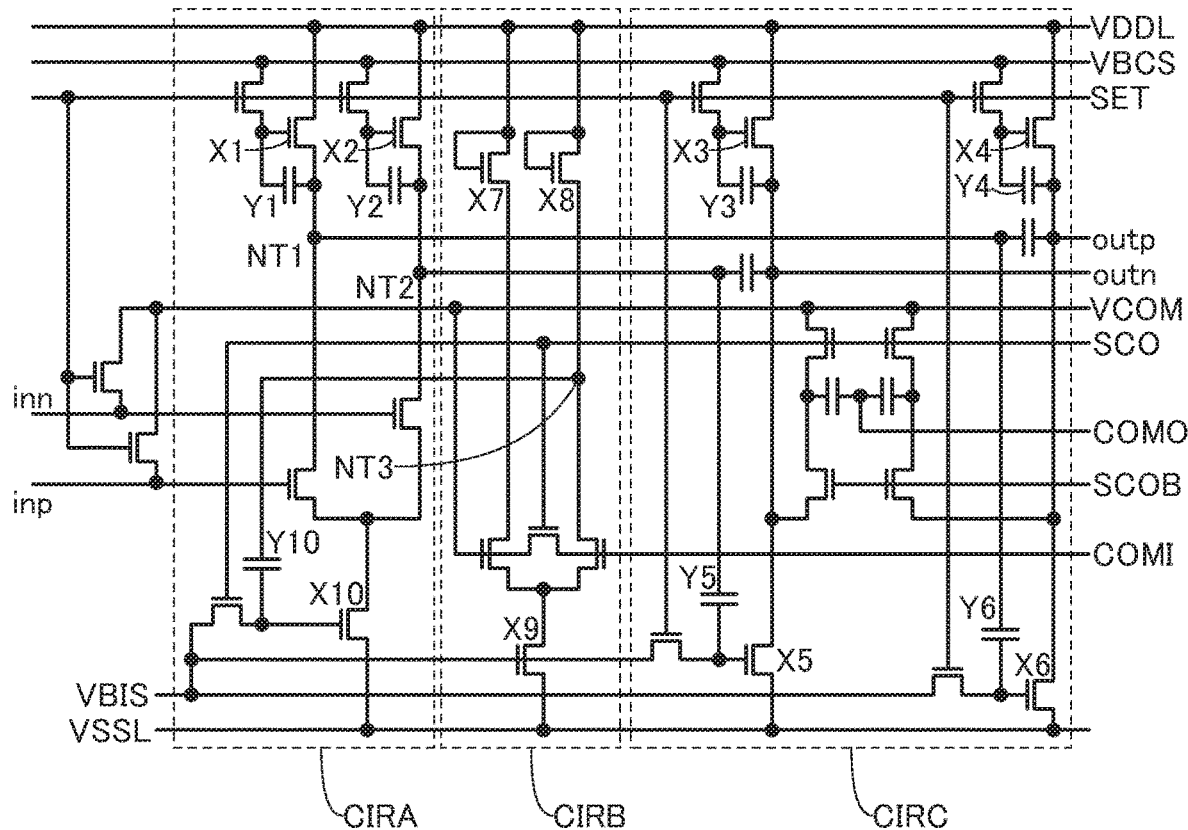

FIG. 9(B) illustrates a configuration example of the fully differential amplifier FDA. Note that in FIG. 9(B), reference numerals are used only for circuits, circuit elements, wirings, and the like that are needed for the description.

The fully differential amplifier FDA in FIG. 9(B) includes a circuit CIRA, a circuit CIRB, and a circuit CIRC. Moreover, the fully differential amplifier FDA includes a terminal inn corresponding to an inverting input terminal, a terminal inp corresponding to a non-inverting input terminal, a terminal outn corresponding to an inverting output terminal, and a terminal outp corresponding to a non-inverting output terminal.

The fully differential amplifier FDA in FIG. 9(B) is electrically connected to the wiring VDDL, the wiring VSSL, the wiring VBCS, the wiring VBIS, a wiring VCOM, a wiring COMI, a wiring COMO, the wiring SCO, the wiring SCOB, and a wiring SET.

The wiring VDDL is a wiring for supplying a high power supply potential to the fully differential amplifier FDA, and the wiring VSSL is a wiring for supplying a low power supply potential to the fully differential amplifier FDA.

The wiring VBCS is a wiring for applying the first constant potential to a gate of a predetermined transistor and one of two pairs of terminals of a predetermined capacitor. The wiring VBIS is a wiring for applying the second constant potential to a gate of a predetermined transistor and one of two pairs of terminals of a predetermined capacitor.

The wiring VCOM is a wiring corresponding to the output in-phase voltage input terminal of the fully differential amplifier FDA. As shown in FIG. 9(A), the wiring GNDL for supplying the ground potential is electrically connected to the output in-phase voltage input terminal, so that the wiring VCOM has the ground potential.

The wiring COMO is a wiring for outputting an intermediate potential of the differential output, and the wiring COMI is a wiring for inputting the intermediate potential.

First, to operate the fully differential amplifier FDA, a high-level potential is applied to the wiring SET. Thus, the first constant potential is applied to gates of transistors X1 to X4 and one of two pairs of terminals of each of capacitors Y1 to Y4 by the wiring VBCS. Accordingly, a current corresponding to the first constant potential flows between a source and a drain of each of the transistors X1 to X4 from the wiring VDDL. After that, a low-level potential is applied to the wiring SET, whereby the first constant potential can be held in each of the capacitors Y1 to Y4.

When a high-level potential is applied to the wiring SET, the ground potential is applied to a differential pair of the circuit CIRA from the wiring VCOM. Thus, data input to the terminal inn and the terminal inp can be initialized. Note that it is preferable that no signal be input to the terminal inn and the terminal inp at this time.

Furthermore, when a high-level potential is applied to the wiring SET, the second constant potential from the wiring VBIS is applied to gates of transistors X5 and X6 for drawing a current to the wiring VS SL and one of two pairs of terminals of each of capacitors Y5 and Y6 in the circuit CIRC. Thus, the transistors X5 and X6 draw a current corresponding to the second constant potential to the wiring VSSL. After that, a low-level potential is applied to the wiring SET, whereby the second constant potential can be held in the capacitors Y5 and Y6.

In the circuit CIRB, a high power supply potential is always applied to gates of transistors X7 and X8 for supplying a current from the wiring VDDL, and the second constant potential is always applied to a gate of a transistor X9 for discharging a current to the wiring VSSL.

When a high-level potential is applied to the wiring SCO, the second constant potential from the wiring VBIS is applied to a gate of a transistor X10 for discharging a current to the wiring VSSL and one of two pairs of terminals of a capacitor Y10 in the circuit CIRA. Thus, the transistor X10 discharges a current corresponding to the second constant potential to the wiring VSSL. After that, a low-level potential is applied to the wiring SCO, whereby the second constant potential is held in the capacitor Y10. Note that an inverted signal of a signal input to the wiring SCO is input to the wiring SCOB.

At this time, an input potential is applied to each of the terminal inn and the terminal inp, whereby the circuit CIRA outputs a first output potential from a node NT1 and a second output potential from a node NT2 as the differential outputs in accordance with the input potentials. After that, in the circuit CIRC, the potentials of the gates of the transistors X5 and X6 for discharging a current to the wiring VSSL vary in accordance with the first output potential and the second output potential owing to capacitive coupling of the capacitors Y5 and Y6. Thus, the circuit CIRC outputs the output potentials of the fully differential amplifier FDA from the terminal outp and the terminal outn.

Since the wiring SCO has a low-level potential, the wiring SCOB has a high-level potential. Thus, an intermediate potential between the potential of the terminal outp and the potential of the terminal outn is output to the wiring COMO. Consequently, the intermediate potential is input to the wiring COMI.

At this time, the circuit CIRB outputs a third output potential from a node NT3 on the basis of the differential input of the ground potential of the wiring VCOM and the intermediate potential of the wiring COMI. Then, in the circuit CIRA, the potential of the gate of the transistor X10 for discharging a current to the wiring VSSL varies in accordance with the second output potential owing to capacitive coupling of the capacitor Y10. Accordingly, the amount of current flowing through the transistor X10 is changed. In other words, common mode feedback in the fully differential amplifier FDA can be performed in such a manner that the circuit CIRB generates the second output potential by input of the intermediate potential from the wiring COMI and supplies the second output potential to the circuit CIRA.

The fully differential amplifier FDA illustrated in FIG. 9(B) includes the transistor X1 to the transistor X10 that are n-channel transistors. Moreover, transistors to which no reference numeral is attached are also n-channel transistors. Therefore, the fully differential amplifier FDA illustrated in FIG. 9(B) is configured as a single-polarity circuit. All the transistors included in the fully differential amplifier FDA are preferably OS transistors, like the transistor Tr1 and the transistor Tr2. The description of the transistor Tr1 is referred to for the OS transistor. Alternatively, all or some of the transistors included in the fully differential amplifier FDA may be Si transistors.

By employing the circuits illustrated in FIG. 8 and FIG. 9 in the learning circuit LEC as described above, the learning circuit LEC can be configured as a single-polarity circuit using only n-channel transistors.

Operation Example

Next, an operation example of the arithmetic circuit 100 is described.

Figure 10:
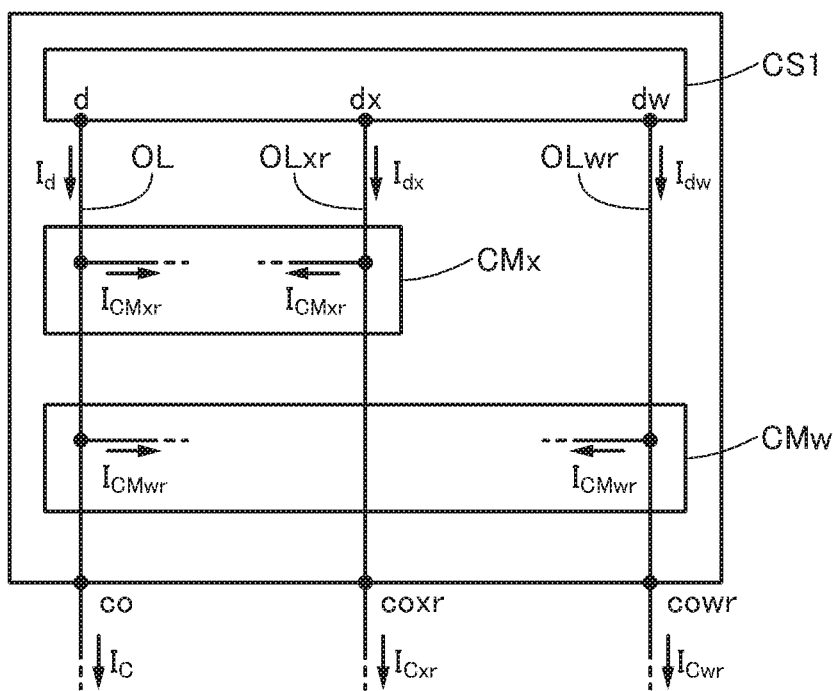
FIG. 10 A block diagram illustrating an example of a current supply circuit included in a semiconductor device.

Note that the current supply circuit IS of the arithmetic circuit 100 used in the description of this operation example has a structure illustrated in FIG. 10. The current supply circuit IS illustrated in FIG. 10 has a structure in which the terminal d1 and the terminal d2 of the circuit CS1 are integrated as a terminal d and the circuit CSx and the circuit CSw are removed in the current supply circuit IS in FIG. 3(A). Accordingly, the wiring OL[1] and the wiring OL[2] in the current supply circuit IS in FIG. 3(A) are integrated as the wiring OL, the current Id1 and the current Id2 are collectively referred to as a current $I_d$ as a current flowing from the terminal d of the circuit CS1, and the circuit CMx and the circuit CMw draw a current flowing through the wiring OL.

Here, the operation of the arithmetic circuit 100 of obtaining arithmetic result data from the amount of change of current $I_\alpha$ and updating the first data is described. Therefore, as the activation function circuit ACTV in this operation example, the activation function circuit ACTV illustrated in FIG. 5(B) is used for the description.

Figure 11:
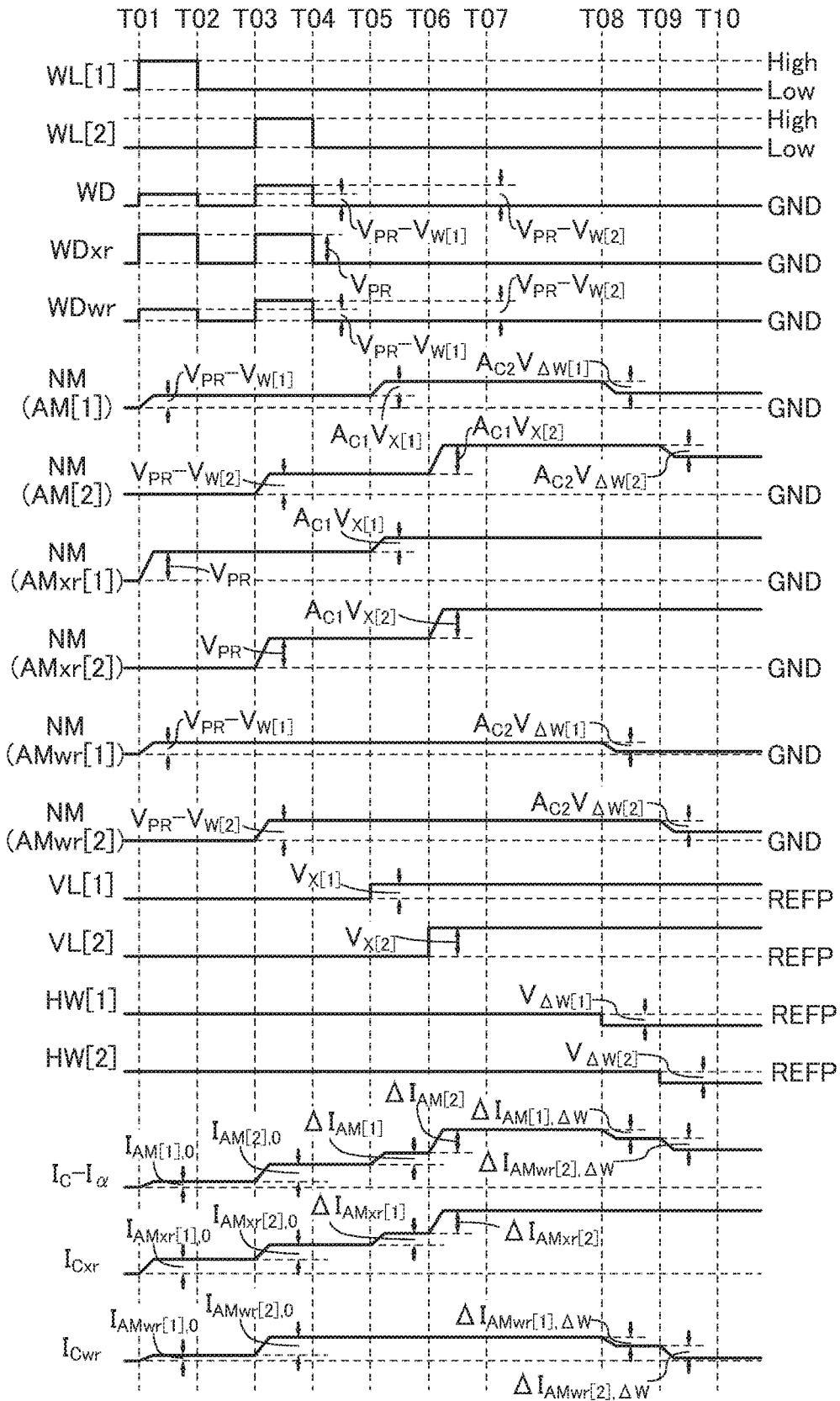
FIG. 11 A timing chart illustrating an operation example of a semiconductor device.

FIG. 11 is a timing chart of an operation example of the arithmetic circuit 100. The timing chart in FIG. 11 shows changes in potentials of the wiring WL[1], the wiring WL[2], the wiring WD, the wiring WDxr, the wiring WDwr, the node NM(AM[1]), the node NM(AM[2]), the node NM(AMxr[1]), the node NM(AMxr[2]), the node NM(AMwr[1]), the node NM(AMwr[2]), the wiring VL[1], the wiring VL[2], the wiring HW[1], and the wiring HW[2] between Time T01 and Time T10, and shows changes in the amount of current $I_C-I_\alpha$, current $I_{Cxr}$, and current $I_{Cwr}$. Specifically, the current $I_B-I_\alpha$, represents the total sum of currents that flow from the wiring BL to the terminals m2 of the memory cell AM[1] and the memory cell AM[2] in the memory cell array MCA.

<<From Time T01 to Time T02>>

In the period from Time T01 to Time T02, a high-level potential (denoted by High in FIG. 11) is applied to the wiring WL[1], and a low-level potential (denoted by Low in FIG. 11) is applied to the wiring WL[2]. A potential higher than the ground potential (denoted by GND in FIG. 11) by $V_{PR}-V_{W[1]}$ is applied to the wiring WD; a potential higher than the ground potential by $V_{PR}$ is applied to the wiring WDxr; and the potential higher than the ground potential by $V_{PR}-V_{W[1]}$ is applied to the wiring WDwr. A reference potential (denoted by REFP in FIG. 11 and sometimes referred to as an initial potential in this specification and the like) is applied to the wiring VL[1], the wiring VL[2], the wiring HW[1], and the wiring HW[2].

The potential $V_{W[1]}$ is a potential corresponding to one of a plurality of pieces of first data. The potential $V_{PR}$ is a potential corresponding to reference data.

At this time, the high-level potential is applied to the gate of the transistor Tr11 in each of the memory cell AM[1] and the memory cell AMxr[1]; thus, the transistors Tr1 in the memory cell AM[1] and the memory cell AMxr[1] are turned on. Accordingly, in the memory cell AM[1], electrical continuity is established between the wiring WD and the node NM(AM[1]), so that the potential of the node NM(AM

[1]) becomes $V_{PR}-V_{W[1]}$. Similarly, in the memory cell AMxr[1], electrical continuity is established between the wiring WDxr and the node NM(AMxr[1]), so that the potential of the node NM(AMxr[1]) becomes $V_{PR}$. Furthermore, in the memory cell AMwr[1], electrical continuity is established between the wiring WDwr and the node NM(AMwr[1]), so that the potential of the node NM(AMwr[1]) becomes $V_{PR}-V_{W[1]}$.

Here, the current flowing from the second terminal to the first terminal of the transistor Tr2 in each of the memory cell AM[1], the memory cell AMxr[1], and the memory cell AMwr[1] is considered. When the current flowing from the wiring BL to the first terminal of the transistor Tr2 in the memory cell AM[1] through its second terminal is $I_{AM[1],0}$, $I_{AM[1],0}$ can be expressed by the following formula.

[Formula 2]

$$I_{AM[1],0}=k(V_{PR}-V_{W[1]}-V_{th})^2 \qquad (B1)$$

Note that k is a constant determined by the channel length, the channel width, the mobility, the capacitance of a gate insulating film, and the like of the transistor Tr2. Furthermore, $V_{th}$ is the threshold voltage of the transistor Tr2.

When the current flowing from the wiring BLxr to the first terminal of the transistor Tr2 in the memory cell AMxr[1] through its second terminal is $I_{AMxr[1],0}$, $I_{AMxr[1],0}$ can be expressed similarly by the following formula.

[Formula 3]

$$I_{AMxr[1],0}=k(V_{PR}-V_{th})^2 \qquad (B2)$$

When the current flowing from the wiring BLwr to the first terminal of the transistor Tr2 in the memory cell AMwr[1] through its second terminal is $I_{AMwr[1],0}$, $I_{AMwr[1],0}$ can be expressed similarly by the following formula.

[Formula 4]

$$I_{AMwr[1],0}=k(V_{PR}-V_{W[1]}-V_{th})^2 \qquad (B3)$$

Note that since the low-level potential is applied to the gate of the transistor Tr1 in each of the memory cell AM[2], the memory cell AMxr[2], and the memory cell AMwr[2], the transistors Tr1 in the memory cell AM[2], the memory cell AMxr[2], and the memory cell AMwr[2] are turned off. Thus, potentials are not held in the node NM(AM[2]), the node NM(AMxr[2]), and the node NM(AMwr[2]).

<<From Time T02 to Time T03>>

In the period from Time T02 to Time T03, the low-level potential is applied to the wiring WL[1]. At this time, the low-level potential is applied to the gate of the transistor Tr1 in each of the memory cell AM[1], the memory cell AMxr[1], and the memory cell AMwr[1]; thus, the transistors Tr1 in the memory cell AM[1], the memory cell AMxr[1], and the memory cell AMwr[1] are turned off.

In addition, the low-level potential is continuously applied to the wiring WL[2] before Time T02. Thus, the transistors Tr1 in the memory cell AM[2], the memory cell AMxr[2], and the memory cell AMwr[2] are off before Time T02.

Since the transistors Tr1 in the memory cell AM[1], the memory cell AM[2], the memory cell AMxr[1], the memory cell AMxr[2], the memory cell AMwr[2], and the memory cell AMwr[2] are off as described above, the potentials of the node NM(AM[1]), the node NM(AM[2]), the node NM(AMxr[1]), the node NM(AMxr[2]), the node NM(AMwr[1]), and the node NMwr[2] are maintained between Time T02 and Time T03.

In particular, when OS transistors are used as the transistors Tr1 in the memory cell AM[1], the memory cell AM[2], the memory cell AMxr[1], the memory cell AMxr[2], the memory cell AMwr[2], and the memory cell AMwr[2] as mentioned in the description of the circuit configuration of the arithmetic circuit 100, leakage current flowing between the first terminal and the second terminal of the transistor Tr1 can be made low, which makes it possible to retain the potential of each of the nodes for a long time.

In the period from Time T02 to Time T03, the ground potential is applied to the wiring WD, the wiring WDxr, and the wiring WDwr. Since the transistors Tr1 in the memory cell AM[1], the memory cell AM[2], the memory cell AMxr[1], the memory cell AMxr[2], the memory cell AMwr[2], and the memory cell AMwr[2] are off, the potentials retained in the nodes of the memory cell AM[1], the memory cell AM[2], the memory cell AMxr[1], the memory cell AMxr[2], the memory cell AMwr[2], and the memory cell AMwr[2] are not rewritten by application of potentials from the wiring WD, the wiring WDxr, and the wiring WDwr.

<<From Time T03 to Time T04>>

In the period from Time T03 to Time T04, the low-level potential is applied to the wiring WL[1], and the high-level potential is applied to the wiring WL[2]. A potential higher than the ground potential by $V_{PR}-V_{W[2]}$ is applied to the wiring WD, the potential higher than the ground potential by $V_{PR}$ is applied to the wiring WDxr, and the potential higher than the ground potential by $V_{PR}-V_{W[2]}$ is applied to the wiring WDwr. The reference potential is continuously applied to the wiring VL[1], the wiring VL[2], the wiring HW[1], and the wiring HW[2] from Time T02.

Note that the potential $V_{W[2]}$ is a potential corresponding to another one of the plurality of pieces of first data, which is different from the potential $V_{W[1]}$.

At this time, the high-level potential is applied to the gates of the transistors Tr1 in the memory cell AM[2], the memory cell AMxr[2], and the memory cell AMwr[2]; thus, the transistors Tr1 in the memory cell AM[2], the memory cell AMxr[2], and the memory cell AMwr[2] are turned on. Accordingly, in the memory cell AM[2], electrical continuity is established between the wiring WD and the node NM(AM[2]), so that the potential of the node NM(AM[2]) becomes $V_{PR}-V_{W[2]}$. Similarly, in the memory cell AMxr[2], electrical continuity is established between the wiring WDxr and the node NM(AMxr[2]), so that the potential of the node NM(AM[2]) becomes $V_{PR}$. Furthermore, in the memory cell AMwr[2], electrical continuity is established between the wiring WDwr and the node NM(AMwr[2]), so that the potential of the node NM(AMwr[2]) becomes $V_{PR}-V_{W[2]}$.

Here, the current flowing from the second terminal to the first terminal of the transistor Tr2 in each of the memory cell AM[2], the memory cell AMxr[2], and the memory cell AMwr[2] is considered. When the current flowing from the wiring BL to the first terminal of the transistor Tr2 in the memory cell AM[2] through its second terminal is $I_{AM[2],0}$, $I_{AM[2],0}$ can be expressed by the following formula.

[Formula 5]

$$I_{AM[2],0}=k(V_{PR}-V_{W[2]}-V_{th})^2 \qquad (B4)$$

When the current flowing from the wiring BLxr to the first terminal of the transistor Tr2 in the memory cell AMxr[2] through its second terminal is $I_{AMxr[2],0}$, $I_{AMxr[2],0}$ can be expressed similarly by the following formula.

[Formula 6]

$$I_{AMxr[2],0}=k(V_{PR}-V_{th})^2 \quad (B5)$$

When the current flowing from the wiring BLwr to the first terminal of the transistor Tr2 in the memory cell AMwr[2] through its second terminal is $I_{AMwr[2],0}$, $I_{AMwr[2],0}$ can be expressed similarly by the following formula.

[Formula 7]

$$I_{AMwr[2],0}=k(V_{PR}-V_{W[2]}-V_{th})^2 \quad (B6)$$

<<From Time T04 to Time T05>>

Here, currents that flow through the wiring BL, the wiring BLxr, and the wiring BLwr during the period from Time T04 to Time T05 are described.

The wiring BLxr is supplied with a current from the terminal coxr of the current supply circuit IS. The current can be expressed using the constant current $I_{dx}$ supplied from the circuit CS1 and a current drawn by the circuit CMx inside the current supply circuit IS. At this time, when the current drawn by the circuit CMx is $I_{CMx,0}$, the following formula holds according to Kirchhoff's laws.

[Formula 8]

$$I_{dx}-I_{CMx,0}=I_{AMxr[1],0}+I_{AMxr[2],0} \quad (B7)$$

The wiring BLwr is supplied with a current from the terminal cowr of the current supply circuit IS. The current can be expressed using the constant current $I_{dw}$ supplied from the circuit CS1 and a current drawn by the circuit CMw inside the current supply circuit IS. At this time, when the current drawn by the circuit CMw is $I_{CMw,0}$, the following formula holds according to Kirchhoff's laws.

[Formula 9]

$$I_{dw}-I_{CMw,0}=I_{AMwr[1],0}+I_{AMwr[2],0} \quad (B8)$$

The wiring BL is supplied with a current from the terminal co of the current supply circuit IS. The current can be expressed using the constant current $I_d$ supplied from the circuit CS1 and currents drawn by the circuit CMx and the circuit CMw inside the current supply circuit IS. At this time, when the current flowing from the wiring BL to the terminal ai of the activation function circuit ACTV is $I_{\alpha,0}$, the relation between currents flowing through the wiring OL and the wiring BL can be expressed by the following formula according to Kirchhoff's laws.

[Formula 10]

$$I_d-I_{CMx,0}-I_{CMw,0}=I_{AM[1],0}+I_{AM[2],0}+I_{\alpha,0} \quad (B9)$$

<<From Time T05 to Time T06>>

In the period from Time T05 to Time T06, a potential higher than the reference potential by $V_{x[1]}$ is applied to the wiring VL[1]. At this time, the potential $V_{x[1]}$ is applied to the second terminal of the capacitor C1 in each of the memory cell AM[1] and the memory cell AMxr[1], so that the potentials of the gates of the transistors Tr2 increase. Note that since the wiring VL[1] is not electrically connected to the memory cell AMwr[1], the potential of the gate of the transistor Tr2 in the memory cell AMwr[1] does not change even when the potential of the wiring VL[1] changes.

The potential $V_{x[1]}$ is a potential corresponding to one of a plurality of pieces of second data.

Note that the amount of increase in the potential of the gate of the transistor Tr2 corresponds to a potential obtained by multiplying a change in the potential of the wiring VL[1] by a capacitive coupling coefficient depending on the capacitor C1 and the circuit configuration therearound. For example, the capacitive coupling coefficient can be calculated using the capacitance of the capacitor C1, the capacitance of the capacitor C2, the gate capacitance of the transistor Tr2, the parasitic capacitance, and the like. In this operation example, the capacitive coupling coefficient due to the capacitor C1 is described as $A_{C1}$.

Since the capacitive coupling coefficient is $A_{C1}$, when the potential $V_{x[1]}$ is applied to the second terminal of the capacitor C1 in each of the memory cell AM[1] and the memory cell AMxr[1], the potentials of the node NM(AM[1]) and the node NM(AMxr[1]) increase by $A_{C1}V_{x[1]}$.

Here, the current flowing from the second terminal to the first terminal of the transistor Tr2 in each of the memory cell AM[1] and the memory cell AMxr[1] is considered. When the current flowing from the wiring BL to the first terminal of the transistor Tr2 in the memory cell AM[1] through its second terminal is $I_{AM[1],1}$, $I_{AM[1],1}$ can be expressed by the following formula.

[Formula 11]

$$I_{AM[1],1}=k(V_{PR}-V_{W[1]}+A_{C1}V_{x[1]}-V_{th})^2 \quad (B10)$$

In other words, by application of the potential $V_{x[1]}$ to the wiring VL[1], the current flowing from the wiring BL to the first terminal of the transistor Tr2 in the memory cell AM[1] through its second terminal increases by $I_{AM[1],1}-I_{AM[1],0}$ (denoted by $\Delta I_{AM[1]}$ in FIG. 11).

Similarly, when the current flowing from the wiring BLxr to the first terminal of the transistor Tr2 in the memory cell AMxr[1] through its second terminal is $I_{AMxr[1],1}$, $I_{AMxr[1],1}$ can be expressed by the following formula.

[Formula 12]

$$I_{AMxr[1],1}=k(V_{PR}+A_{C1}V_{x[1]}-V_{th})^2 \quad (B11)$$

In other words, by application of the potential $V_{x[1]}$ to the wiring VL[1], the current flowing from the wiring BLxr to the first terminal of the transistor Tr2 in the memory cell AMxr[1] through its second terminal increases by $I_{AMxr[1],1}-I_{AMxr[1],0}$ (denoted by $\Delta I_{AMxr[1]}$ in FIG. 11).

Here, currents that flow through the wiring BL and the wiring BLxr are described.

The wiring BLxr is supplied with a current from the terminal coxr of the current supply circuit IS. The current can be expressed using the constant current $I_{dx}$ supplied from the circuit CS1 and a current drawn by the circuit CMx inside the current supply circuit IS. At this time, when the current drawn by the circuit CMx is $I_{CMx,1}$, the following formula holds according to Kirchhoff's laws.

[Formula 13]

$$I_{dx}-I_{CMx,1}=I_{AMxr[1],1}+I_{AMxr[2],0} \quad (B12)$$

The wiring BL is supplied with a current from the terminal co of the current supply circuit IS. The current can be expressed using the constant current $I_d$ supplied from the circuit CS1 and currents drawn by the circuit CMx and the circuit CMw inside the current supply circuit IS. At this time, when the current flowing from the wiring BL to the terminal ai of the activation function circuit ACTV is $I_{\alpha,1}$, the relation between currents flowing through the wiring OL and the wiring BL can be expressed by the following formula according to Kirchhoff's laws.

[Formula 14]

$$I_d-I_{CMx,1}-I_{CMw,0}=I_{AM[1],1}+I_{AM[2],0}+I_{\alpha,1} \quad (B13)$$

Note that $\Delta I_\alpha$ represents the difference between the current $I_{\alpha,0}$ flowing from the wiring BL to the terminal ai during the period from Time T04 to Time T05 and the current $I_{\alpha,1}$ flowing from the wiring BL to the terminal ai during the period from Time T06 to Time T07. Hereinafter, $\Delta I_\alpha$ is referred to as a first difference current in the arithmetic circuit 100. The first difference current $\Delta I_\alpha$ can be expressed by the following formula, using Formula (B1) to Formula (B13).

[Formula 15]

$$\Delta I_\alpha = I_{\alpha,1} - I_{\alpha,0} = 2kA_{C1}V_{W[1]}V_{X[1]} \quad (B14)$$

<<From Time T06 to Time T07>>

In the period from Time T06 to Time T07, a potential higher than the reference potential by $V_{X[2]}$ is applied to the wiring VL[2]. At this time, the potential $V_{X[2]}$ is applied to the second terminal of the capacitor C1 in each of the memory cell AM[2] and the memory cell AMxr[2]. Thus, the potentials of the gates of the transistors Tr2 in the memory cell AM[2] and the memory cell AMxr[2] increase. Note that since the wiring VL[2] is not electrically connected to the memory cell AMwr[2], the potential of the gate of the transistor Tr2 in the memory cell AMwr[2] does not increase even when the potential of the wiring VL[2] changes.

Note that the potential $V_{x[2]}$ is a potential corresponding to another one of the plurality of pieces of second data, which is different from the potential $V_{x[1]}$.

Note that the wiring VL[1] is continuously supplied with the potential higher than the reference potential by $V_{X[1]}$ before Time T06.

For changes in the potentials of the retention nodes in the memory cell AM[2] and the memory cell AMxr[2], the description is similarly made with the capacitive coupling coefficient of each memory cell as $A_{C1}$. Since the capacitive coupling coefficient is $A_{C1}$, when the potential $V_{X[2]}$ is applied to the second terminal of the capacitor C1 in each of the memory cell AM[2] and the memory cell AMxr[2], the potentials of the node NM(AM[2]) and the node NM(AMxr[2]) increase by $A_{C1}V_{X[2]}$.

Here, the current flowing from the second terminal to the first terminal of the transistor Tr2 in each of the memory cell AM[2] and the memory cell AMxr[2] is considered. When the current flowing from the wiring BL to the first terminal of the transistor Tr2 in the memory cell AM[2] through its second terminal is $I_{AM[2],1}$, $I_{AM[2],1}$ can be expressed by the following formula.

[Formula 16]

$$I_{AM[2],1} = k(V_{PR} - V_{W[2]} + A_{C1}V_{X[2]} - V_{th})^2 \quad (B15)$$

In other words, by application of the potential $V_{X[2]}$ to the wiring VL[2], the current flowing from the wiring BL to the first terminal of the transistor Tr2 in the memory cell AM[2] through its second terminal increases by $I_{AM[2],1} - I_{AM[2],0}$ (denoted by $\Delta I_{AM[2]}$ in FIG. 11).

Similarly, when the current flowing from the wiring BLxr to the first terminal of the transistor Tr2 in the memory cell AMxr[2] through its second terminal is $I_{AMxr[2],1}$, $I_{AMxr[2],1}$ can be expressed by the following formula.

[Formula 17]

$$I_{AMxr[2],1} = k(V_{PR} + A_{C1}V_{X[2]} - V_{th})^2 \quad (B16)$$

In other words, by application of the potential $V_{X[2]}$ to the wiring VL[2], the current flowing from the wiring BLxr to the first terminal of the transistor Tr2 in the memory cell AMxr[2] through its second terminal increases by $I_{AMxr[2],2} - I_{AMxr[2],0}$ (denoted by $\Delta I_{AMxr[2]}$ in FIG. 11).

Here, currents that flow through the wiring BL and the wiring BLxr are described.

The wiring BLxr is supplied with a current from the terminal coxr of the current supply circuit IS. The current can be expressed using the constant current $I_{dx}$ supplied from the circuit CS1 and a current drawn by the circuit CMx inside the current supply circuit IS. At this time, when the current drawn by the circuit CMx is $I_{CMx,1.5}$, the following formula holds according to Kirchhoff's laws.

[Formula 18]

$$I_{dx} - I_{CMx,1.5} = I_{AMxr[1],1} + I_{AMxr[2],1} \quad (B17)$$

The wiring BL is supplied with a current from the terminal co of the current supply circuit IS. The current can be expressed using the constant current $I_d$ supplied from the circuit CS1 and currents drawn by the circuit CMx and the circuit CMw inside the current supply circuit IS. At this time, when the current flowing from the wiring BL to the terminal ai of the activation function circuit ACTV is $I_{\alpha,1.5}$, the relation between currents flowing through the wiring OL and the wiring BL can be expressed by the following formula according to Kirchhoff's laws.

[Formula 19]

$$I_d - I_{CMx,1.5} - I_{CMw,0} = I_{AM[1],1} + I_{AM[2],1} + I_{\alpha,1.5} \quad (B18)$$

The first difference current $\Delta I_\alpha$, which is the difference between the current $I_{\alpha,0}$ flowing from the wiring BL to the terminal ai during the period from Time T04 to Time T05 and the current $I_{\alpha,1.5}$ flowing from the wiring BL to the terminal ai during the period from Time T06 to Time T07, can be expressed by the following formula, using Formula (B1) to Formula (B11) and Formula (B15) to Formula (E18).

[Formula 20]

$$\alpha I_\alpha = I_{\alpha,1.5} - I_{\alpha,0} = 2kA_{C1}(V_{W[1]}V_{X[1]} + V_{W[2]}V_{X[2]}) \quad (B19)$$

As shown by Formula (B14) and Formula (B20), the first difference current $\Delta I_\alpha$ input to the terminal ai has a value corresponding to the sum of products of the potentials $V_W$, which are a plurality of pieces of first data, and the potentials $V_X$, which are a plurality of pieces of second data. That is, when the first difference current $\Delta I_\alpha$ is input to the terminal ai of the activation function circuit ACTV, the value of product-sum of the first data and the second data can be obtained, and the value of the activation function based on the value can be obtained.

Although $V_{W[1]}$ was applied to the wiring VL[1] in the period from Time T05 to Time T06 and $V_{W[2]}$ was applied to the wiring VL[2] in the period from Time T06 to Time T07, potentials applied to the wiring VL[1] and the wiring VL[2] may be lower than the reference potential REFP. In the case where a potential lower than the reference potential REFP is applied to the wiring VL[1] and/or the wiring VL[2], the potential of the retention node of the memory cell connected to the wiring VL[1] and/or the wiring VL[2] can be lowered by capacitive coupling. Thus, multiplication of the first data and one piece of the second data, which is a negative value, can be performed in the product-sum operation. For example, in the case where $-V_{W[2]}$, instead of $V_{W[2]}$, is applied to the wiring VL[2] in the period from Time T06 to Time T07, the first difference current $\Delta I_\alpha$ can be expressed by the following formula.

[Formula 21]

$$\Delta I_\alpha = I_{\alpha,1.5} - I_{\alpha,0} = 2kA_{C1}(V_{W[1]}V_{X[1]} - V_{W[2]}V_{X[2]}) \quad (B20)$$

Although the memory cell array MCA including the memory cells arranged in a matrix of two rows and three columns is used in this operation example, arithmetic operation can be similarly performed in a memory cell array of three or more rows and four or more columns. For example, when a plurality of columns including memory cells having the same connection structure as the above-described memory cell AM[1] and memory cell AM[2] are provided, arithmetic operation processing for the plurality of columns can be performed at the same time. That is, when the number of columns in the memory cell array is increased, a semiconductor device that achieve high-speed arithmetic operation processing can be provided. Furthermore, increasing the number of rows allows an increase in the number of terms to be added in the product-sum operation. The first difference current $\Delta I_\alpha$ when the number of rows is increased can be expressed by the following formula.

[Formula 22]

$$\Delta I_\alpha = 2kA_{C1} \sum_i V_{W[i]} V_{X[i]} \quad (B21)$$

<<From Time T07 to Time T08>>

In the period from Time T07 to Time T08, the first difference current $\Delta I_\alpha$ calculated between Time T06 and Time T07 is input to the terminal ai of the activation function circuit ACTV, and the arithmetic result data is output from the terminal afb. Then, the arithmetic result data is input to the terminal gi4 of the learning circuit LEC. Moreover, at this time, the input data $x_0$ is input to the terminal gi1 of the learning circuit LEC; $V_{X[1]}$ is input to the terminal gi2[1] of the learning circuit LEC as one of the plurality of pieces of second data; $V_{X[2]}$ is input to the terminal gi2[2] of the learning circuit LEC as one of the plurality of pieces of second data; and the teacher data is input to the terminal gi3 of the learning circuit LEC.

<<From Time T08 to Time T09>>

In the period from Time T08 to Time T09, the potential $V_{\Sigma\Delta w}$ corresponding to the total sum of the update amounts of the first data (the potential $V_{W[1]}$) (i.e., corresponding to update data) is output from the terminal io[1] of the learning circuit LEC. Note that in this operation example, first update of the first data is described, and a potential $-V_{\Delta w[1]}$ corresponding to the update amount of the first data (the potential $V_{W[1]}$) is output from the terminal io[1] of the learning circuit LEC. At this time, $-V_{\Delta w[1]}$ is applied to the wiring HW[1]; hence, the potential $-V_{\Delta w[1]}$ is applied to the second terminal of the capacitor C2 through the terminal m5 in each of the memory cell AM[1] and the memory cell AMwr[1]. Thus, the potentials of the gates of the transistors Tr2 in the memory cell AM[1] and the memory cell AMwr[1] decrease. Note that since the wiring HW[1] is not electrically connected to the memory cell AMxr[1], the potential of the gate of the transistor Tr2 in the memory cell AMxr[1] does not increase even when the potential of the wiring HW[1] changes.

Note that the amount of increase in the potential of the gate of the transistor Tr2 corresponds to a potential obtained by multiplying a change in the potential of the wiring HW[1] by a capacitive coupling coefficient depending on the capacitor C2 and the circuit configuration therearound. For example, the capacitive coupling coefficient can be calculated using the capacitance of the capacitor C1, the capacitance of the capacitor C2, the gate capacitance of the transistor Tr2, the parasitic capacitance, and the like. In this operation example, the capacitive coupling coefficient due to the capacitor C2 is described as $A_{C2}$.

Since the capacitive coupling coefficient is $A_{C2}$, when the potential $-V_{\Delta w[1]}$ is applied to the second terminal of the capacitor C2 in each of the memory cell AM[1] and the memory cell AMwr[1], the potentials of the node NM(AM[1]) and the node NM(AMwr[1]) decrease by $A_{C2}V_{\Delta w[1]}$.

Note that as described above, because of capacitive coupling of the capacitor C2, the potential $-V_{\Delta w[1]}$, which is based on the update amount of the first data (the potential $V_{W[1]}$) and is output from the terminal io[1] of the learning circuit LEC, cannot be directly added to the potentials of the node NM(AM[1]) and the node NM(AMwr[1]). Therefore, the potential that is based on the update amount of the first data (the potential $V_{W[1]}$) and is output from the terminal io[1] of the learning circuit LEC is preferably a potential that cancels the influence of capacitive coupling of the capacitor C2. For example, when the potential that is based on the update amount of the first data (the potential $V_{W[1]}$) and is output from the terminal io[1] of the learning circuit LEC is $-V_{\Delta w[1]}/A_{c2}$, the influence of capacitive coupling of the capacitor C2 can be canceled. In this operation example, the description is made given that the potential that is based on the update amount of the first data (the potential $V_{W[1]}$) and is output from the terminal io[1] of the learning circuit LEC is $-V_{\Delta w[1]}$.

Here, the current flowing from the second terminal to the first terminal of the transistor Tr2 in each of the memory cell AM[1] and the memory cell AMwr[1] is considered. When the current flowing from the wiring BL to the first terminal of the transistor Tr2 in the memory cell AM[1] through its second terminal is $I_{AM[1],3}$, $I_{AM[1],3}$ can be expressed by the following formula.

[Formula 23]

$$I_{AM[1],3} = k(V_{PR} - V_{W[1]} - A_{C2}V_{\Delta W[1]} + A_{C1}V_{X[1]} - V_{th})^2 \quad (B22)$$

In other words, by application of the potential $-V_{\Delta w[1]}$ to the wiring HW[1], the current flowing from the wiring BL to the first terminal of the transistor Tr2 in the memory cell AM[1] through its second terminal decreases by $I_{AM[1],1} - I_{AM[1],3}$ (denoted by $\Delta I_{AM[1],\Delta w}$ in FIG. 11).

Similarly, when the current flowing from the wiring BLwr to the first terminal of the transistor Tr2 in the memory cell AMwr[1] through its second terminal is $I_{AMwr[1],3}$, $I_{AMwr[1],3}$ can be expressed by the following formula.

[Formula 24]

$$I_{AMwr[1],3} = k(V_{PR} - V_{W[1]} - A_{C2}V_{\Delta W[1]} - V_{th})^2 \quad (B23)$$

In other words, by application of the potential $-V_{\Delta w[1]}$ to the wiring HW[1], the current flowing from the wiring BLwr to the first terminal of the transistor Tr2 in the memory cell AMwr[1] through its second terminal decreases by $I_{AMxr[1],0} - I_{AMxr[1],3}$ (denoted by $\Delta I_{AMxr[1],\Delta w}$ in FIG. 11).

Here, currents that flow through the wiring BL and the wiring BLwr are described.

The wiring BLwr is supplied with a current from the terminal cowr of the current supply circuit IS. The current can be expressed using a constant current $I_{wx}$ supplied from the circuit CS1 and a current drawn by the circuit CMw inside the current supply circuit IS. At this time, when the current drawn by the circuit CMw is $I_{CMw,3}$, the following formula holds according to Kirchhoff's laws.

[Formula 25]

$$I_{dw} - I_{CMw,3} = I_{AMwr[1],3} + I_{AMwr[2],0} \quad (B24)$$

The wiring BL is supplied with a current from the terminal co of the current supply circuit IS. The current can be expressed using the constant current $I_d$ supplied from the circuit CS1 and currents drawn by the circuit CMx and the circuit CMw inside the current supply circuit IS. At this time, when the current flowing from the wiring BL to the terminal ai of the activation function circuit ACTV is $I_{\alpha,3}$, the relation between currents flowing through the wiring OL and the wiring BL can be expressed by the following formula according to Kirchhoff's laws.

[Formula 26]

$$I_d - I_{CMx,1.5} - I_{CMw,3} = I_{AM[1],3} + I_{AM[2],1} + I_{\alpha,3} \quad (B25)$$

Note that $\Delta I_\beta$ represents the difference between the current $I_{\alpha,0}$ flowing from the wiring BL to the terminal ai during the period from Time T04 to Time T05 and the current $I_{\alpha,3}$ flowing from the wiring BL to the terminal ai during the period from Time T08 to Time T09. Hereinafter, $\Delta I_\beta$ is referred to as a second difference current in the arithmetic circuit 100. The second difference current $\Delta I_\beta$ can be expressed by the following formula, using Formula (B1) to Formula (B9), Formula (B11), Formula (B15) to Formula (B17), and Formula (B22) to Formula (B25).

[Formula 27]

$$\Delta I_\beta = I_{\alpha,3} - I_{\alpha,0} = 2kA_{C1}(V_{W[1]} + A_{C2}V_{\Delta w[1]})V_{X[1]} \quad (B26)$$

<<From Time T09 to Time T10>>

In the period from Time T09 to Time T10, the potential $V_{\Sigma \Delta w}$ corresponding to the total sum of the update amounts of the first data (the potential $V_{W[2]}$) (i.e., corresponding to update data) is output from the terminal io[2] of the learning circuit LEC. Note that in this operation example, first update of the first data is described, and a potential $-V_{\Delta w[2]}$ corresponding to the update amount of the first data (the potential $V_{W[2]}$) is output from the terminal io[2] of the learning circuit LEC. At this time, $-V_{\Delta w[2]}$ is applied to the wiring HW[2]; hence, the potential $-V_{\Delta w[2]}$ is applied to the second terminal of the capacitor C2 through the terminal m5 in each of the memory cell AM[2] and the memory cell AMwr[2]. Thus, the potentials of the gates of the transistors Tr2 in the memory cell AM[2] and the memory cell AMwr[2] decrease. Note that since the wiring HW[2] is not electrically connected to the memory cell AMxr[2], the potential of the gate of the transistor Tr2 in the memory cell AMxr[2] does not increase even when the potential of the wiring HW[2] changes.

Note that the wiring HW[1] is continuously supplied with the potential higher than the reference potential by $V_{X[1]}$ before Time T09. Therefore, the operation between Time T08 and Time T09 is referred to for changes in the potentials of the retention nodes in the memory cell AM[1] and the memory cell AMwr[1]. For changes in the potentials of the retention nodes in the memory cell AM[2] and the memory cell AMwr[2], the description is similarly made with the capacitive coupling coefficient of each memory cell as $A_{C2}$.

Since the capacitive coupling coefficient is $A_{C2}$, when the potential $-V_{\Delta w[2]}$ is applied to the second terminal of the capacitor C2 in each of the memory cell AM[2] and the memory cell AMwr[2], the potentials of the node NM(AM[2]) and the node NM(AMwr[2]) decrease by $A_{C2}V_{\Delta w[2]}$.

Here, the current flowing from the second terminal to the first terminal of the transistor Tr2 in each of the memory cell AM[2] and the memory cell AMwr[2] is considered. When the current flowing from the wiring BL to the first terminal of the transistor Tr2 in the memory cell AM[2] through its second terminal is $I_{AM[2],3}$, $I_{AM[2],3}$ can be expressed by the following formula.

[Formula 28]

$$I_{AM[2],3} = k(V_{PR} - V_{W[2]} - A_{C2}V_{\Delta w[2]} + A_{C1}V_{X[2]} - V_{th})^2 \quad (B27)$$

In other words, by application of the potential $-V_{\Delta w[2]}$ to the wiring HW[2], the current flowing from the wiring BL to the first terminal of the transistor Tr2 in the memory cell AM[2] through its second terminal decreases by $I_{AM[2],1} - I_{AM[2],3}$ (denoted by $\Delta I_{AM[2],\Delta w}$ in FIG. 11).

Similarly, when the current flowing from the wiring BLwr to the first terminal of the transistor Tr2 in the memory cell AMwr[2] through its second terminal is $I_{AMwr[2],3}$, $I_{AMwr[2],3}$ can be expressed by the following formula.

[Formula 29]

$$I_{AMwr[2],3} = k(V_{PR} - V_{W[2]} - A_{C2}V_{\Delta w[2]} - V_{th})^2 \quad (B28)$$

In other words, by application of the potential $-V_{\Delta w[2]}$ to the wiring HW[2], the current flowing from the wiring BLwr to the first terminal of the transistor Tr2 in the memory cell AMwr[2] through its second terminal decreases by $I_{AMxr[2],0} - I_{AMxr[2],3}$ (denoted by $\Delta I_{AMxr[2],\Delta w}$ in FIG. 11).

Here, currents that flow through the wiring BL and the wiring BLwr are described.

The wiring BLwr is supplied with a current from the terminal cowr of the current supply circuit IS. The current can be expressed using the constant current $I_{wx}$ supplied from the circuit CS1 and a current drawn by the circuit CMw inside the current supply circuit IS. At this time, when the current drawn by the circuit CMw is $I_{CMw,3.5}$, the following formula holds according to Kirchhoff's laws.

[Formula 30]

$$I_{dw} - I_{CMw,3.5} = I_{AMwr[1],3} + I_{AMwr[2],3} \quad (B29)$$

The wiring BL is supplied with a current from the terminal co of the current supply circuit IS. The current can be expressed using the constant current $I_d$ supplied from the circuit CS1 and currents drawn by the circuit CMx and the circuit CMw inside the current supply circuit IS. At this time, when the current flowing from the wiring BL to the terminal ai of the activation function circuit ACTV is $I_{\alpha,3.5}$, the relation between currents flowing through the wiring OL and the wiring BL can be expressed by the following formula according to Kirchhoff's laws.

[Formula 31]

$$I_d - I_{CMx,1.5} - I_{CMw,3.5} = I_{AM[1],3} + I_{AM[2],3} + I_{\alpha,3.5} \quad (B30)$$

The second difference current $\Delta I_\beta$ which is the difference between the current $I_{\alpha,0}$ flowing from the wiring BL to the terminal ai during the period from Time T04 to Time T05 and the current $I_{\alpha,3.5}$ flowing from the wiring BL to the terminal ai during the period from Time T09 to Time T10, can be expressed by the following formula, using Formula (B1) to Formula (B9), Formula (B11), Formula (B16), Formula (B22), Formula (B23), and Formula (B27) to Formula (B29).

[Formula 32]

$$\Delta I_\beta = I_{\alpha,3.5} - I_{\alpha,0}$$
$$= 2kA_{C1}\{(V_{W[1]} = A_{C2}V_{\Delta W[1]})V_{X[1]} + (V_{W[2]} + A_{C2}V_{\Delta W[2]})V_{X[2]}\} \quad (B31)$$

As shown by Formula (B26) and Formula (B31), the second difference current $\Delta I_\beta$ input to the terminal ai has a value corresponding to the sum of products of the potentials $V_W$ corresponding to a plurality of pieces of updated first data and the potentials $V_X$ corresponding to a plurality of pieces of second data. That is, when the second difference current $\Delta I_\beta$ is input to the terminal ai of the activation function circuit ACTV, the value of product-sum of the first data and the second data can be obtained, and the value of the activation function based on the value can be obtained.

To cancel the influence of capacitive coupling of the capacitor C2, the potential $-V_{\Delta w[1]}$, which is based on the update amount of the first data (the potential $V_{W[1]}$) and is output from the terminal io[1] of the learning circuit LEC, is replaced with $-V_{\Delta w[1]}/A_{C2}$, and the potential $-V_{\Delta w[2]}$, which is based on the update amount of the first data (the potential $V_{W[2]}$) and is output from the terminal io[2] of the learning circuit LEC, is replaced with $-V_{\Delta w[2]}/A_{C2}$. This corresponds to the replacement of the coefficient $A_{C2}$ shown in Formula (B31) with 1.

Although $-V_{\Delta w[1]}$ was applied to the wiring HW[1] in the period from Time T08 to Time T09 and $-V_{\Delta w[2]}$ was applied to the wiring HW[2] in the period from Time T09 to Time T10, potentials applied to the wiring HW[1] and the wiring HW[2] may be higher than the reference potential REFP. In the case where a potential higher than the reference potential REFP is applied to the wiring HW[1] and/or the wiring HW[2], the potential of the retention node of the memory cell connected to the wiring HW[1] and/or the wiring HW[2] can be increased by capacitive coupling. For example, when $V_{\Delta w[1]}$, instead of $-V_{\Delta w[1]}$, is applied to the wiring HW[1] in the period from Time T08 to Time T09 and $V_{\Delta w[2]}$, instead of $-V_{\Delta w[2]}$, is applied to the wiring HW[2] in the period from Time T09 to Time T10, the second difference current $\Delta I_\beta$ can be expressed by the following formula.

[Formula 33]

$$\Delta I_\beta = 2kA_{C1}\{(V_{W[1]} - A_{C2}V_{\Delta W[1]})V_{X[1]} + (V_{W[2]} - A_{C2}V_{\Delta W[2]})V_{X[2]}\} \quad (B32)$$

First update of the first data has been described in this operation example; when update of the first data is performed two times or more, it is necessary to output the arithmetic result data for every update and output the total sum of the update amounts by the learning circuit LEC. For example, in the case where the first data is updated twice, when a potential corresponding to the first update amount of the first data is $-V_{\Delta w,1st}$ and a potential corresponding to the second update amount of the first data is $-V_{\Delta w,2nd}$, a potential corresponding to the total sum of the update amounts of the first data (the potential $V_{W[1]}$) (i.e., the update data) from the terminal io[1] (or the terminal io[2]) of the learning circuit LEC is $V_{\Sigma\Delta w} = V_{\Delta w,1st} - V_{\Delta w,2nd}$.

Although the memory cell array MCA including the memory cells arranged in a matrix of two rows and three columns is used in this operation example, arithmetic operation can be similarly performed in a memory cell array of three or more rows and four or more columns. For example, the second difference current $\Delta I_\beta$ when the number of rows in the memory cell array MCA is increased can be expressed by the following formula.

[Formula 34]

$$\Delta I_\beta = 2kA_{C1}\sum_i (V_{W[i]} + A_{C2}V_{\Delta W[i]})V_{X[i]} \quad (B33)$$

The arithmetic circuit 100 described in this embodiment can be used for a hierarchical neural network, for example. Specifically, in the hierarchical neural network, when a signal is supplied from all the neurons included in the (K−1)th layer (K is an integer of 2 or larger) to one of neurons included in the K-th layer, by using the above-described first data as a weight coefficient and the above-described second data as the intensity of a signal output from the (K−1)th layer, the sum of products of the intensities of the signals output from the (K−1)th layer and the weight coefficient can be calculated. Furthermore, by input of the product-sum result to the activation function circuit ACTV, the value of the activation function can be obtained. The value of the activation function can be the signal input to one of the neurons included in the K-th layer.

When learning is performed in the hierarchical neural network, a difference between the intensity of the signal output from the neuron in the K-th layer and teacher data is obtained, the update amount corresponding to the difference is calculated, and the weight coefficients of the neuron in the (K−1)th layer and the neuron in the K-th layer are changed by the update amount. Using the intensity of the signal output from the neuron in the K-th layer as arithmetic result data, the arithmetic circuit 100 calculates the update amount ($-V_{\Delta w[1]}$, $-V_{\Delta w[2]}$) from the arithmetic result data and the teacher data input from the outside. Moreover, the first data, which is the weight coefficient, is changed by the update amount with capacitive coupling, whereby the weight coefficient can be updated.

In the arithmetic circuit 100 in this embodiment, as described above, the first data held in the node NM of the memory cell AM is updated by application of a potential corresponding to the update amount to the wiring HW[1] or the wiring HW[2]. Therefore, it is unnecessary to drive the circuit WDD and the circuit WLD and write the updated first data to the node NM of the memory cell AM. In other words, the frequency of driving the circuit WDD and the circuit WLD can be reduced, so that the power consumption of the arithmetic circuit 100 can be reduced.

In the memory cell array MCA in the arithmetic circuit 100 described in this embodiment, the number of rows of memory cells having the same configuration as the memory cell AM[1] is the number of neurons in the previous layer. In other words, the number of rows of these memory cells corresponds to the number of output signals of the neurons in the previous layer that are input to the subsequent layer. The number of columns of memory cells having the same configuration as the memory cell AM[1] is the number of neurons in the subsequent layer. In other words, the number of columns of these memory cells corresponds to the number of output signals of the neurons that are output from the subsequent layer. That is, the number of rows and the number of columns in the memory cell array MCA of the arithmetic circuit are determined depending on the number of neurons in each of the previous layer and the subsequent layer; thus, a neural network is designed with the number of rows and the number of columns in the memory cell array that are determined appropriately for the desired configuration.

Note that this embodiment can be combined with the other embodiments and/or the example in this specification as appropriate.

Embodiment 2

In this embodiment, a structure example and an operation example of an arithmetic circuit different from the arithmetic circuit 100 described in Embodiment 1 will be described.

Structure Example

Figure 12:
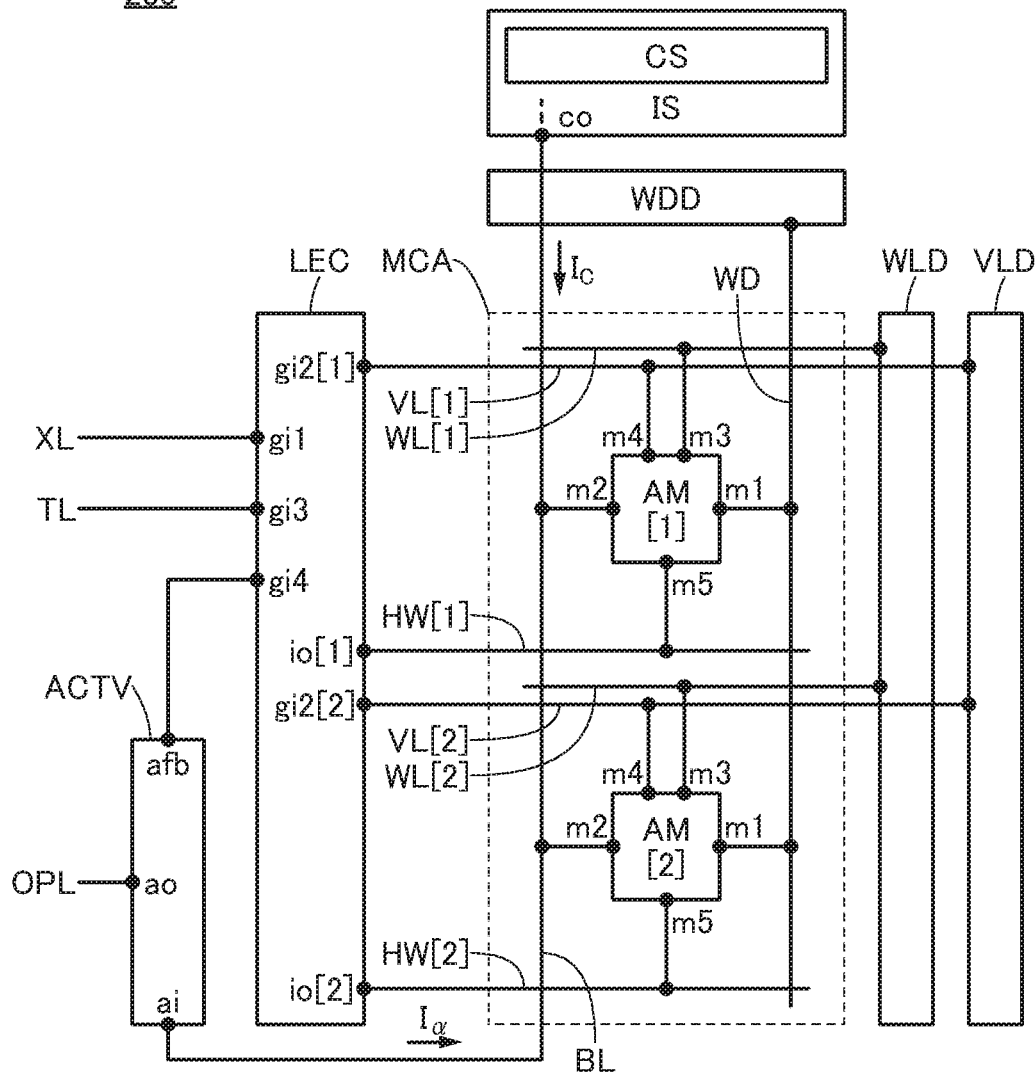
FIG. 12 A block diagram illustrating an example of a semiconductor device.

FIG. 12 illustrates a structure example of an arithmetic circuit 200. The arithmetic circuit 200 illustrated in FIG. 12 has a structure in which the memory cell AMxr[1], the memory cell AMxr[2], the memory cell AMwr[1], and the memory cell AMwr[2] are removed from the memory cell array MCA and the current mirror circuit CM is removed from the current supply circuit IS in the arithmetic circuit 100 in FIG. 1.

Moreover, in the arithmetic circuit 100, the current $I_\alpha$ flows from the wiring BL to the terminal ai of the activation function circuit ACTV, whereas in the arithmetic circuit 200, the current $I_\alpha$ flows from the terminal ai of the activation function circuit ACTV to the wiring BL.

The memory cell AM[1] and the memory cell AM[2] included in the memory cell array MCA of the arithmetic circuit 200 illustrated in FIG. 12 can have the same configuration as the memory cell AM[1] and the memory cell AM[2] described in Embodiment 1. Therefore, the description of the arithmetic circuit 100 in Embodiment 1 is referred to for the details of the memory cell AM[1] and the memory cell AM[2].

The circuit WDD, the circuit WLD, the circuit VLD, the activation function circuit ACTV, and the learning circuit LEC included in arithmetic circuit 200 illustrated in FIG. 12 can have the same configurations as the circuit WDD, the circuit WLD, the circuit VLD, the activation function circuit ACTV, and the learning circuit LEC described in Embodiment 1. Therefore, the description of the arithmetic circuit 100 in Embodiment 1 is referred to for the circuit WDD, the circuit WLD, the circuit VLD, the activation function circuit ACTV, and the learning circuit LEC.

As described above, part of the arithmetic circuit 200 can have the same structure as part of the arithmetic circuit 100; thus, the content overlapping with the description of the arithmetic circuit 100 in Embodiment 1 is omitted in the following description of the arithmetic circuit 200.
<<Current Supply Circuit IS>>

Figure 13:
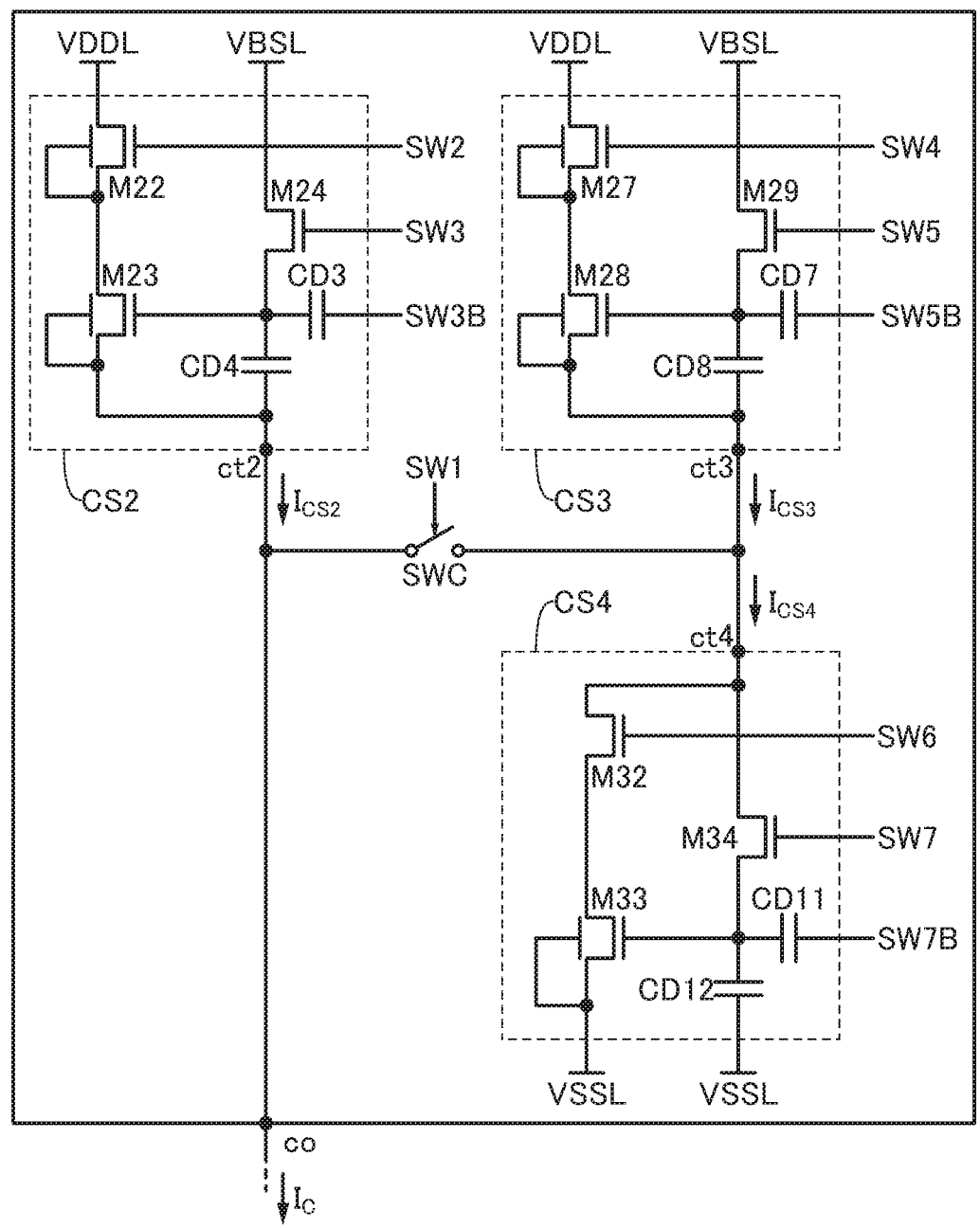
FIG. 13 A circuit diagram illustrating an example of a current supply circuit included in a semiconductor device.

FIG. 13 illustrates a configuration example of the current supply circuit IS without the current mirror circuit CM, which is different from those in FIGS. 3(A) and 3(B) and FIG. 4.

The current supply circuit IS illustrated in FIG. 13 includes a circuit CS2, a circuit CS3, a circuit CS4, and a switch SWC. The switch SWC can be an n-channel transistor, for example.

In the current supply circuit IS in FIG. 13, the circuit CS2 includes a transistor M22 to a transistor M24, a capacitor CD3, a capacitor CD4, and a terminal ct2; the circuit CS3 includes a transistor M27 to a transistor M29, a capacitor CD7, a capacitor CD8, and a terminal ct3; and the circuit CS4 includes a transistor M32 to a transistor M34, a capacitor CD11, a capacitor CD12, and a terminal ct4. Note that the transistors included in the current supply circuit IS illustrated in FIG. 13 are n-channel transistors. Thus, the current supply circuit IS can be configured as a single-polarity circuit.

The transistors included in the current supply circuit IS illustrated in FIG. 13 are preferably OS transistors, like the transistor Tr1 and the transistor Tr2 described in Embodiment 1. The description of the transistor Tr1 is referred to for the OS transistor. Alternatively, the transistors included in the current supply circuit IS in FIG. 13 may be Si transistors.

The circuit CS2 and the circuit CS3 are each a constant current circuit that generates a current output to the terminal co. The circuit CS2 has a function of generating a current $I_{CS2}$ on the basis of potentials held in a first terminal of the capacitor CD3 and a first terminal of the capacitor CD4, and the circuit CS3 has a function of generating a current $I_{CS3}$ on the basis of potentials held in a first terminal of the capacitor CD7 and a first terminal of the capacitor CD8.

The circuit CS4 is a current sink circuit that draws a current based on a specific potential from the sum of the current $I_{CS2}$ and the current $I_{CS3}$. The circuit CS4 has a function of drawing a current $I_{CS4}$ through a source and a drain of each of the transistor M32 and the transistor M33 on the basis of potentials held in a first terminal of the capacitor CD11 and a first terminal of the capacitor CD12.

In the circuit CS2, a first terminal of the transistor M22 is electrically connected to the wiring VDDL, a second terminal and a back gate of the transistor M22 are electrically connected to a first terminal of the transistor M23, and a gate of the transistor M22 is electrically connected to a wiring SW2. A second terminal and a back gate of the transistor M23 are electrically connected to a second terminal of the capacitor CD4 and the terminal ct2, and a gate of the transistor M23 is electrically connected to a first terminal of the transistor M24, the first terminal of the capacitor CD3, and the first terminal of the capacitor CD4. A second terminal of the transistor M24 is electrically connected to a wiring VBSL, a gate of the transistor M24 is electrically connected to a wiring SW3, and a second terminal of the capacitor CD3 is electrically connected to a wiring SW3B.

In the circuit CS3, a first terminal of the transistor M27 is electrically connected to the wiring VDDL, a second terminal and a back gate of the transistor M27 are electrically connected to a first terminal of the transistor M28, and a gate of the transistor M27 is electrically connected to a wiring SW4. A second terminal and a back gate of the transistor M28 are electrically connected to a second terminal of the capacitor CD8 and the terminal ct3, and a gate of the transistor M28 is electrically connected to a first terminal of the transistor M29, the first terminal of the capacitor CD7, and the first terminal of the capacitor CD8. A second terminal of the transistor M29 is electrically connected to the wiring VBSL, a gate of the transistor M29 is electrically connected to a wiring SW5, and a second terminal of the capacitor CD7 is electrically connected to a wiring SW5B.

The wiring VBSL is a wiring for supplying a given potential to a component to which the wiring VBSL is electrically connected. The potential is preferably higher than the potential VSS.

In the circuit CS4, the first terminal of the transistor M32 is electrically connected to a first terminal of the transistor M34 and the terminal ct4, the second terminal of the transistor M32 is electrically connected to the first terminal of the transistor M33, and a gate of the transistor M32 is electrically connected to a wiring SW6. The second terminal of the transistor M33 is electrically connected to the wiring VSSL, a back gate of the transistor M33 is electrically connected to the wiring VSSL, and a gate of the transistor M33 is electrically connected to a second terminal of the transistor M34, the first terminal of the capacitor CD11, and the first terminal of the capacitor CD12. A gate of the transistor M34 is electrically connected to a wiring SW7, a second terminal of the capacitor CD11 is electrically connected to a wiring SW7B, and a second terminal of the capacitor CD12 is electrically connected to the wiring VSSL.

A first terminal of the switch SWC is electrically connected to the terminal ct2 and the terminal co; a second terminal of the switch SWC is electrically connected to the terminal ct3 and the terminal ct4; and a control terminal for switching the off state and on state of the switch SWC is electrically connected to the wiring SW1.

The wiring SW1 to the wiring SW7 are each a wiring to which one of a low-level potential and a high-level potential is supplied. The wiring SW3B is a wiring to which an inverted signal of a signal input to the wiring SW3 is input, the wiring SW5B is a wiring to which an inverted signal of a signal input to the wiring SW5 is input, and the wiring SW7B is a wiring to which an inverted signal of a signal input to the wiring SW7 is input.

Operation Example

Next, an operation example of the arithmetic circuit 200 is described.

Here, the operation of the arithmetic circuit 200 of obtaining arithmetic result data from a potential corresponding to the current $I_\alpha$ and updating the first data is described. Therefore, as the activation function circuit ACTV in this operation example, the activation function circuit ACTV illustrated in FIG. 5(A) is used for the description.

Figure 14:
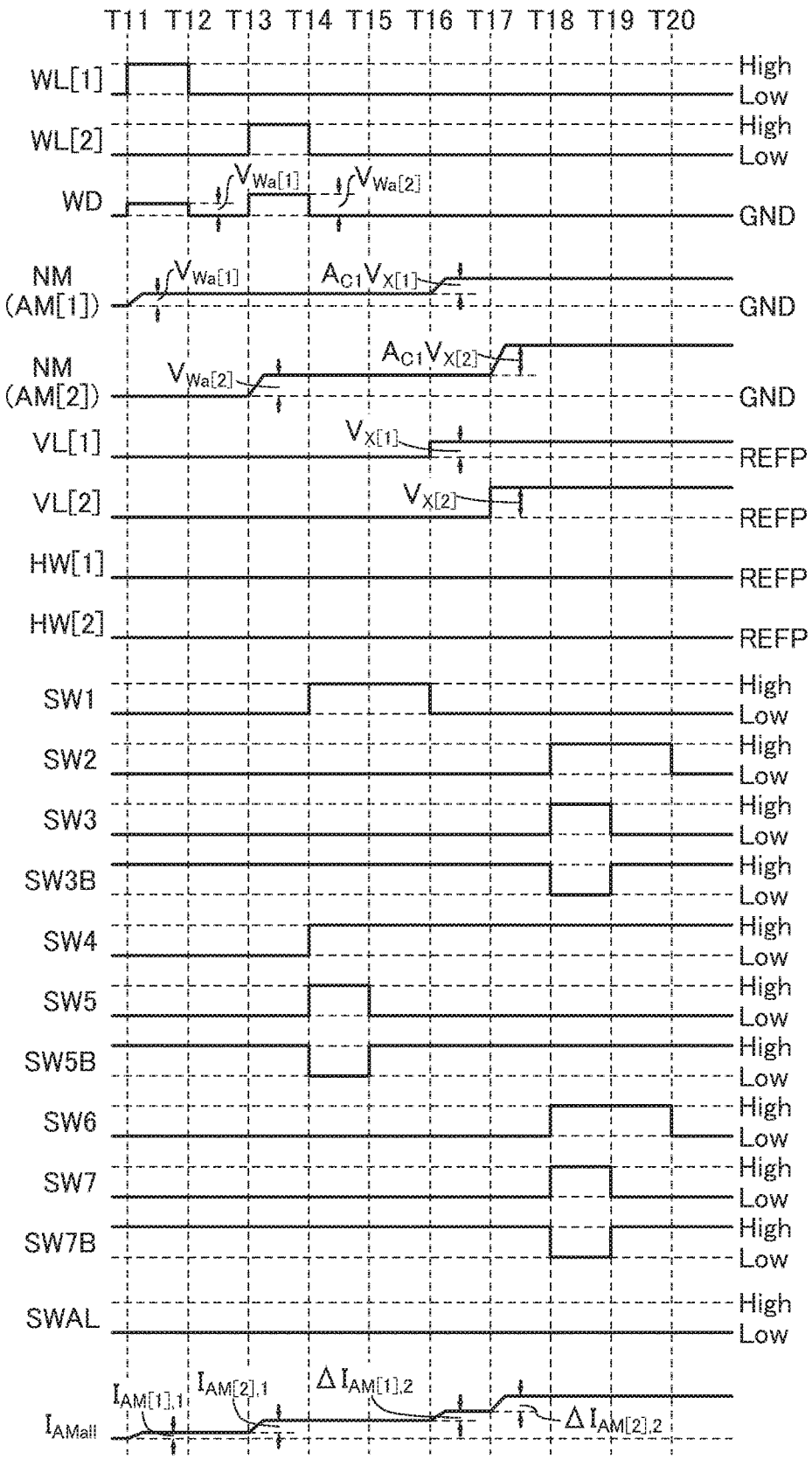
FIG. 14 A timing chart illustrating an operation example of a semiconductor device.
Figure 15:
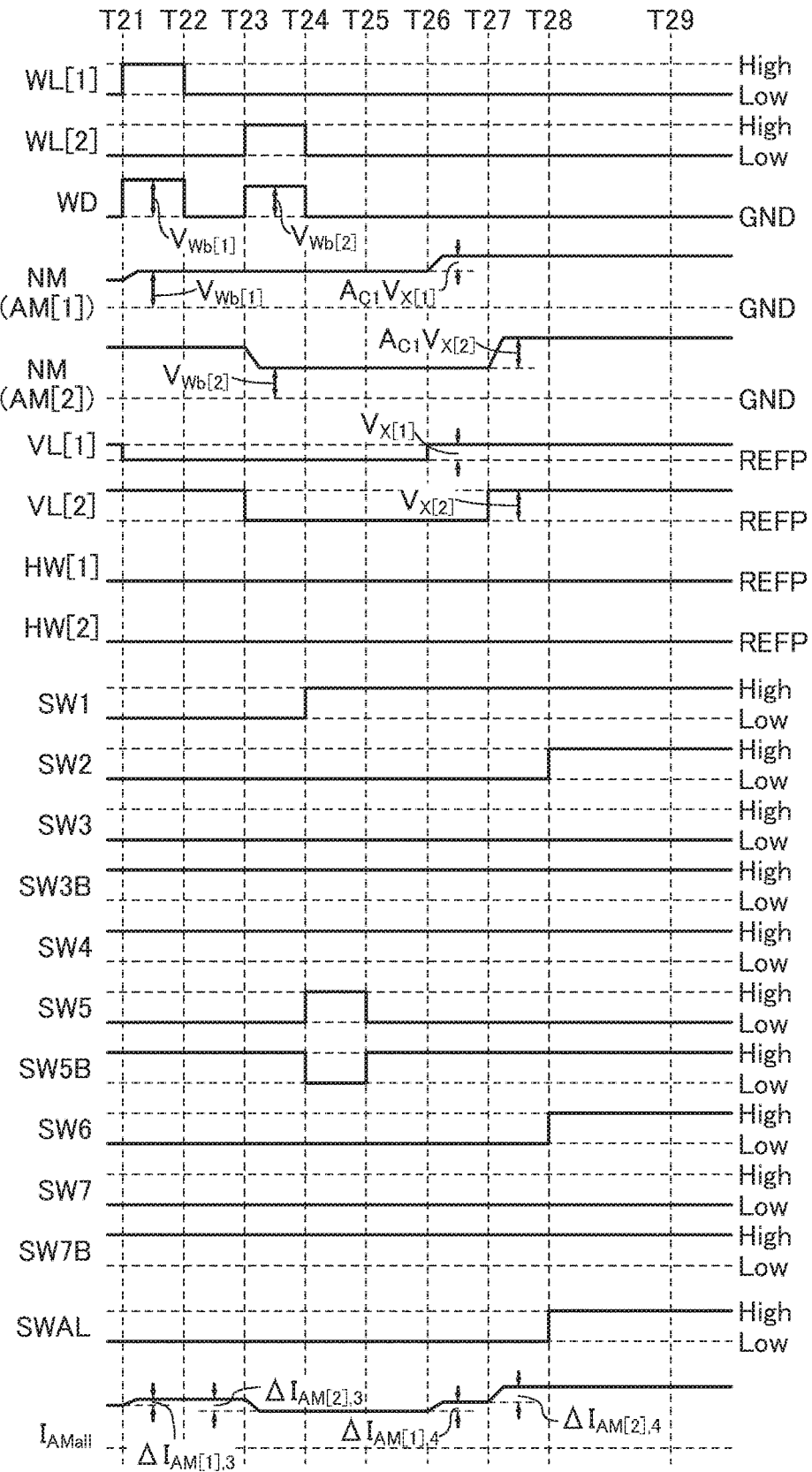
FIG. 15 A timing chart illustrating an operation example of a semiconductor device.
Figure 16:
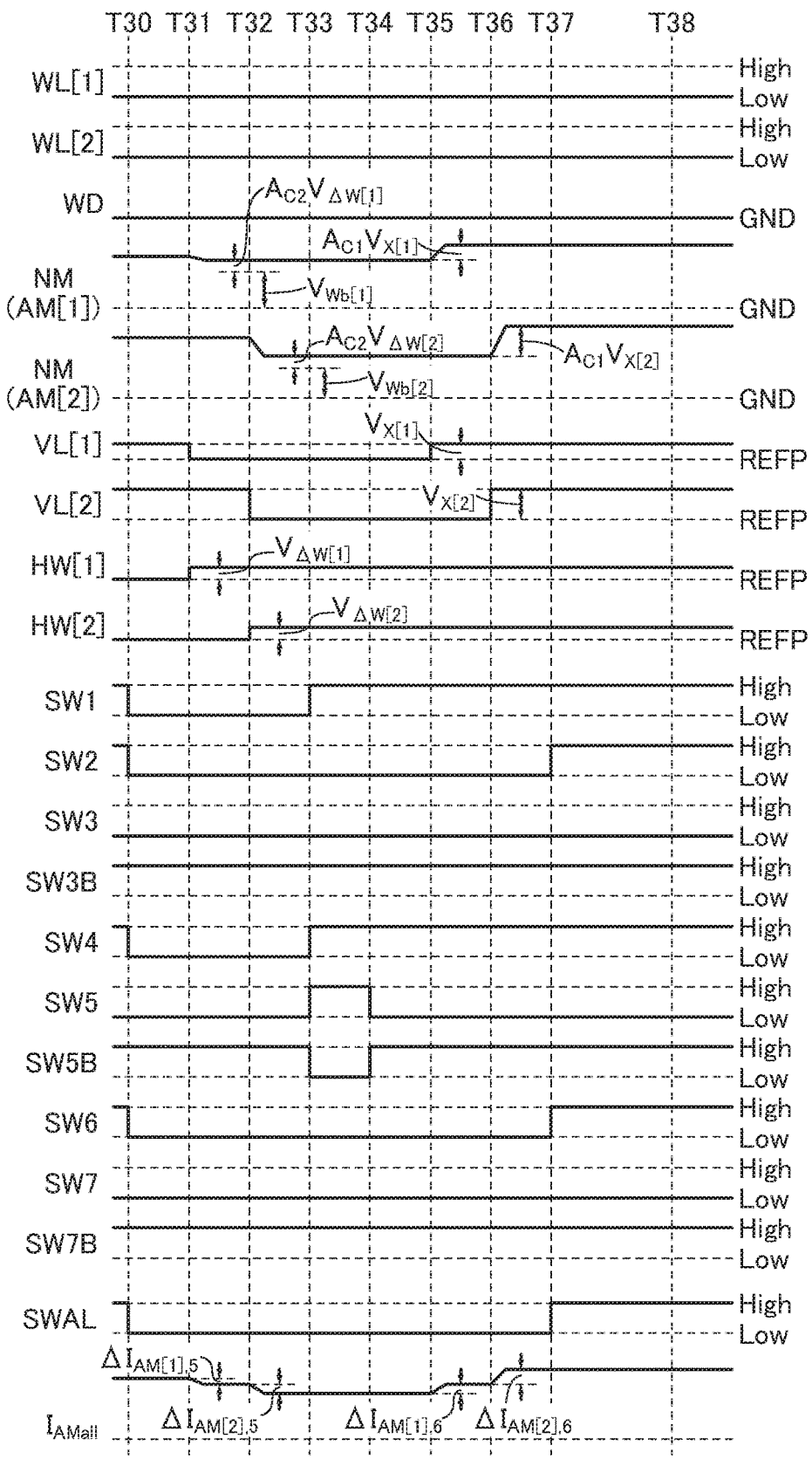
FIG. 16 A timing chart illustrating an operation example of a semiconductor device.

FIG. 14 to FIG. 16 are timing charts of an operation example of the arithmetic circuit 200. The timing charts in FIG. 14 to FIG. 16 show changes in potentials of the wiring WL[1], the wiring WL[2], the wiring WD, the node NM(AM[1]), the node NM(AM[2]), the wiring VL[1], the wiring VL[2], the wiring HW[1], the wiring HW[2], the wiring SW1 to the wiring SW7, the wiring SW3B, the wiring SW5B, the wiring SW7B, and the wiring SWAL between Time T11 and Time T38, and show a change in the amount of current $I_{AMall}$. The current $I_{AMall}$ represents the total sum of currents that flow from the wiring BL to the terminals m2 of the memory cell AM[1] and the memory cell AM[2] in the memory cell array MCA. Specifically, the timing chart in FIG. 14 shows an operation example of the arithmetic circuit 200 at and around Time T11 to Time T20; the timing chart in FIG. 15 shows an operation example of the arithmetic circuit 200 at and around Time T21 to Time T29; and the timing chart in FIG. 16 shows an operation example of the arithmetic circuit 200 at and around Time T30 to Time T38.

Note that in this operation example, an n-channel transistor is used as the switch SWA of the activation function circuit ACTV in FIG. 5(A). Accordingly, the switch SWA is turned on when the wiring SWAL is at a high-level potential (denoted as High in FIG. 14 to FIG. 16), and is turned off when the wiring SWAL is at a low-level potential (denoted as Low in FIG. 14 to FIG. 16). In the following description of the operation example, a low-level potential is applied to the wiring SWAL unless otherwise specified.

In this operation example, an n-channel transistor is used as the switch SWC of the current supply circuit IS illustrated in FIG. 13. Accordingly, the switch SWC is turned on when the high-level potential is applied to the wiring SW1, and the switch SWC is turned off when the low-level potential is applied to the wiring SW1.

<<From Time T11 to Time T12>>

In the period from Time T11 to Time T12, the high-level potential is applied to the wiring WL[1], and the low-level potential is applied to the wiring WL[2]. A potential higher than the ground potential (denoted as GND in FIG. 14 to FIG. 16) by $V_{wa[1]}$ is applied to the wiring WD. The reference potential (denoted by REFP in FIG. 14 to FIG. 16 and sometimes referred to as the initial potential in this specification and the like) is applied to the wiring VL[1], the wiring VL[2], the wiring HW[1], and the wiring HW[2].

Note that at this time, with $V_{w[1]}$ as a potential corresponding to one of a plurality of pieces of first data, $V_{wa[1]}$ and $V_{wb[1]}$ that satisfy $V_{w[1]}=V_{wb[1]}-V_{wa[1]}$ are defined. Moreover, $V_{w[1]}$ can be either a positive potential or negative potential.

At this time, the high-level potential is applied to the gate of the transistor Tr11 in the memory cell AM[1], whereby the transistor Tr1 in the memory cell AM[1] is turned on. Thus, in the memory cell AM[1], electrical continuity is established between the wiring WD and the node NM(AM[1]), so that the potential of the node NM(AM[1]) becomes $V_{wa[1]}$.

Here, the current flowing from the second terminal to the first terminal of the transistor Tr2 in the memory cell AM[1] is considered. When the current flowing from the wiring BL to the first terminal of the transistor Tr2 in the memory cell AM[1] through its second terminal is $I_{AM[1],1}$, $I_{AM[1],1}$ can be expressed by the following formula.

[Formula 35]

$$I_{AM[1],1}=k(V_{wa[1]}-V_{th})^2 \qquad (C1)$$

Note that k is a constant determined by the channel length, the channel width, the mobility, the capacitance of the gate insulating film, and the like of the transistor Tr2. Furthermore, $V_{th}$ is the threshold voltage of the transistor Tr2.

Since the low-level potential is applied to the gate of the transistor Tr1 in the memory cell AM[2], the transistor Tr1 in the memory cell AM[2] is turned off. Thus, a potential is not written to the node NM(AM[2]).

<<From Time T12 to Time T13>>

In the period from Time T12 to Time T13, the low-level potential is applied to the wiring WL[1]. At this time, the low-level potential is applied to the gate of the transistor Tr1 in the memory cell AM[1], so that the transistor Tr1 in the memory cell AM[1] is turned off.

In addition, the low-level potential is continuously applied to the wiring WL[2] before Time T12. Thus, the transistor Tr1 in the memory cell AM[2] is off before Time T12.

Since the transistors Tr1 in the memory cell AM[1] and the memory cell AM[2] are off as described above, the potentials of the node NM(AM[1]) and the node NM(AM[2]) are held between Time T12 and Time T13.

In the period from Time T12 to Time T13, the ground potential is applied to the wiring WD. Since the transistors Tr1 in the memory cell AM[1] and the memory cell AM[2] are off, the potentials held in the node NM(AM[1]) and the node NM(AM[2]) are not rewritten by application of the potential from the wiring WD.

<<From Time T13 to Time T14>>

In the period from Time T13 to Time T14, the low-level potential is applied to the wiring WL[1], and the high-level potential is applied to the wiring WL[2]. A potential higher than the ground potential by $V_{wa[2]}$ is applied to the wiring WD. The reference potential is continuously applied to the wiring VL[1], the wiring VL[2], the wiring HW[1], and the wiring HW[2] from Time T12.

Note that at this time, with $V_{W[2]}$ as a potential that corresponds to one of a plurality of pieces of first data and is different from the potential $V_{W[1]}$, $V_{Wa[2]}$ and $V_{Wb[2]}$ that satisfy $V_{W[2]} = V_{Wb[2]} - V_{Wa[2]}$ are defined. Moreover, $V_{W[2]}$ can be either a positive potential or negative potential.

At this time, the high-level potential is applied to the gate of the transistor Tr1 in the memory cell AM[2], whereby the transistor Tr1 in the memory cell AM[2] is turned on. Thus, in the memory cell AM[2], electrical continuity is established between the wiring WD and the node NM(AM[2]), so that the potential of the node NM(AM[2]) becomes $V_{Wa[2]}$.

Here, the current flowing from the second terminal to the first terminal of the transistor Tr2 in the memory cell AM[2] is considered. When the current flowing from the wiring BL to the first terminal of the transistor Tr2 in the memory cell AM[2] through its second terminal is $I_{AM[2],1}$, $I_{AM[2],1}$ can be expressed by the following formula.

[Formula 36]

$$I_{AM[2],1} = k(V_{Wa[2]} - V_{th})^2 \quad (C2)$$

In the current supply circuit IS illustrated in FIG. 13, between Time T11 and Time T14, the low-level potential is applied to the wiring SW1, the low-level potential is applied to the wiring SW2, the low-level potential is applied to the wiring SW3, the low-level potential is applied to the wiring SW4, the low-level potential is applied to the wiring SW5, the low-level potential is applied to the wiring SW6, and the low-level potential is applied to the wiring SW7. In addition, the high-level potential is applied to the wiring SW3B, the high-level potential is applied to the wiring SW5B, and the high-level potential is applied to the wiring SW7B. Accordingly, in the circuit CS2, the transistor M22 is off; hence, no current flows from the wiring VDDL through the transistor M22. In the circuit CS3, the transistor M27 is off, so that no current flows from the wiring VDDL through the transistor M27. In the circuit CS4, the transistor M32 is off, so that no current flows to the wiring VSSL through the transistor M32. In other words, the current supply circuit IS does not operate in the period from Time T11 to Time T14.
<<From Time T14 to Time T16>>

In the current supply circuit IS in FIG. 13, between Time T14 and Time T15, the high-level potential is applied to the wiring SW1, the low-level potential is applied to the wiring SW2, the low-level potential is applied to the wiring SW3, the high-level potential is applied to the wiring SW4, the high-level potential is applied to the wiring SW5, the low-level potential is applied to the wiring SW6, and the low-level potential is applied to the wiring SW7. In addition, the high-level potential is applied to the wiring SW3B, the low-level potential is applied to the wiring SW5B, and the high-level potential is applied to the wiring SW7B.

At this time, the switch SWC is turned on.

In the circuit CS2, the transistor M22 is turned off; thus, no current flows from the wiring VDDL to the terminal ct2 through the source and the drain of the transistor M22. In other words, the circuit CS2 does not output a constant current to the terminal ct2 in the period from Time T14 to Time T15.

In the circuit CS4, the transistor M32 is turned off; thus, no current flows between the source and the drain of the transistor M32. In other words, the circuit CS4 does not draw a constant current from the terminal ct4 in the period from Time T14 to Time 15.

In the circuit CS3, the transistor M27 is turned on and the transistor M29 is turned on. At this time, a given potential is applied from the wiring VBSL to the first terminal of the capacitor CD7 and the first terminal of the capacitor CD8 through the source and the drain of the transistor M29. Thus, the circuit CS3 outputs a current corresponding to the potential from the wiring VDDL to the terminal ct3 through the source and the drain of each of the transistor M27 and the transistor M28. Hereinafter, the current is referred to as $I_{1st}$.

The total sum $I_{C,1}$ of currents flowing through the terminals m2 of the memory cell AM[1] and the memory cell AM[2] can be expressed by the following formula.

[Formula 37]

$$I_{C,1} = I_{AM[1],1} + I_{AM[2],1} \quad (C3)$$

Here, the potential of the wiring VBSL is changed so as to satisfy the following formula. The potential at this time is referred to as a first potential.

[Formula 38]

$$I_{C,1} = I_{1st} \quad (C4)$$

Next, in the period from Time T15 to Time T16, the low-level potential is applied to the wiring SW5. The high-level potential is applied to the wiring SW5B. Note that the wiring SW1 to the wiring SW4, the wiring SW6, the wiring SW7, the wiring SW3B, and the wiring SW7B are continuously supplied with the respective potentials in the period from Time T14 to Time T15.

In the circuit CS3, since the low-level potential is applied to the wiring SW5 in the period from Time T15 to Time T16, the transistor M29 is turned off, and the first potential is held in the first terminal of the capacitor CD7 and the first terminal of the capacitor CD8. Furthermore, since the high-level potential is applied to the wiring SW4, the transistor M27 is turned on, and the circuit CS3 outputs the current $I_{1st}$ corresponding to the first potential to the terminal ct3.
<<From Time T16 to Time T17>>

In the period from Time T16 to Time T17, a potential higher than the reference potential by $V_{X[1]}$ is applied to the wiring VL[1]. At this time, the potential $V_{X[1]}$ is applied to the second terminal of the capacitor C1 in the memory cell AM[1], so that the potential of the gate of the transistor Tr2 increases.

The potential $V_{X[1]}$ is a potential corresponding to one of a plurality of pieces of second data.

Note that the amount of increase in the potential of the gate of the transistor Tr2 corresponds to a potential obtained by multiplying a change in the potential of the wiring VL[1] by a capacitive coupling coefficient depending on the capacitor C1 and the circuit configuration therearound. For example, the capacitive coupling coefficient can be calculated using the capacitance of the capacitor C1, the capacitance of the capacitor C2, the gate capacitance of the transistor Tr2, the parasitic capacitance, and the like. In this operation example, the capacitive coupling coefficient due to the capacitor C1 is described as $A_{C1}$ as an example.

Since the capacitive coupling coefficient is $A_{C1}$, when the potential $V_{X[1]}$ is applied to the second terminal of the capacitor C1 in the memory cell AM[1], the potential of the node NM(AM[1]) increases by $A_{C1}V_{X[1]}$.

Here, the current flowing from the second terminal to the first terminal of the transistor Tr2 in the memory cell AM[1] is considered. When the current flowing from the wiring BL to the first terminal of the transistor Tr2 in the memory cell AM[1] through its second terminal is $I_{AM[1],2}$, $I_{AM[1],2}$ can be expressed by the following formula.

[Formula 39]

$$I_{AM[1],2} = k(V_{Wa[1]} + A_{C1}V_{X[1]} - V_{th})^2 \quad (C5)$$

In other words, by application of the potential $V_{X[1]}$ to the wiring VL[1], the current flowing from the wiring BL to the first terminal of the transistor Tr2 in the memory cell AM[1] through its second terminal increases by $I_{AM[1],2} - I_{AM[1],1}$ (denoted by $\Delta I_{AM[1],2}$ in FIG. 14).

Since the low-level potential is applied to the wiring SW1 in the current supply circuit IS, the switch SWC is turned off, and the current $I_{1st}$ generated in the circuit CS3 does not flow through the terminal co.

<<From Time T17 to Time T18>>

In the period from Time T17 to Time T18, a potential higher than the reference potential by $V_{X[2]}$ is applied to the wiring VL[2]. At this time, the potential $V_{X[2]}$ is applied to the second terminal of the capacitor C1 in the memory cell AM[2]. Thus, the potential of the gate of the transistor Tr2 in the memory cell AM[2] increases.

Note that the potential $V_{X[2]}$ is a potential corresponding to another one of the plurality of pieces of second data, which is different from the potential $V_{X[1]}$.

Note that the wiring VL[1] is continuously supplied with the potential higher than the reference potential by $V_{X[1]}$ before Time T17.

For a change in the potential of the retention node in the memory cell AM[2], the description is similarly made with the capacitive coupling coefficient of each memory cell as $A_{C1}$. Since the capacitive coupling coefficient is $A_{C1}$, when the potential $V_{X[2]}$ is applied to the second terminal of the capacitor C1 in the memory cell AM[2], the potential of the node NM(AM[2]) increases by $A_{C1}V_{X[2]}$.

Here, the current flowing from the second terminal to the first terminal of the transistor Tr2 in the memory cell AM[2] is considered. When the current flowing from the wiring BL to the first terminal of the transistor Tr2 in the memory cell AM[2] through its second terminal is $I_{AM[2],2}$, $I_{AM[2],2}$ can be expressed by the following formula.

[Formula 40]

$$I_{AM[2],2} = k(V_{Wa[2]} + A_{C1}V_{X[2]} - V_{th})^2 \quad (C6)$$

In other words, by application of the potential $V_{X[2]}$ to the wiring VL[2], the current flowing from the wiring BL to the first terminal of the transistor Tr2 in the memory cell AM[2] through its second terminal increases by $I_{AM[2],2} - I_{AM[2],1}$ (denoted by $\Delta I_{AM[2],2}$ in FIG. 14).

<<From Time T18 to Time T21>>

In the current supply circuit IS illustrated in FIG. 13, between Time T18 and Time T19, the low-level potential is applied to the wiring SW1, the high-level potential is applied to the wiring SW2, the high-level potential is applied to the wiring SW3, the high-level potential is applied to the wiring SW4, the low-level potential is applied to the wiring SW5, the high-level potential is applied to the wiring SW6, and the high-level potential is applied to the wiring SW7. In addition, the low-level potential is applied to the wiring SW3B, the high-level potential is applied to the wiring SW5B, and the low-level potential is applied to the wiring SW7B.

At this time, the switch SWC is turned off.

In the circuit CS3, since the potentials of the wiring SW4, the wiring SW5, and the wiring SW5B are not changed from time T15, the first voltage is continuously held in the first terminal of the capacitor CD7 and the first terminal of the capacitor CD8 in the circuit CS3. Furthermore, since the transistor M27 is on, the circuit CS3 outputs $I_{1st}$ to the terminal ct3.

In the circuit CS4, since the transistor M32 and the transistor M34 are turned on, electrical continuity is established between the first terminal of the transistor M33 and the gate of the transistor M33. That is, the transistor M33 gets a diode-connected configuration. Since the switch SWC is off, the current $I_{1st}$ from the terminal ct3 of the circuit CS3 flows to the wiring VSSL through the terminal ct4 of the circuit CS4. At this time, a potential corresponding to the current $I_{1st}$ is held in the first terminal of the capacitor CD11 and the first terminal of the capacitor CD12. The potential at this time is referred to as a third potential.

In the circuit CS2, the transistor M22 is turned on and the transistor M24 is turned on. At this time, a given potential is applied from the wiring VBSL to the first terminal of the capacitor CD7 and the first terminal of the capacitor CD8 through the source and the drain of the transistor M24. Thus, the circuit CS2 outputs a current corresponding to the potential from the wiring VDDL to the terminal ct2 through the source and the drain of each of the transistor M22 and the transistor M23. Hereinafter, the current is referred to as $I_{2nd}$.

The total sum $I_{C,2}$ of currents flowing through the terminals m2 of the memory cell AM[1] and the memory cell AM[2] can be expressed by the following formula.

[Formula 41]

$$I_{C,2} = I_{AM[1],2} + I_{AM[2],2} \quad (C7)$$

Here, the potential of the wiring VBSL is changed so as to satisfy the following formula. The potential at this time is referred to as a second potential.

[Formula 42]

$$I_{C,2} = I_{2nd} \quad (C8)$$

Next, in the period from Time T19 to Time T20, the low-level potential is applied to the wiring SW3, and the low-level potential is applied to the wiring SW7. The high-level potential is applied to the wiring SW3B, and the high-level potential is applied to the wiring SW7B. Note that the wiring SW1, the wiring SW2, the wiring SW4 to the wiring SW6, and the wiring SW5B are continuously supplied with the respective potentials in the period from Time T18 to Time T19.

In the circuit CS2, since the low-level potential is applied to the wiring SW3 in the period from Time T19 to Time T20, the transistor M24 is turned off, and the second potential is held in the first terminal of the capacitor CD3 and the first terminal of the capacitor CD4. Furthermore, since the high-level potential is applied to the wiring SW3, the transistor M22 is turned on, and the circuit CS2 outputs the current $I_{2nd}$ corresponding to the second potential to the terminal ct2.

In the circuit CS4, since the low-level potential is applied to the wiring SW7 in the period from Time T19 to Time T20, the transistor M34 is turned off, and the third potential is held in the first terminal of the capacitor CD11 and the first terminal of the capacitor CD12. Furthermore, since the high-level potential is applied to the wiring SW6, the transistor M32 is turned on, and the circuit CS4 draws the current $I_{1st}$ corresponding to the third potential through the terminal ct4.

In the period from Time T20 to Time T21, the low-level potential is applied to the wiring SW2, and the low-level potential is applied to the wiring SW6. Note that the wiring SW1, the wiring SW3 to the wiring SW5, the wiring SW7, the wiring SW3B, the wiring SW5B, and the wiring SW7B are continuously supplied with the respective potentials in the period from Time T20 to Time T21.

In the circuit CS2, the low-level potential is applied to the wiring SW2 in the period from Time T20 to Time T21; thus, the transistor M22 is turned off, and the current $I_{2nd}$ is not output to the terminal ct2.

In the circuit CS4, the low-level potential is applied to the wiring SW6 in the period from Time T20 to Time T21; hence, the transistor M32 is turned off, and the current $I_{1st}$ is not drawn through the terminal ct4.

<<From Time T21 to Time T22>>

In the period from Time T21 to Time T22, the high-level potential is applied to the wiring WL[1], and the low-level potential is applied to the wiring WL[2]. A potential higher than the ground potential by $V_{Wb[i]}$ is applied to the wiring WD. The reference potential is applied to the wiring VL[1], the wiring VL[2], the wiring HW[1], and the wiring HW[2].

At this time, the high-level potential is applied to the gate of the transistor Tr11 in the memory cell AM[1], whereby the transistor Tr1 in the memory cell AM[1] is turned on. Thus, in the memory cell AM[1], electrical continuity is established between the wiring WD and the node NM(AM[1]), so that the potential of the node NM(AM[1]) becomes $V_{Wb[1]}$.

Here, the current flowing from the second terminal to the first terminal of the transistor Tr2 in the memory cell AM[1] is considered. When the current flowing from the wiring BL to the first terminal of the transistor Tr2 in the memory cell AM[1] through its second terminal is $I_{AM[1],3}$, $I_{AM[1],3}$ can be expressed by the following formula.

[Formula 43]

$$I_{AM[1],3}=k(V_{Wb[1]}-V_{th})^2 \quad (C9)$$

At this time, the current flowing from the wiring BL to the first terminal of the transistor Tr2 in the memory cell AM[1] through its second terminal changes by $I_{AM[1],3}-I_{AM[1],2}$ (which is denoted as $\Delta I_{AM[1],3}$ in FIG. 15 and indicates the current increase).

<<From Time T22 to Time T23>>

In the period from Time T22 to Time T23, the low-level potential is applied to the wiring WL[1]. At this time, the low-level potential is applied to the gate of the transistor Tr1 in the memory cell AM[1], so that the transistor Tr1 in the memory cell AM[1] is turned off.

The description of the operation between Time T12 and Time T13 is referred to for the operation of the memory cell AM[1] and the memory cell AM[2] between Time T22 and Time T23.

<<From Time T23 to Time T24>>

In the period from Time T23 to Time T24, the low-level potential is applied to the wiring WL[1], and the high-level potential is applied to the wiring WL[2]. A potential higher than the ground potential by $V_{Wb[2]}$ is applied to the wiring WD. The reference potential is continuously applied to the wiring VL[1], the wiring VL[2], the wiring HW[1], and the wiring HW[2] from Time T22.

At this time, the high-level potential is applied to the gate of the transistor Tr1 in the memory cell AM[2], whereby the transistor Tr1 in the memory cell AM[2] is turned on. Thus, in the memory cell AM[2], electrical continuity is established between the wiring WD and the node NM(AM[2]), so that the potential of the node NM(AM[2]) becomes $V_{Wb[2]}$.

Here, the current flowing from the second terminal to the first terminal of the transistor Tr2 in the memory cell AM[2] is considered. When the current flowing from the wiring BL to the first terminal of the transistor Tr2 in the memory cell AM[2] through its second terminal is $I_{AM[2],2}$, $I_{AM[2],2}$ can be expressed by the following formula.

[Formula 44]

$$I_{AM[2],3}=k(V_{Wb[2]}-V_{th})^2 \quad (C10)$$

At this time, the current flowing from the wiring BL to the first terminal of the transistor Tr2 in the memory cell AM[2] through its second terminal changes by $I_{AM[2],3}-I_{AM[2],2}$ (which is denoted as $\Delta I_{AM[2],3}$ in FIG. 15 and indicates the current decrease).

<<From Time T24 to Time T26>>

In the current supply circuit IS illustrated in FIG. 13, between Time T24 and Time T25, the high-level potential is applied to the wiring SW1, the low-level potential is applied to the wiring SW2, the low-level potential is applied to the wiring SW3, the high-level potential is applied to the wiring SW4, the high-level potential is applied to the wiring SW5, the low-level potential is applied to the wiring SW6, and the low-level potential is applied to the wiring SW7. In addition, the high-level potential is applied to the wiring SW3B, the low-level potential is applied to the wiring SW5B, and the high-level potential is applied to the wiring SW7B.

At this time, the switch SWC is turned on.

In the circuit CS2, the transistor M22 is turned off, so that the current $I_{2nd}$ is not output to the terminal ct2. Since the transistor M24 is off from Time T20, the second potential is continuously held in the first terminal of the capacitor CD3 and the first terminal of the capacitor CD4.

In the circuit CS4, the transistor M32 is turned off, so that the current $I_{1st}$ is not drawn through the terminal ct4. Since the transistor M34 is off from Time T20, the third potential is continuously held in the first terminal of the capacitor CD11 and the first terminal of the capacitor CD12.

In the circuit CS3, the transistor M27 is turned on and the transistor M29 is turned on. At this time, a given potential is applied from the wiring VBSL to the first terminal of the capacitor CD7 and the first terminal of the capacitor CD8 through the source and the drain of the transistor M29. Thus, the circuit CS3 outputs a current corresponding to the potential from the wiring VDDL through the source and the drain of each of the transistor M27 and the transistor M28. Hereinafter, the current is referred to as $I_{3rd}$.

The total sum $I_{C,3}$ of currents flowing through the terminals m2 of the memory cell AM[1] and the memory cell AM[2] can be expressed by the following formula.

[Formula 45]

$$I_{C,3}=I_{AM[1,3]}+I_{AM[2],3} \quad (C11)$$

Here, the potential of the wiring VBSL is changed so as to satisfy the following formula. The potential at this time is referred to as a fourth potential.

[Formula 46]

$$I_{C,3}=I_{3rd} \quad (C12)$$

Next, in the period from Time T25 to Time T26, the low-level potential is applied to the wiring SW5. The high-level potential is applied to the wiring SW5B. Note that the wiring SW1 to the wiring SW4, the wiring SW6, the wiring SW7, the wiring SW3B, and the wiring SW7B are continuously supplied with the respective potentials in the period from Time T24 to Time T25.

In the circuit CS3, since the low-level potential is applied to the wiring SW5 in the period from Time T25 to Time T26, the fourth potential is held in the first terminal of the capacitor CD7 and the first terminal of the capacitor CD8. Furthermore, since the high-level potential is applied to the wiring SW4, the transistor M27 is turned on, and the circuit CS3 outputs the current $I_{3rd}$ corresponding to the fourth potential to the terminal ct3.

<<From Time T26 to Time T27>>

In the period from Time T26 to Time T27, the potential higher than the reference potential by $V_{x[1]}$ is applied again to the wiring VL[1]. At this time, the potential $V_{x[1]}$ is applied to the second terminal of the capacitor C1 in the memory cell AM[1], so that the potential of the gate of the transistor Tr2 increases by $A_{C1}V_{x[1]}$.

The description of the operation between Time T16 and Time T17 is referred to for the operation of the memory cell AM[1] between Time T26 and Time T27.

Here, the current flowing from the second terminal to the first terminal of the transistor Tr2 in the memory cell AM[1] is considered. When the current flowing from the wiring BL to the first terminal of the transistor Tr2 in the memory cell AM[1] through its second terminal is $I_{AM[1],4}$, $I_{AM[1],4}$ can be expressed by the following formula.

[Formula 47]

$$I_{AM[1],4} = k(V_{Wb[1]} + A_{C1}V_{x[1]} - V_{th})^2 \quad (C13)$$

In other words, by application of the potential $V_{x[1]}$ to the wiring VL[1], the current flowing from the wiring BL to the first terminal of the transistor Tr2 in the memory cell AM[1] through its second terminal increases by $I_{AM[1],4} - I_{AM[1],3}$ (denoted by $\Delta I_{AM[1],4}$ in FIG. 15).

<<From Time T27 to Time T28>>

In the period from Time T27 to Time T28, the potential higher than the reference potential by $V_{x[2]}$ is applied again to the wiring VL[2]. At this time, the potential $V_{x[2]}$ is applied to the second terminal of the capacitor C1 in the memory cell AM[2]. Thus, the potential of the gate of the transistor Tr2 in the memory cell AM[2] increases by $A_{C1}V_{x[2]}$.

The description of the operation between Time T17 and Time T18 is referred to for the operation of the memory cell AM[2] between Time T27 and Time T28.

Note that the wiring VL[1] is continuously supplied with the potential higher than the reference potential by $V_{x[1]}$ before Time T17.

Here, the current flowing from the second terminal to the first terminal of the transistor Tr2 in the memory cell AM[2] is considered. When the current flowing from the wiring BL to the first terminal of the transistor Tr2 in the memory cell AM[2] through its second terminal is $I_{AM[2],4}$, $I_{AM[2],4}$ can be expressed by the following formula.

[Formula 48]

$$I_{AM[2],4} = k(V_{Wb[2]} + A_{C1}V_{x[2]} - V_{th})^2 \quad (C14)$$

In other words, by application of the potential $V_{x[2]}$ to the wiring VL[2], the current flowing from the wiring BL to the first terminal of the transistor Tr2 in the memory cell AM[2] through its second terminal increases by $I_{AM[2],4} - I_{AM[2],3}$ (denoted by $\Delta I_{AM[2],4}$ in FIG. 15).

<<From Time T28 to Time T30>>

In the current supply circuit IS illustrated in FIG. 13, between Time T28 and Time T29, the high-level potential is applied to the wiring SW1, the high-level potential is applied to the wiring SW2, the low-level potential is applied to the wiring SW3, the high-level potential is applied to the wiring SW4, the low-level potential is applied to the wiring SW5, the high-level potential is applied to the wiring SW6, and the low-level potential is applied to the wiring SW7. In addition, the high-level potential is applied to the wiring SW3B, the high-level potential is applied to the wiring SW5B, and the high-level potential is applied to the wiring SW7B.

At this time, the switch SWC is turned on.

In the circuit CS2, since the wiring SW2 is electrically connected to the gate of the transistor M22, the transistor M22 is turned on. Since the second potential is held in the first terminal of the capacitor CD3 and the first terminal of the capacitor CD4, the circuit CS2 outputs the current $I_{2nd}$ corresponding to the second potential to the terminal ct2.

In the circuit CS3, since the wiring SW4 is electrically connected to the gate of the transistor M27, the transistor M27 is turned on. Since the fourth potential is held in the first terminal of the capacitor CD7 and the first terminal of the capacitor CD8, the circuit CS3 outputs the current $I_{3rd}$ corresponding to the fourth potential to the terminal ct3.

In the circuit CS4, since the wiring SW6 is electrically connected to the gate of the transistor M32, the transistor M32 is turned on. Since the third potential is held in the first terminal of the capacitor CD11 and the first terminal of the capacitor CD12, the circuit CS4 draws the current $I_{1st}$ corresponding to the third potential through the terminal ct4.

The total sum $I_{4th}$ of currents flowing through the terminals m2 of the memory cell AM[1] and the memory cell AM[2] can be expressed by the following formula.

[Formula 49]

$$I_{4th} = I_{AM[1],4} + I_{AM[2],4} \quad (C15)$$

Here, the high-level potential is applied to the wiring SWAL to turn on the switch SWA in the activation function circuit ACTV, whereby a current is supplied from the terminal ai of the activation function circuit ACTV. At this time, the current is denoted as $I_\alpha$. Here, $I_\alpha$ can be expressed by the following formula, using Formula (C1) to Formula (C15).

[Formula 50]

$$\begin{aligned} I_\alpha &= I_{4th} - I_{2nd} - I_{3rd} + I_{1st} \\ &= 2kA_{C1}(V_{W[1]}V_{x[1]} + V_{W[2]}V_{x[2]}) \end{aligned} \quad (C16)$$

As shown by Formula (C16), $I_\alpha$ flowing from the terminal ai has a value corresponding to the sum of products of the potentials that are a plurality of pieces of first data and the potentials that are a plurality of pieces of second data. That is, by calculating $I_\alpha$ output from the terminal ai of the activation function circuit ACTV, the value of product-sum of the updated first data and the second data can be obtained, and the value of the activation function based on the value can be obtained.

Although $V_{W[1]}$ was applied to the wiring VL[1] in the period from Time T16 to Time T17 and the period from Time T26 to Time T27 and $V_{W[2]}$ was applied to the wiring VL[2] in the period from Time T17 to Time T18 and the period from Time T27 to Time T28, potentials applied to the wiring VL[1] and the wiring VL[2] may be lower than the reference potential REFP. In the case where a potential lower than the reference potential REFP is applied to the wiring VL[1] and/or the wiring VL[2], the potential of the retention node of the memory cell connected to the wiring VL[1] and/or the wiring VL[2] can be lowered by capacitive coupling. Thus, multiplication of the first data and one piece of the second data, which is a negative value, can be performed in the product-sum operation.

Although the memory cell array MCA including the memory cells arranged in a matrix of two rows and one column is used in this operation example, arithmetic operation can be similarly performed in a memory cell array of three or more rows and two or more columns. For example, when a plurality of columns including memory cells having the same connection structure as the above-described memory cell AM[1] and memory cell AM[2] are provided, arithmetic operation processing for the plurality of columns can be performed at the same time. That is, when the number of columns in the memory cell array is increased, a semiconductor device that achieve high-speed arithmetic operation processing can be provided. Furthermore, increasing the number of rows allows an increase in the number of terms to be added in the product-sum operation. Note that $I_\alpha$ when the number of rows is increased can be expressed by the following formula.

[Formula 51]

$$I_\alpha = 2kA_{C1}\sum_i V_{W[i]}V_{X[i]} \quad (C17)$$

In the period from Time T29 to Time T30, arithmetic result data corresponding to $I_\alpha$ calculated between Time T28 and Time T29 is output from the terminal afb. Then, the arithmetic result data is input to the terminal gi4 of the learning circuit LEC. Moreover, at this time, input data is input to the terminal gi1 of the learning circuit LEC; $V_{X[1]}$ is input to the terminal gi2[1] of the learning circuit LEC as one piece of the second data; $V_{X[2]}$ is input to the terminal gi2[2] of the learning circuit LEC as one piece of the second data; and teacher data is input to the terminal gi3 of the learning circuit LEC.

<<From Time T30 to Time T31>>

In the current supply circuit IS illustrated in FIG. 13, between Time T30 and Time T31, the low-level potential is applied to the wiring SW1, the low-level potential is applied to the wiring SW2, the low-level potential is applied to the wiring SW3, the low-level potential is applied to the wiring SW4, the low-level potential is applied to the wiring SW5, the high-level potential is applied to the wiring SW6, and the low-level potential is applied to the wiring SW7. In addition, the high-level potential is applied to the wiring SW3B, the high-level potential is applied to the wiring SW5B, and the high-level potential is applied to the wiring SW7B.

At this time, the switch SWC is turned off.

In the circuit CS2, the transistor M22 is turned off, so that the current $I_{2nd}$ is not output to the terminal ct2. Since the transistor M24 is off from Time T20, the second potential is continuously held in the first terminal of the capacitor CD3 and the first terminal of the capacitor CD4.

In the circuit CS3, the transistor M27 is turned off, so that the current $I_{3rd}$ is not output to the terminal ct3. Since the transistor M29 is off from Time T25, the fourth potential is continuously held in the first terminal of the capacitor CD7 and the first terminal of the capacitor CD8.

In the circuit CS4, the transistor M32 is turned off, so that the current $I_{1st}$ is not drawn through the terminal ct4. Since the transistor M34 is off from Time T20, the third potential is continuously held in the first terminal of the capacitor CD11 and the first terminal of the capacitor CD12.

<<From Time T31 to Time T32>>

In the period from Time T31 to Time T32, the potential $V_{\Sigma\Delta w}$ corresponding to the total sum of the update amounts of the first data (the potential $V_{W[1]}$) (i.e., update data) is output from the terminal io[1] of the learning circuit LEC. Note that in this operation example, first update of the first data is described, and the potential $V_{\Delta w[1]}$ corresponding to the update amount of the first data (the potential $V_{W[1]}$) is output from the terminal io[1] of the learning circuit LEC. At this time, $V_{\Delta w[1]}$ is applied to the wiring HW[1]; hence, $V_{\Delta w[1]}$ is applied to the second terminal of the capacitor C2 through the terminal m5 in the memory cell AM[1], and the potential of the gate of the transistor Tr2 changes. The amount of change in gate potential of the transistor Tr2 corresponds to a potential obtained by multiplying a change in the potential of the wiring HW[1] by a capacitive coupling coefficient depending on the capacitor C2 and the circuit configuration therearound. For example, the capacitive coupling coefficient can be calculated using the capacitance of the capacitor C1, the capacitance of the capacitor C2, the gate capacitance of the transistor Tr2, the parasitic capacitance, and the like. When the capacitive coupling coefficient due to the capacitor C2 is $A_{C2}$ in this operation example, the amount of change in gate potential of the transistor Tr2 is $A_{C2}V_{\Delta w[1]}$.

Note that as described above, because of capacitive coupling of the capacitor C2, the potential $V_{\Delta w[1]}$, which is based on the update amount of the first data (the potential $V_{W[1]}$) and is output from the terminal io[1] of the learning circuit LEC, cannot be directly added to the potential of the node NM(AM[1]) and the node NM(AMwr[1]). Therefore, the potential that is based on the update amount of the first data (the potential $V_{W[1]}$) and is output from the terminal io[1] of the learning circuit LEC is preferably a potential that cancels the influence of capacitive coupling of the capacitor C2. For example, when the potential that is based on the update amount of the first data (the potential $V_{W[1]}$) and is output from the terminal io[1] of the learning circuit LEC is $V_{\Delta w[1]}/A_{C2}$, the influence of capacitive coupling of the capacitor C2 can be canceled. In this operation example, the description is made given that the potential that is based on the update amount of the first data (the potential $V_{W[1]}$) and is output from the terminal io[1] of the learning circuit LEC is $V_{\Delta w[1]}$.

Moreover, in the period from Time T31 to Time T32, the reference potential is applied to the wiring VL[1]. At this time, the reference potential is applied to the second terminal of the capacitor C1 in the memory cell AM[1]; hence, the potential of the gate of the transistor Tr2 in the memory cell AM[1] becomes lower than the potential in the period from Time T30 to Time T31.

Accordingly, the potential of the node NM(AM[1]) becomes the sum of $V_{Wb[1]}$ and $A_{C2}V_{\Delta w[1]}$. At this time, when the current flowing from the wiring BL to the first terminal of the transistor Tr2 in the memory cell AM[1] through its second terminal is $I_{AM[1],5}$, $I_{AM[1],5}$ can be expressed by the following formula.

[Formula 52]

$$I_{AM[1],5} = k(V_{Wb[1]} + A_{C2}V_{\Delta w[1]} - V_{th})^2 \quad (C18)$$

At this time, the current flowing from the wiring BL to the first terminal of the transistor Tr2 in the memory cell AM[1] through its second terminal changes by $I_{AM[1],5} - I_{AM[1],4}$ (which is denoted as $\Delta I_{AM[1],5}$ in FIG. 16 and indicates the current decrease).

<<From Time T32 to Time T33>>

In the period from Time T32 to Time T33, the potential $V_{\Sigma\Delta w}$ corresponding to the total sum of the update amounts of the first data (the potential $V_{W[2]}$) (i.e., update data) is output from the terminal io[2] of the learning circuit LEC. Note that in this operation example, first update of the first data is described, and the potential $V_{\Delta w[2]}$ corresponding to the update amount of the first data (the potential $V_{W[2]}$) is output from the terminal io[2] of the learning circuit LEC. At this time, $V_{\Delta w[2]}$ is applied to the wiring HW[2]; hence, the potential $V_{\Delta w[2]}$ is applied to the second terminal of the capacitor C2 through the terminal m5 in the memory cell AM[2]. For a change in the potential of the retention node in the memory cell AM[2], the description is similarly made with the capacitive coupling coefficient of each memory cell as $A_{C2}$. Since the capacitive coupling coefficient is $A_{C2}$, when the potential $V_{\Delta w[2]}$ is applied to the second terminal of the capacitor C2 in the memory cell AM[2], the potential of the node NM(AM[2]) changes by $A_{C2}V_{\Delta w[2]}$.

As in the description of the operation in the period from Time T31 to Time T32, a potential corresponding to the total sum of the update amounts of the first data (the potential $V_{W[2]}$) (i.e., the update data) from the terminal io[2] of the learning circuit LEC may be set to $V_{\Delta w[2]}/A_{C2}$ in order to cancel the capacitive coupling coefficient of the capacitor C2.

Moreover, in the period from Time T32 to Time T33, the reference potential is applied to the wiring VL[2]. At this time, the reference potential is applied to the second terminal of the capacitor C1 in the memory cell AM[2]; hence, the potential of the gate of the transistor Tr2 in the memory cell AM[2] becomes lower than the potential in the period from Time T31 to Time T32.

Accordingly, the potential of the node NM(AM[2]) becomes the sum of $V_{Wb[2]}$ and $A_{C2}V_{\Delta w[2]}$. At this time, when the current flowing from the wiring BL to the first terminal of the transistor Tr2 in the memory cell AM[2] through its second terminal is $I_{AM[2],5}$, $I_{AM[2],5}$ can be expressed by the following formula.

[Formula 53]

$$I_{AM[2],5}=k(V_{Wb[2]}+A_{C2}V_{\Delta W[2]}-V_{th})^2 \quad (C19)$$

At this time, the current flowing from the wiring BL to the first terminal of the transistor Tr2 in the memory cell AM[2] through its second terminal changes by $I_{AM[2],5}-I_{AM[2],4}$ (which is denoted as $\Delta I_{AM[2],5}$ in FIG. 16 and indicates the current decrease).

<<From Time T33 to Time T35>>

In the current supply circuit IS illustrated in FIG. 13, between Time T33 and Time T34, the high-level potential is applied to the wiring SW1, the low-level potential is applied to the wiring SW2, the low-level potential is applied to the wiring SW3, the high-level potential is applied to the wiring SW4, the high-level potential is applied to the wiring SW5, the low-level potential is applied to the wiring SW6, and the low-level potential is applied to the wiring SW7. In addition, the high-level potential is applied to the wiring SW3B, the low-level potential is applied to the wiring SW5B, and the high-level potential is applied to the wiring SW7B.

At this time, the switch SWC is turned on.

In the circuit CS2, the transistor M22 is turned off, so that the current $I_{2nd}$ is not output to the terminal ct2. Since the transistor M24 is off from Time T20, the second potential is continuously held in the first terminal of the capacitor CD3 and the first terminal of the capacitor CD4.

In the circuit CS4, the transistor M32 is turned off, so that the current $I_{1st}$ is not drawn through the terminal ct4. Since the transistor M34 is off from Time T20, the third potential is continuously held in the first terminal of the capacitor CD11 and the first terminal of the capacitor CD12.

In the circuit CS3, the transistor M27 is turned on and the transistor M29 is turned on. At this time, a given potential is applied from the wiring VBSL to the first terminal of the capacitor CD7 and the first terminal of the capacitor CD8 through the source and the drain of the transistor M29. Thus, the circuit CS3 outputs a current corresponding to the potential from the wiring VDDL through the source and the drain of each of the transistor M27 and the transistor M28. Hereinafter, the current is referred to as $I_{5th}$.

The total sum $I_{C,5}$ of currents flowing through the terminals m2 of the memory cell AM[1] and the memory cell AM[2] can be expressed by the following formula.

[Formula 54]

$$I_{C,5}=I_{AM[1],5}+I_{AM[2],5} \quad (C20)$$

Here, the potential of the wiring VBSL is changed so as to satisfy the following formula. The potential at this time is referred to as a fifth potential.

[Formula 55]

$$I_{C,5}=I_{5th} \quad (C21)$$

Next, in the period from Time T34 to Time T35, the low-level potential is applied to the wiring SW5. The high-level potential is applied to the wiring SW5B. Note that the wiring SW1 to the wiring SW4, the wiring SW6, the wiring SW7, the wiring SW3B, and the wiring SW7B are continuously supplied with the respective potentials in the period from Time T33 to Time T34.

In the circuit CS3, since the low-level potential is applied to the wiring SW5 in the period from Time T35 to Time T36, the fifth potential is held in the first terminal of the capacitor CD7 and the first terminal of the capacitor CD8. Furthermore, since the high-level potential is applied to the wiring SW4, the transistor M27 is turned on, and the circuit CS3 outputs $I_{5th}$.

<<From Time T35 to Time T36>>

In the period from Time T35 to Time T36, the potential higher than the reference potential by $V_{x[1]}$ is applied again to the wiring VL[1]. At this time, the potential $V_{x[1]}$ is applied to the second terminal of the capacitor C1 in the memory cell AM[1], so that the potential of the gate of the transistor Tr2 changes by $A_{C1}V_{x[1]}$.

The description of the operation between Time T16 and Time T17 is referred to for the operation of the memory cell AM[1] between Time T36 and Time T37.

Here, the current flowing from the second terminal to the first terminal of the transistor Tr2 in the memory cell AM[1] is considered. When the current flowing from the wiring BL to the first terminal of the transistor Tr2 in the memory cell AM[1] through its second terminal is $I_{AM[1],6}$, $I_{AM[1],6}$ can be expressed by the following formula.

[Formula 56]

$$I_{AM[1],6}=k(V_{Wb[1]}+A_{C2}V_{\Delta W[1]}+A_{C1}V_{x[1]}-V_{th})^2 \quad (C22)$$

In other words, by application of the potential $V_{x[1]}$ to the wiring VL[1], the current flowing from the wiring BL to the first terminal of the transistor Tr2 in the memory cell AM[1] through its second terminal increases by $I_{AM[1],6}-I_{AM[1],5}$ (denoted by $\Delta I_{AM[1],6}$ in FIG. 14).

<<From Time T36 to Time T37>>

In the period from Time T36 to Time T37, the potential higher than the reference potential by $V_{x[2]}$ is applied again to the wiring VL[2]. At this time, the potential $V_{x[2]}$ is applied to the second terminal of the capacitor C1 in the memory cell AM[2]. Thus, the potential of the gate of the transistor Tr2 in the memory cell AM[2] changes by $Act\ V_{X[2]}$.

The description of the operation between Time T27 and Time T28 is referred to for the operation of the memory cell AM[2] between Time T37 and Time T38.

Note that the wiring VL[1] is continuously supplied with the potential higher than the reference potential by $V_{X[1]}$ before Time T27.

Here, the current flowing from the second terminal to the first terminal of the transistor Tr2 in the memory cell AM[2] is considered. When the current flowing from the wiring BL to the first terminal of the transistor Tr2 in the memory cell AM[2] through its second terminal is $I_{AM[2],6}$, $I_{AM[2],6}$ can be expressed by the following formula.

[Formula 57]

$$I_{AM[2],6} = k(V_{Wb[2]} + A_{C2}V_{\Delta W[2]} + A_{C1}V_{\Delta W[2]} - V_{th})^2 \quad (C23)$$

In other words, by application of the potential $V_{X[2]}$ to the wiring VL[2], the current flowing from the wiring BL to the first terminal of the transistor Tr2 in the memory cell AM[2] through its second terminal increases by $I_{AM[2],6} - I_{AM[2],6}$ (denoted by $\Delta I_{AM[2],6}$ in FIG. 14).

<<From Time T37 to Time T38>>

In the current supply circuit IS illustrated in FIG. 13, between Time T37 and Time T38, the high-level potential is applied to the wiring SW1, the high-level potential is applied to the wiring SW2, the low-level potential is applied to the wiring SW3, the high-level potential is applied to the wiring SW4, the low-level potential is applied to the wiring SW5, the high-level potential is applied to the wiring SW6, and the low-level potential is applied to the wiring SW7. In addition, the high-level potential is applied to the wiring SW3B, the high-level potential is applied to the wiring SW5B, and the high-level potential is applied to the wiring SW7B.

At this time, the switch SWC is turned on.

In the circuit CS2, since the wiring SW2 is electrically connected to the gate of the transistor M22, the transistor M22 is turned on. Since the second potential is held in the first terminal of the capacitor CD3 and the first terminal of the capacitor CD4, the circuit CS2 outputs the current $I_{2nd}$ corresponding to the second potential to the terminal ct2.

In the circuit CS3, since the wiring SW4 is electrically connected to the gate of the transistor M27, the transistor M27 is turned on. Since the fifth potential is held in the first terminal of the capacitor CD7 and the first terminal of the capacitor CD8, the circuit CS3 outputs the current $I_{5th}$ corresponding to the fifth potential to the terminal ct3.

In the circuit CS4, since the wiring SW6 is electrically connected to the gate of the transistor M32, the transistor M32 is turned on. Since the second potential is held in the first terminal of the capacitor CD11 and the first terminal of the capacitor CD12, the circuit CS4 draws the current $I_{1st}$ corresponding to the third potential through the terminal ct4.

The total sum $I_{6th}$ of currents flowing through the terminals m2 of the memory cell AM[1] and the memory cell AM[2] can be expressed by the following formula.

[Formula 58]

$$I_{6th} = I_{AM[1],6} + I_{AM[2],6} \quad (C24)$$

Here, the high-level potential is applied to the wiring SWAL to turn on the switch SWA in the activation function circuit ACTV, whereby a current is supplied from the terminal ai of the activation function circuit ACTV. At this time, the current is denoted as $I_\beta$. Here, $I_\beta$ can be expressed by the following formula, using Formula (C1) to Formula (C8) and Formula (C18) to Formula (C24).

[Formula 59]

$$I_\beta = I_{6th} - I_{2nd} - I_{5th} + I_{1st} \quad (C25)$$
$$= 2kA_{C1}\{(V_{W[1]} = A_{C2}V_{\Delta W[1]})V_{X[1]} + (V_{W[2]} + A_{C2}V_{\Delta W[2]})V_{X[2]}\}$$

As shown by Formula (C25), the current $\Delta I_\beta$ flowing from the terminal ai has a value corresponding to the sum of products of the potentials corresponding to a plurality of pieces of updated first data and the potentials corresponding to a plurality of pieces of second data. That is, by calculating $I_\beta$, which is output from the terminal ai of the activation function circuit ACTV, the value of product-sum of the updated first data and the second data can be obtained, and the value of the activation function based on the value can be obtained.

To cancel the influence of capacitive coupling of the capacitor C2, the potential $V_{\Delta w,[1]}$, which is based on the update amount of the first data (the potential $V_{W[2]}$) and is output from the terminal io[1] of the learning circuit LEC, is replaced with $V_{\Delta w[1]}/A_{C2}$, and the potential $V_{\Delta w[2]}$, which is based on the update amount of the first data (the potential $V_{W[2]}$) and is output from the terminal io[2] of the learning circuit LEC, is replaced with $V_{\Delta w[2]}/A_{C2}$. This corresponds to the replacement of the coefficient $A_{C2}$ shown in Formula (C25) with 1.

First update of the first data has been described in this operation example; when update of the first data is performed two times or more, it is necessary to output the arithmetic result data for every update and output the total sum of the update amounts by the learning circuit LEC. For example, in the case where the first data is updated twice, when a potential corresponding to the first update amount of the first data is $V_{\Delta w,1st}$ and a potential corresponding to the second update amount of the first data is $V_{\Delta w,2nd}$, a potential corresponding to the total sum of the update amounts of the first data (the potential $V_{W[1]}$) (i.e., the update data) from the terminal io[1] (or the terminal io[2]) of the learning circuit LEC is $V_{\Sigma\Delta w} = V_{\Delta w,1st} + V_{\Delta w,2nd}$.

Although the memory cell array MCA including the memory cells arranged in a matrix of two rows and one column is used in this operation example, arithmetic operation can be similarly performed in a memory cell array of three or more rows and two or more columns. For example, $I_\beta$ when the number of rows in the memory cell array MCA is increased can be expressed by the following formula.

[Formula 60]

$$I_\alpha = 2kA_{C1}\sum_i (V_{W[i]} + A_{C2}V_{\Delta w[i]})V_{X[i]} \quad (C26)$$

Like the arithmetic circuit 100, the arithmetic circuit 200 described in this embodiment can be used in a hierarchical neural network.

In that case, in the memory cell array MCA in the arithmetic circuit 200 described in this embodiment, the number of rows of memory cells having the same configuration as the memory cell AM[1] is the number of neurons in the previous layer. In other words, the number of rows of these memory cells corresponds to the number of output signals of the neurons in the previous layer that are input to the subsequent layer. The number of columns of memory cells having the same configuration as the memory cell AM[1] is the number of neurons in the subsequent layer. In other words, the number of columns of these memory cells corresponds to the number of output signals of the neurons that are output from the subsequent layer. That is, the number of rows and the number of columns in the memory cell array MCA of the arithmetic circuit are determined depending on the number of neurons in each of the previous layer and the subsequent layer; thus, a neural network is designed with the number of rows and the number of columns in the memory cell array that are determined appropriately for the desired configuration.

In the arithmetic circuit 200 in this embodiment, as described above, the first data held in the node NM of the memory cell AM is updated by application of a potential corresponding to the update amount to the wiring HW[1] or the wiring HW[2]. Therefore, it is unnecessary to drive the circuit WDD and the circuit WLD and write the updated first data to the node NM of the memory cell AM. In other words, the frequency of driving the circuit WDD and the circuit WLD can be reduced, so that the power consumption of the arithmetic circuit 200 can be reduced.

Furthermore, unlike the arithmetic circuit 100 described in Embodiment 1, the arithmetic circuit 200 is not provided with the memory cells AM for holding the first reference data and the second reference data, and thus can have a smaller circuit area than the arithmetic circuit 100.

Note that the structure of the arithmetic circuit 200 according to one embodiment of the present invention is not limited to the structure described in this embodiment. In the structure of the arithmetic circuit 200, it is possible to select which circuit elements are provided or omitted and/or to change an electrical connection structure, according to circumstances. For example, the arithmetic circuit 200 operates based on the changes in potentials of the wiring SW1 to the wiring SW7, the wiring SW3B, the wiring SW5B, and the wiring SW7B; in the operation example (the timing charts in FIG. 14 to FIG. 16) in this embodiment, the wiring SW4 and the wiring SW6 can be integrated into one wiring, the wiring SW5 and the wiring SW7 can be integrated into one wiring, and the wiring SW5B and the wiring SW7B can be integrated into one wiring. Such a structure can reduce the number of wirings provided in the arithmetic circuit 200, thereby reducing the circuit area of the arithmetic circuit 200.

Note that this embodiment can be combined with the other embodiments and/or the example in this specification as appropriate.

Embodiment 3

In this embodiment, an example of a structure of an OS transistor that can be used in the semiconductor device described in the above embodiment will be described.
<Structure Example of Semiconductor Device>

Figure 17:
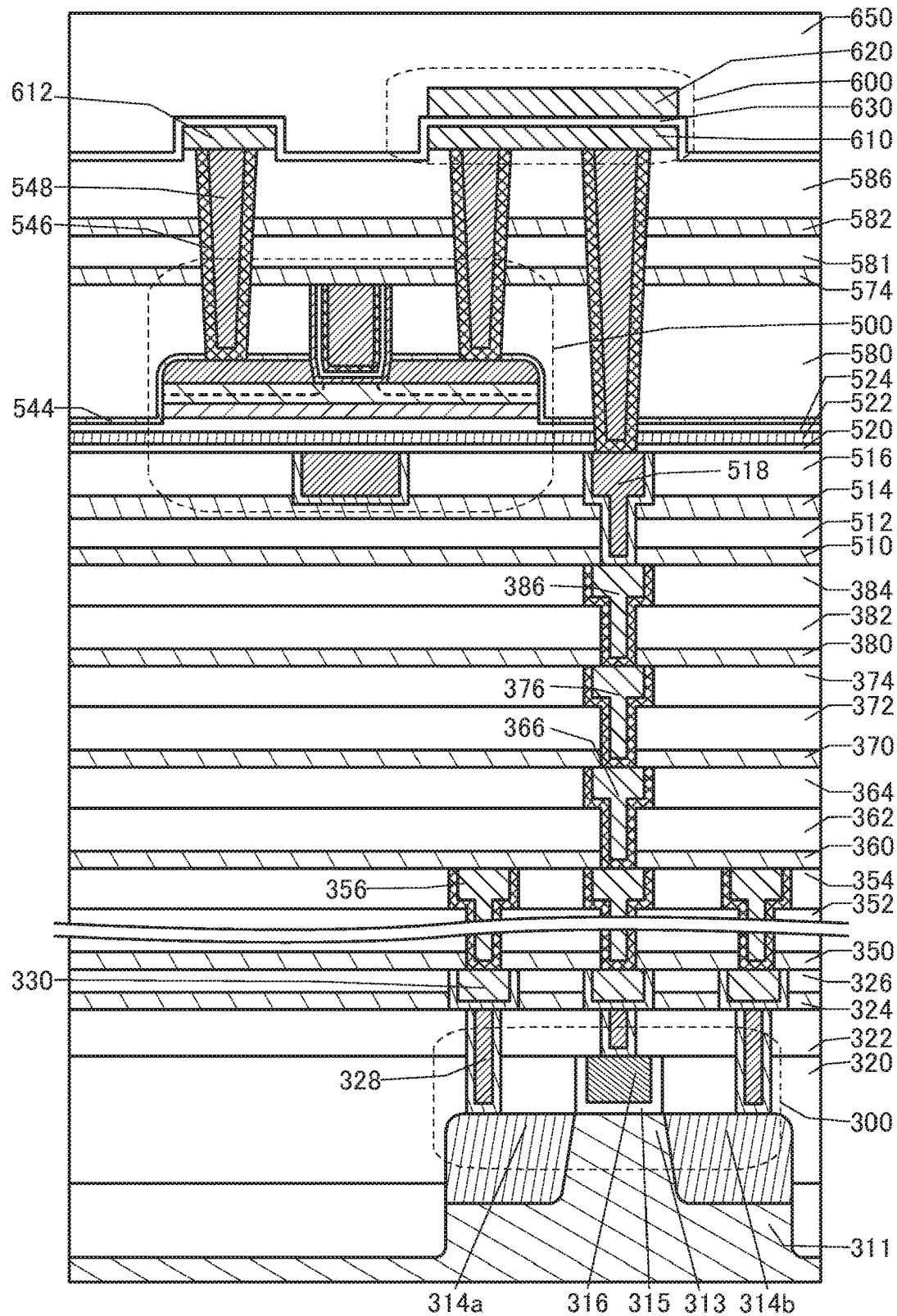
FIG. 17 A cross-sectional view illustrating a structure example of a semiconductor device.
Figure 19A:
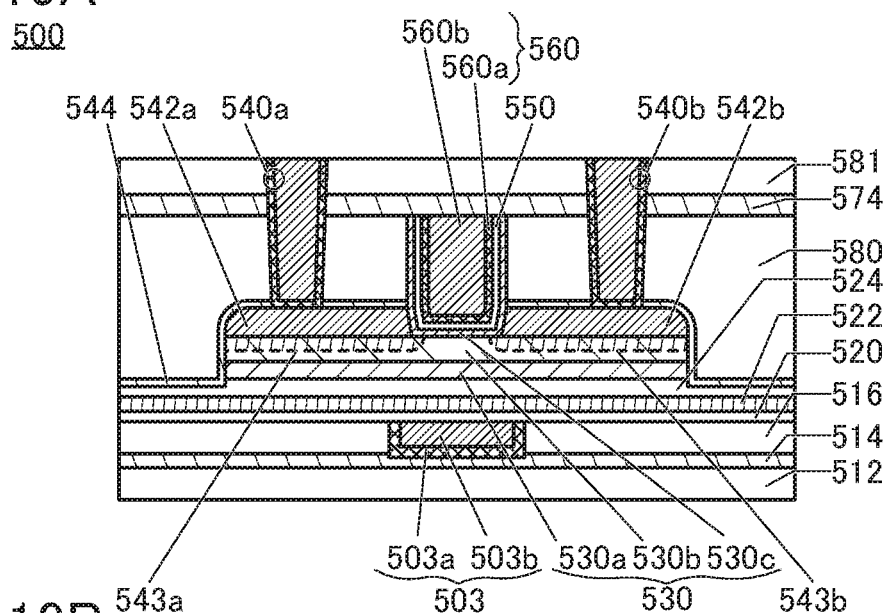
FIGS. 19A to 19C Cross-sectional views each illustrating a structure example of a transistor.
Figure 19B:
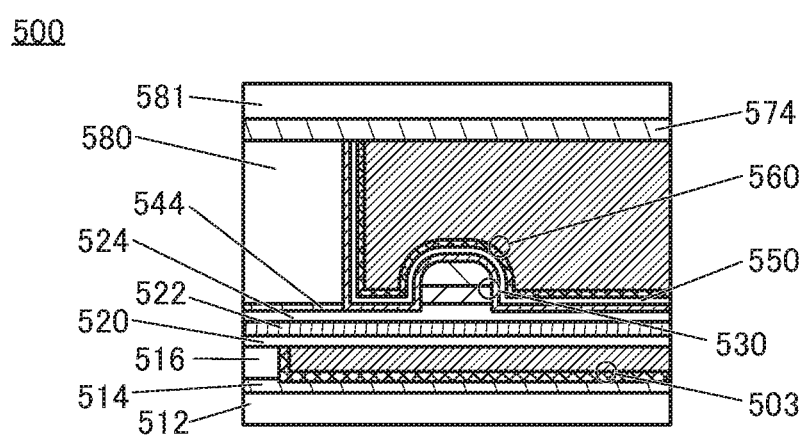
Figure 19C:
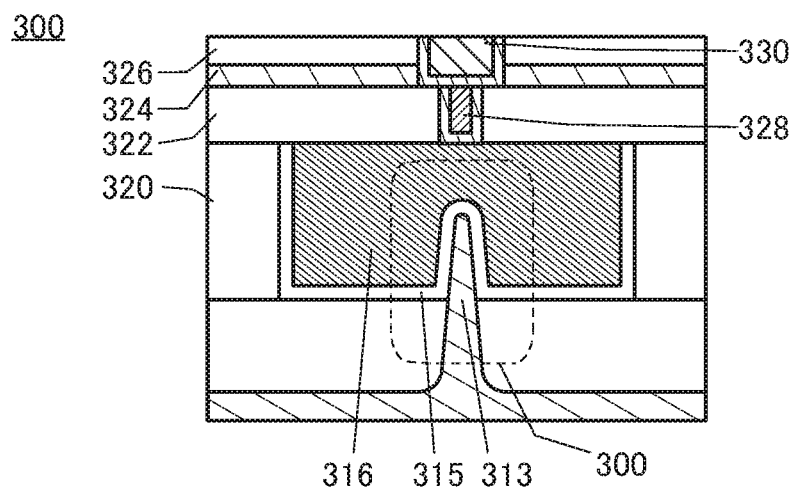

A semiconductor device illustrated in FIG. 17 includes a transistor 300, a transistor 500, and a capacitor 600. FIG. 19(A) is a cross-sectional view of the transistor 500 in the channel length direction, FIG. 19(B) is a cross-sectional view of the transistor 500 in the channel width direction, and FIG. 19(C) is a cross-sectional view of the transistor 300 in the channel width direction.

The transistor 500 is a transistor including a metal oxide in its channel formation region (an OS transistor). Since the off-state current of the transistor 500 is low, the use of the transistor 500 in a semiconductor device, particularly as the transistor Tr1 in the memory cell MC, enables long-term retention of first data. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as illustrated in FIG. 17. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as the transistor Tr2 in the above embodiment.

In the transistor 300, the top surface and the side surface in the channel width direction of the semiconductor region 313 are covered with the conductor 316 with the insulator 315 therebetween, as illustrated in FIG. 19(C). Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor. In the above embodiment, the transistor Tr2 (the transistor 300) is described as an n-channel transistor; when the transistor Tr2 is a p-channel transistor, it is preferable that a potential applied to the wiring VR0 be a high-level potential and the memory cell MC be configured to output a current from the terminal m1. When the configuration of the memory cell MC is changed in the above manner, the configuration of the current supply circuit IS also needs to be changed.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 18:
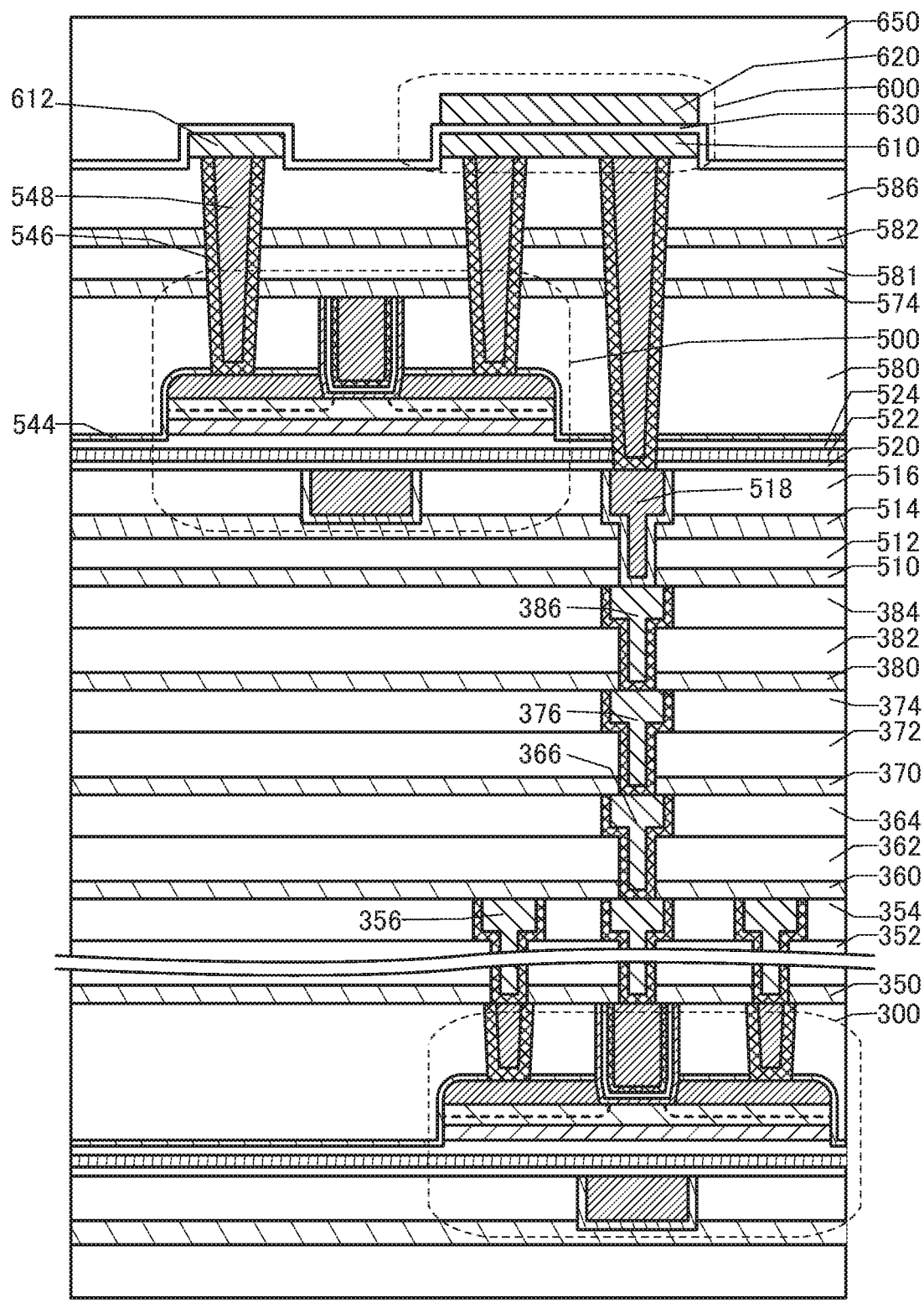
FIG. 18 A cross-sectional view illustrating a structure example of a semiconductor device.

Note that the transistor 300 illustrated in FIG. 17 is just an example and is not limited to having the structure shown therein; an appropriate transistor can be used in accordance with a circuit configuration or a driving method. For example, the transistor 300 may have a structure similar to that of the transistor 500 using an oxide semiconductor, as illustrated in FIG. 18. Note that the details of the transistor 500 will be described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low permittivity for an interlayer film can reduce the parasitic capacitance between wirings.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 17, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by the barrier layer, so that the diffusion of hydrogen from the transistor 300 to the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 17, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 17, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 17, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less or five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents hydrogen or impurities from the substrate 311, a region where the transistor 300 is provided, or the like from diffusing to a region where the transistor 500 is provided. Therefore, a material similar to that for the insulator 324 can be used.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Thus, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. The use of a material with a relatively low permittivity for these insulators can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be formed using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 to the transistor 500 can be inhibited.

The transistor 500 is provided over the insulator 516.

As illustrated in FIGS. 19(A) and 19(B), the transistor 500 includes the conductor 503 positioned to be embedded in the insulator 512 and the insulator 516, an insulator 520 positioned over the insulator 516 and the conductor 503, an insulator 522 positioned over the insulator 520, an insulator 524 positioned over the insulator 522, an oxide 530*a* positioned over the insulator 524, an oxide 530*b* positioned over the oxide 530*a*, a conductor 542*a* and a conductor 542*b* positioned apart from each other over the oxide 530*b*, an insulator 580 that is positioned over the conductor 542*a* and the conductor 542*b* and has an opening between the conductor 542*a* and the conductor 542*b*, an oxide 530*c* positioned on a bottom surface and a side surface of the opening, an insulator 550 positioned on the formation surface of the oxide 530*c*, and a conductor 560 positioned on the formation surface of the insulator 550.

As illustrated in FIGS. 19(A) and 19(B), an insulator 544 is preferably provided between the insulator 580 and the oxide 530*a*, the oxide 530*b*, the conductor 542*a*, and the conductor 542*b*. As illustrated in FIGS. 19(A) and 19(B), the conductor 560 preferably includes a conductor 560*a* provided on the inner side of the insulator 550 and a conductor 560b provided to be embedded on the inner side of the conductor 560a. As illustrated in FIGS. 19(A) and 19(B), an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure where the three layers of the oxide 530a, the oxide 530b, and the oxide 530c are stacked in the region where the channel is formed and its vicinity; however, the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. The transistor 500 illustrated in FIG. 17 and FIGS. 19(A) and 19(B) is just an example and is not limited to the structure shown therein; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; the conductor 503a is formed in contact with an inner wall of the opening in the insulator 514 and the insulator 516, and the conductor 503b is formed further inside.

The insulator 520, the insulator 522, the insulator 524, and the insulator 550 have a function of a gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

When the insulator 524 includes an excess-oxygen region, the insulator 522 preferably has a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be reduced while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride are thermally stable. A combination of an insulator of a high-k material and the insulator 520 can provide a stacked-layer structure having thermal stability and a high dielectric constant.

Note that the insulator 520, the insulator 522, and the insulator 524 may have a stacked-layer structure of two or more layers. In that case, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In-M-Zn oxide that can be used as the oxide 530 is particularly preferably a CAAC-OS or a CAC-OS each of which will be described in Embodiment 4. Alternatively, an In—Ga oxide or an In—Zn oxide may be used as the oxide 530.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can inhibit diffusion of impurities into the oxide 530b from the components formed below the oxide 530a. By including the oxide 530c over the oxide 530b, the oxide 530 can inhibit diffusion of impurities into the oxide 530b from the components formed above the oxide 530c.

The oxide 530 preferably has a stacked-layer structure of oxides that differ in the atomic ratio of metal atoms. Specifically, the atomic proportion of the element M to the constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Furthermore, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of the oxide 530a and the oxide 530c is preferably higher than that of the oxide 530b. In other words, the electron affinity of the oxide 530a and the oxide 530c is preferably smaller than that of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 19(A), a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such cases, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, magnesium, and the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate is preferable because it has higher heat resistance than a hafnium oxide film and thus is less likely to be crystallized by heat treatment in later steps. Note that the insulator 544 is not an essential component when the conductor 542a and the conductor 542b are an oxidation-resistant material or do not significantly lose the conductivity even after absorbing oxygen. Design is appropriately determined in consideration of required transistor characteristics.

The insulator 550 functions as a gate insulating film. The insulator 550 is preferably in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 to the conductor 560. Providing the metal oxide that inhibits oxygen diffusion suppresses diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Although the conductor 560 functioning as the first gate electrode has a two-layer structure in FIGS. 19(A) and 19(B), the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example.

The conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is embedded in the opening of the insulator 580 and the region between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is formed by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductor 540a and the conductor 540b each have a structure similar to that of a conductor 546 and a conductor 548 that will be described later.

An insulator 582 is provided over the insulator 581. A substance having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be formed using a material similar to that for the insulator 320. The use of a material with a relatively low permittivity for these insulators can reduce the parasitic capacitance between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be formed using a material similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 17; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be formed using a material similar to that for the insulator 320. The insulator 650 may function as a planarization film that covers an uneven shape thereunder.

With the use of this structure, a change in electrical characteristics can be reduced and the reliability can be improved in a semiconductor device including a transistor including an oxide semiconductor. Alternatively, a semiconductor device using a transistor including an oxide semiconductor can be miniaturized or highly integrated.

<Structure Examples of Transistors>

The structure of the transistor 500 in the semiconductor device described in this embodiment is not limited to the above. Structure examples that can be used for the transistor 500 will be described below. Note that transistors described below are variation examples of the above transistor; therefore, differences from the above transistor are mainly described below and the description of portions identical to the above is sometimes omitted.

<<Transistor Structure Example 1>>

Figure 20A:
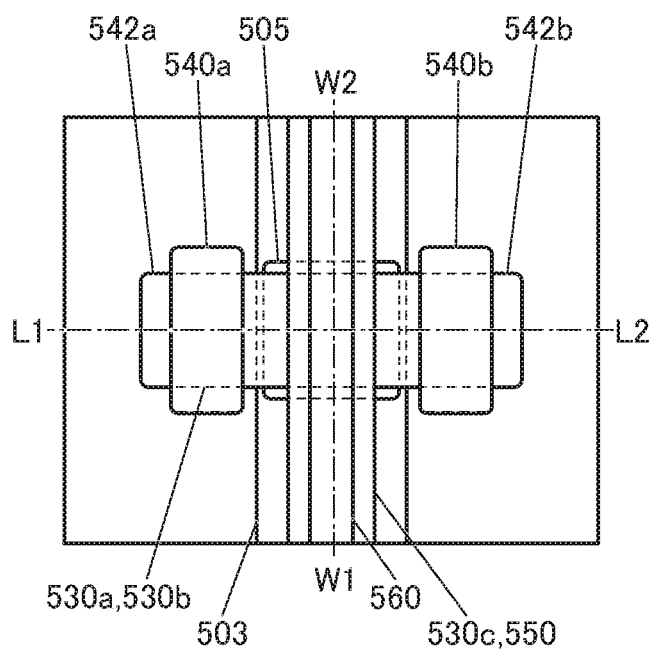
FIGS. 20A to 20C A top view and cross-sectional views illustrating a structure example of a transistor.
Figure 20C:
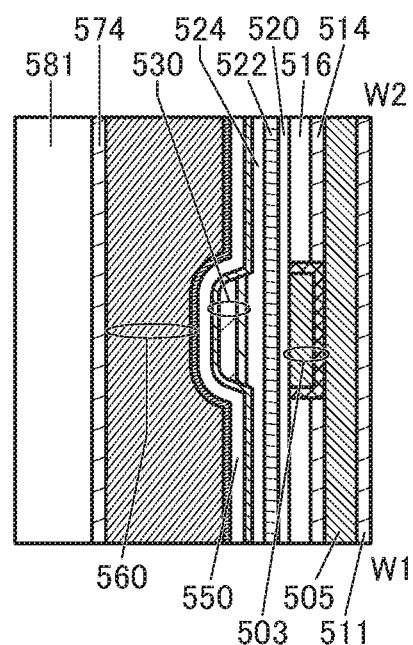
Figure 20B:
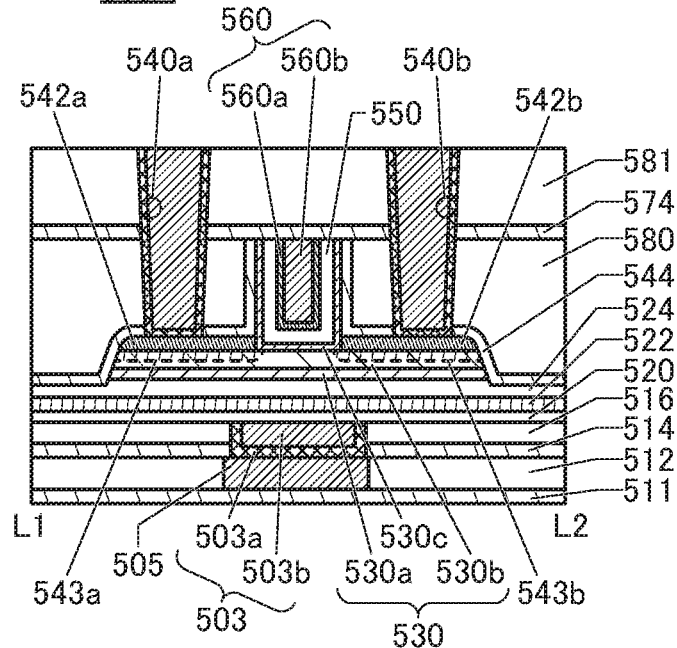

A structure example of a transistor 500A will be described with reference to FIGS. 20(A), 20(B), and 20(C). FIG. 20(A) is a top view of the transistor 500A. FIG. 20(B) is a cross-sectional view of a portion along the dashed-dotted line L1-L2 in FIG. 20(A). FIG. 20(C) is a cross-sectional view of a portion along the dashed-dotted line W1-W2 in FIG. 20(A). Note that for simplification of the drawing, some components are not illustrated in the top view in FIG. 20(A).

FIGS. 20(A), 20(B), and 20(C) illustrate the transistor 500A and the insulator 511, the insulator 512, the insulator 514, the insulator 516, the insulator 580, the insulator 574, and the insulator 581 that function as interlayer films. In addition, the conductor 540a and the conductor 540b that are electrically connected to the transistor 500A and function as contact plugs, and the conductor 505 functioning as a wiring are illustrated.

The transistor 500A includes the conductor 560 (the conductor 560a and the conductor 560b) functioning as a first gate electrode; the conductor 503 (the conductor 503a and the conductor 503b) functioning as a second gate electrode; the insulator 550 functioning as a first gate insulating film; the insulator 520, the insulator 522, and the insulator 524 that function as a second gate insulating film;

the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 544.

In the transistor 500A illustrated in FIG. 20, the oxide 530c, the insulator 550, and the conductor 560 are provided in an opening in the insulator 580 with the insulator 544 positioned therebetween. Moreover, the oxide 530c, the insulator 550, and the conductor 560 are provided between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film for inhibiting impurities such as water or hydrogen from entering the transistor 500A from the substrate side. Accordingly, the insulator 511 is preferably formed using an insulating material having a function of inhibiting diffusion of impurities such as a hydrogen atom, a hydrogen molecule, a water molecule, and a copper atom (an insulating material through which the above impurities are less likely to pass). Alternatively, the insulator 511 is preferably formed using an insulating material having a function of inhibiting diffusion of oxygen (e.g., at least one of oxygen atoms, oxygen molecules, and the like) (an insulating material through which the above oxygen is less likely to pass). Further alternatively, aluminum oxide or silicon nitride, for example, may be used for the insulator 511. Such a structure can inhibit diffusion of impurities such as hydrogen or water into the transistor 500A from the substrate side through the insulator 511.

For example, the permittivity of the insulator 512 is preferably lower than that of the insulator 511. The use of a material having a low permittivity for the interlayer film can reduce the parasitic capacitance between wirings.

The conductor 505 is formed to be embedded in the insulator 512. Here, the top surface of the conductor 505 and the top surface of the insulator 512 can be at substantially the same level. Although the conductor 505 is shown as a single layer, the present invention is not limited to this. For example, the conductor 505 may have a multilayer structure of two or more layers. The conductor 505 is preferably formed using a conductive material that has high conductivity and contains tungsten, copper, or aluminum as its main component.

In the transistor 500A, the conductor 560 sometimes functions as a first gate (also referred to as top gate) electrode. The conductor 503 sometimes functions as a second gate (also referred to as bottom gate) electrode. In that case, the threshold voltage of the transistor 500A can be controlled by changing a potential applied to the conductor 503 independently of a potential applied to the conductor 560. In particular, the threshold voltage of the transistor 500A can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

For example, when the conductor 503 and the conductor 560 are provided to overlap with each other, in the case where a potential is applied to the conductor 560 and the conductor 503, an electric field generated from the conductor 560 and an electric field generated from the conductor 503 are connected and can cover a channel formation region formed in the oxide 530.

That is, the channel formation region can be electrically surrounded by the electric field of the conductor 560 having a function of the first gate electrode and the electric field of the conductor 503 having a function of the second gate electrode. In this specification, a transistor structure in which a channel formation region is electrically surrounded by electric fields of a first gate electrode and a second gate electrode is referred to as a surrounded channel (S-channel) structure.

Like the insulator 511 or the insulator 512, the insulator 514 and the insulator 516 function as interlayer films. For example, the insulator 514 preferably functions as a barrier film for inhibiting impurities such as water or hydrogen from entering the transistor 500A from the substrate side. This structure can inhibit diffusion of impurities such as hydrogen or water into the transistor 500A side from the substrate side through the insulator 514. Moreover, for example, the insulator 516 preferably has a lower permittivity than the insulator 514. The use of a material having a low permittivity for the interlayer film can reduce the parasitic capacitance between wirings.

In the conductor 503 functioning as the second gate, the conductor 503a is formed in contact with an inner wall of an opening in the insulator 514 and the insulator 516, and the conductor 503b is formed further inside. Here, the top surfaces of the conductor 503a and the conductor 503b and the top surface of the insulator 516 can be substantially level with each other. Although the transistor 500A in which the conductor 503a and the conductor 503b are stacked is illustrated, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, the conductor 503b is preferably formed using a conductive material that has high conductivity and contains tungsten, copper, or aluminum as its main component. In that case, a conductor 505 does not always need to be provided. Note that the conductor 503b is a single layer in the diagram but may have a stacked-layer structure, for example, a stacked-layer structure of titanium or titanium nitride and any of the above conductive materials.

The insulator 520, the insulator 522, and the insulator 524 have a function of a second gate insulating film.

The insulator 522 preferably has a barrier property. The insulator 522 having a barrier property functions as a layer that inhibits entry of impurities such as hydrogen into the transistor 500A from the surroundings of the transistor 500A.

Note that although the second gate insulating film has a three-layer structure in FIG. 20, a single-layer structure or a stacked-layer structure of two or more layers may be employed. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 544 positioned therebetween. When the insulator 544 has a barrier property, diffusion of impurities from the insulator 580 into the oxide 530 can be inhibited.

The conductor 542a has a function as one of the source electrode and the drain electrode, and the conductor 542b has a function of the other of the source electrode and the drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 20, a stacked-layer structure of two or more layers may be employed. For example, a tantalum nitride film and a tungsten film can be stacked. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

A barrier layer may be provided over the conductor 542a and the conductor 542b. The barrier layer is preferably formed using a material having a barrier property against oxygen or hydrogen. This structure can inhibit oxidation of the conductor 542a and the conductor 542b at the time of forming the insulator 544.

For the barrier layer, for example, a metal oxide can be used. In particular, an insulating film of aluminum oxide, hafnium oxide, gallium oxide, or the like, which has a barrier property against oxygen and hydrogen, is preferably used. Alternatively, silicon nitride deposited by a CVD method may be used.

When the barrier layer is included, the range of choices for the material of the conductor 542a and the conductor 542b can be expanded. For example, the conductor 542a and the conductor 542b can be formed using a material with a low oxidation resistance and high conductivity, such as tungsten or aluminum. Furthermore, a conductor that can be easily deposited or processed can be used, for example.

The insulator 550 functions as a first gate insulating film. The insulator 550 is preferably provided in the opening in the insulator 580 with the oxide 530c and the insulator 544 positioned therebetween.

With miniaturization and high integration of transistors, a problem such as leakage current may arise because of a thinner gate insulator. In that case, the insulator 550 may have a stacked-layer structure like the second gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably a conductor having high conductivity. For example, a conductive material containing tungsten, copper, or aluminum as its main component can be used. The conductor 560b may have a stacked-layer structure and may be a stack of titanium or titanium nitride and any of the above conductive materials, for example.

The insulator 544 is positioned between the insulator 580 and the transistor 500A. For the insulator 544, an insulating material having a function of inhibiting diffusion of oxygen and impurities such as water or hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit impurities such as water and hydrogen contained in the insulator 580 from diffusing into the oxide 530b through the oxide 530c and the insulator 550. The insulator 544 can also inhibit oxidation of the conductor 560 due to excess oxygen contained in the insulator 580.

The insulator 580, the insulator 574, and the insulator 581 function as interlayer films.

Like the insulator 514, the insulator 574 preferably functions as a barrier insulating film that inhibits entry of impurities such as water or hydrogen into the transistor 500A from the outside.

Like the insulator 516, the insulator 580 and the insulator 581 preferably have a lower permittivity than the insulator 574. When a material with a low permittivity is used for the interlayer film, the parasitic capacitance generated between wirings can be reduced.

The transistor 500A may be electrically connected to another component through a plug or a wiring such as the conductor 540a and the conductor 540b embedded in the insulator 580, the insulator 574, and the insulator 581.

Like the conductor 503, the conductor 540a and the conductor 540b can be a single layer or stacked layers using a conductive material such as a metal material, an alloy material, a metal nitride material, or a metal oxide material. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For example, by employing a stacked-layer structure of tantalum nitride or the like, which is a conductor having a barrier property against hydrogen and oxygen, and tungsten, which has high conductivity, the conductor 540a and the conductor 540b can inhibit diffusion of impurities from the outside while maintaining conductivity as wirings.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has small variation in electrical characteristics, stable electrical characteristics, and high reliability can be provided.

<<Transistor Structure Example 2>>

A structure example of a transistor 500B will be described with reference to FIGS. 21(A), 21(B), and 21(C). FIG. 21(A) is a top view of the transistor 500B. FIG. 21(B) is a cross-sectional view of a portion along the dashed-dotted line L1-L2 in FIG. 21(A). FIG. 21(C) is a cross-sectional view of a portion along the dashed-dotted line W1-W2 in FIG. 21(A). Note that for simplification of the drawing, some components are not illustrated in the top view in FIG. 21(A).

The transistor 500B is a variation example of the transistor 500A. Therefore, differences from the transistor 500A are mainly described to avoid repeated description.

The transistor 500B includes a region where the conductor 542a (the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 544 is preferably provided to cover a top surface and a side surface of the conductor 560, a side surface of the insulator 550, and a side surface of the oxide 530c. For the insulator 544, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit oxidation of the conductor 560. Moreover, the insulator 544 can inhibit diffusion of impurities such as water and hydrogen contained in the insulator 580 into the transistor 500B.

A contact plug of the transistor 500B has a structure different from that of the contact plug of the transistor 500A. In the transistor 500B, an insulator 576a (an insulator 576b) having a barrier property is provided between the insulator 580 and the conductor 546a (the conductor 546b) serving as a contact plug. Providing the insulator 576a (the insulator 576b) can prevent oxygen in the insulator 580 from reacting with the conductor 546 and oxidizing the conductor 546.

Furthermore, with the insulator 576a (the insulator 576b) having a barrier property, the range of choices for the materials for the conductors used as plugs and wirings can be expanded. The use of a metal material having an oxygen absorbing property and high conductivity for the conductor 546a (the insulator 546b), for example, can provide a semiconductor device with low power consumption. Specifically, it is possible to use a material with a low oxidation resistance and high conductivity, such as tungsten or aluminum. Furthermore, a conductor that can be easily formed or processed can be used, for example.

<<Transistor Structure Example 3>>

A structure example of a transistor 500C will be described with reference to FIGS. 22(A), 22(B), and 22(C). FIG. 22(A) is a top view of the transistor 500C. FIG. 22(B) is a cross-sectional view of a portion along the dashed-dotted line L1-L2 in FIG. 22(A). FIG. 22(C) is a cross-sectional view of a portion along the dashed-dotted line W1-W2 in FIG. 22(A). Note that for simplification of the drawing, some components are not illustrated in the top view in FIG. 22(A).

The transistor 500C is a variation example of the transistor 500A. Therefore, differences from the transistor 500A are mainly described to avoid repeated description.

The transistor 500C illustrated in FIG. 22 includes a conductor 547a between the conductor 542a and the oxide 530b, and a conductor 547b between the conductor 542b and the oxide 530b. The conductor 542a (the conductor 542b) has a region that extends beyond the top surface of the conductor 547a (the conductor 547b) and its side surface close to the conductor 560 and is in contact with the top surface of the oxide 530b. Here, the conductor 547a and the conductor 547b can be formed using a conductor that can be used as the conductor 542a and the conductor 542b. Furthermore, the conductor 547a and the conductor 547b are preferably thicker than at least the conductor 542a and the conductor 542b.

In the transistor 500C illustrated in FIG. 22, because of the above structure, the conductor 542a and the conductor 542b can be closer to the conductor 560 than in the transistor 500A. Alternatively, the conductor 560 and the end portions of the conductor 542a and the conductor 542b can overlap with each other. Accordingly, the effective channel length of the transistor 500C can be shortened, and the on-state current and the frequency characteristics can be improved.

The conductor 547a (the conductor 547b) is preferably provided to overlap with the conductor 542a (the conductor 542b). With this structure, the conductor 547a (the conductor 547b) can function as a stopper to prevent over-etching of the oxide 530b in etching for forming the opening in which the conductor 540a (the conductor 540b) is to be embedded.

The transistor 500C illustrated in FIG. 22 may have a structure in which an insulator 545 is positioned on and in contact with the insulator 544. The insulator 544 preferably functions as a barrier insulating film for inhibiting impurities such as water or hydrogen and excess oxygen from entering the transistor 500C from the insulator 580 side. The insulator 545 can be formed using an insulator that can be used as the insulator 544. The insulator 544 may be formed using a nitride insulator such as aluminum nitride, aluminum titanium nitride, titanium nitride, silicon nitride, or silicon nitride oxide, for example.

Unlike in the transistor 500A in FIG. 20, the conductor 503 may be provided to have a single-layer structure in the transistor 500C in FIG. 22. In this case, an insulating film to be the insulator 516 is formed over the patterned conductor 503, and an upper portion of the insulating film is removed by a CMP method or the like until the top surface of the conductor 503 is exposed. Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of the insulating layer formed over the conductor 503 and the increase in crystallinity of the oxide 530b and the oxide 530c.

<<Transistor Structure Example 4>>

Figure 23A:
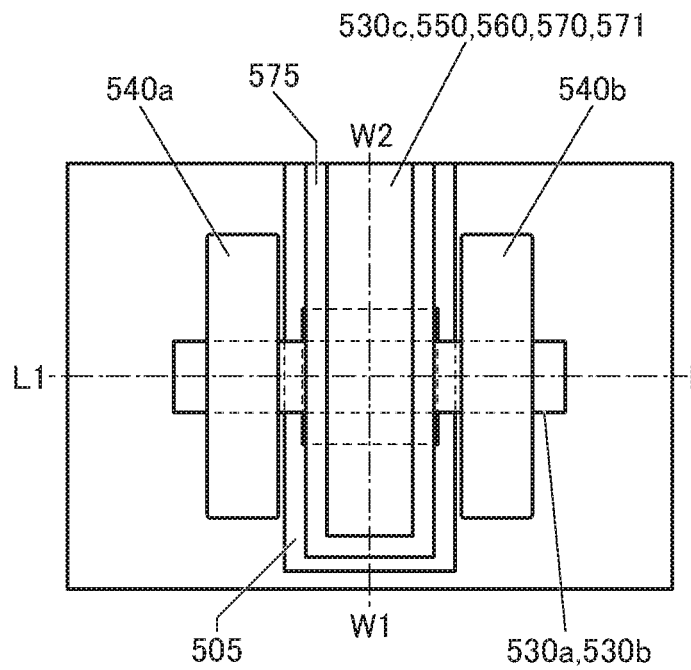
FIGS. 23A to 23C A top view and cross-sectional views illustrating a structure example of a transistor.
Figure 23C:
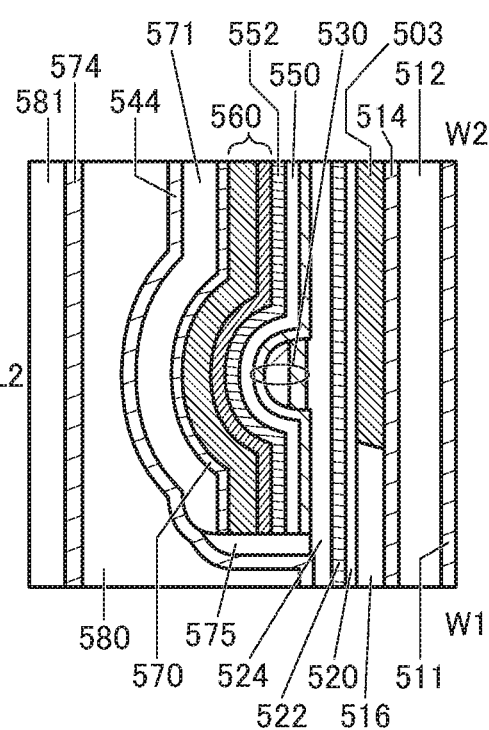
Figure 23B:
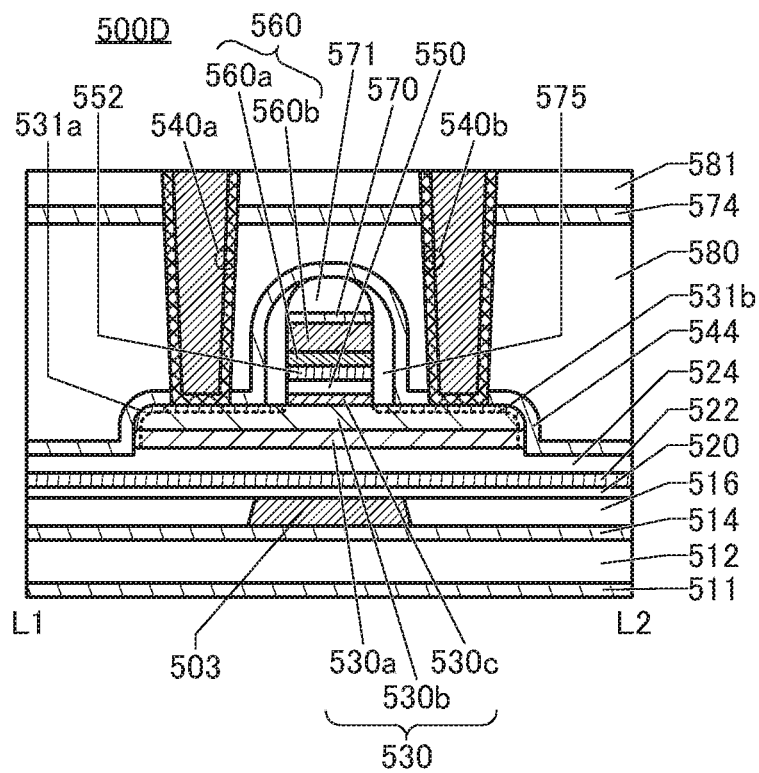

A structure example of a transistor 500D will be described with reference to FIGS. 23(A), 23(B), and 23(C). FIG. 23(A) is a top view of the transistor 500D. FIG. 23(B) is a cross-sectional view of a portion along the dashed-dotted line L1-L2 in FIG. 23(A). FIG. 23(C) is a cross-sectional view of a portion along the dashed-dotted line W1-W2 in FIG. 23(A). Note that for simplification of the drawing, some components are not illustrated in the top view of FIG. 23(A).

The transistor 500D is a variation example of the above transistors. Therefore, differences from the above transistors are mainly described to avoid repeated description.

In the transistor 500D illustrated in FIGS. 23(A) to 23(C), the conductor 505 is not provided as in the transistor 500C in FIG. 22, and the conductor 503 having a function of a second gate also functions as a wiring. The transistor 500D includes the insulator 550 over the oxide 530c and a metal oxide 552 over the insulator 550. The conductor 560 is placed over the metal oxide 552, and an insulator 570 is placed over the conductor 560. An insulator 571 is placed over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be suppressed.

Note that the metal oxide 552 may have a function of part of the first gate. For example, an oxide semiconductor that can be used as the oxide 530 can be used as the metal oxide 552. In this case, when the conductor 560 is formed by a sputtering method, the electrical resistance of the metal oxide 552 is lowered so that the metal oxide 552 can be a conductive layer. This can be referred to as an OC (Oxide Conductor) electrode.

The metal oxide 552 may have a function of part of a gate insulating film. For that reason, when silicon oxide, silicon oxynitride, or the like is used for the insulator 550, the metal oxide 552 is preferably a metal oxide that is a high-k material with a high dielectric constant. Such a stacked-layer structure can be thermally stable and can have a high dielectric constant. Accordingly, a gate potential that is applied during operation of the transistor can be reduced while the physical thickness is maintained. In addition, the equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 500D can be increased without a reduction in influence of electric fields from the conductor 560. Meanwhile, with the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric fields applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one or more selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate is preferable because it has higher heat resistance than a hafnium oxide film and thus is less likely to be crystallized by heat treatment in later steps. Note that the metal oxide 552 is not an essential component. Design is appropriately determined in consideration of required transistor characteristics.

The insulator 570 is preferably formed using an insulating material having a function of inhibiting the passage of oxygen and impurities such as water or hydrogen. For example, aluminum oxide or hafnium oxide is preferably used. Thus, oxidation of the conductor 560 due to oxygen from above the insulator 570 can be inhibited. Moreover, impurities such as water or hydrogen from above the insulator 570 can be prevented from entering the oxide 530 through the conductor 560 and the insulator 550.

The insulator 571 functions as a hard mask. By provision of the insulator 571, the conductor 560 can be processed to have a side surface that is substantially perpendicular; specifically, the angle formed by the side surface of the conductor 560 and the substrate surface can be greater than or equal to 75° and less than or equal to 100°, preferably greater than or equal to 80° and less than or equal to 95°.

The insulator 571 may be formed using an insulating material having a function of inhibiting the passage of oxygen and impurities such as water or hydrogen so that the insulator 571 also functions as a barrier layer. In this case, the insulator 570 is not necessarily provided.

Parts of the insulator 570, the conductor 560, the metal oxide 552, the insulator 550, and the oxide 530c are selectively removed using the insulator 571 as a hard mask, whereby their side surfaces can be substantially aligned with each other and the surface of the oxide 530b can be partly exposed.

The transistor 500D includes the region 531a and the region 531b on part of the exposed surface of the oxide 530b. One of the region 531a and the region 531b functions as the source region, and the other functions as the drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an impurity element refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of the regions of the oxide 530b to which the impurity element is added decreases. For that reason, the region 531a and the region 531b are sometimes referred to impurity regions or low-resistance regions.

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between the channel formation region and the source/drain region (the region 531a or the region 531b). The formation of the region 531a and the region 531b in a self-aligned manner achieves a higher on-state current, a lower threshold voltage, and a higher operating frequency, for example.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 575. In this case, the insulator 575 serves as a mask like the insulator 571 or the like. Thus, the impurity element is not added to the region of the oxide 530b overlapping with the insulator 575, so that the electrical resistivity of the region can be kept high.

The transistor 500D includes the insulator 575 on the side surfaces of the insulator 570, the conductor 560, the metal oxide 552, the insulator 550, and the oxide 530c. The insulator 575 is preferably an insulator having a low dielectric constant. The insulator 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used as the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 500D also includes the insulator 544 over the insulator 575 and the oxide 530. The insulator 544 is preferably formed by a sputtering method. When a sputtering method is used, an insulator containing few impurities such as water or hydrogen can be deposited. For example, aluminum oxide is preferably used for the insulator 544.

Note that an oxide film formed by a sputtering method may extract hydrogen from the component over which the oxide film is formed. For that reason, the hydrogen concentration in the oxide 530 and the insulator 575 can be reduced when the insulator 544 absorbs hydrogen and water from the oxide 530 and the insulator 575.

<<Transistor Structure Example 5>>

Figure 24A:
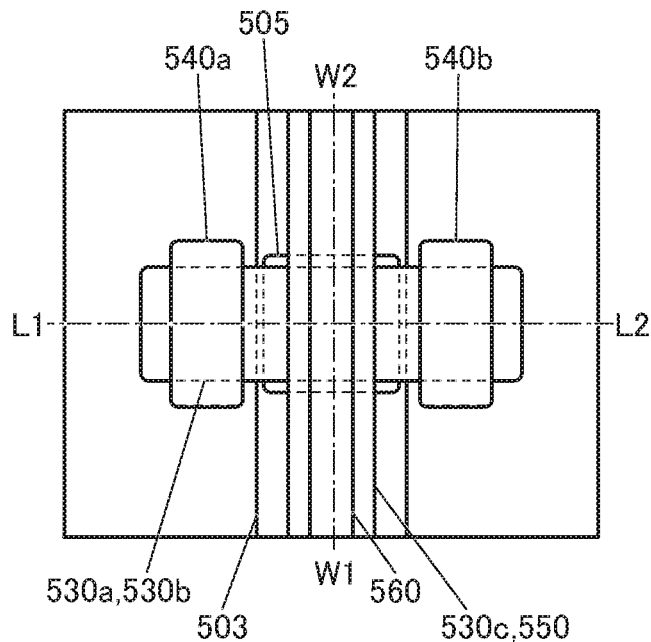
FIGS. 24A to 24C A top view and cross-sectional views illustrating a structure example of a transistor.
Figure 24C:
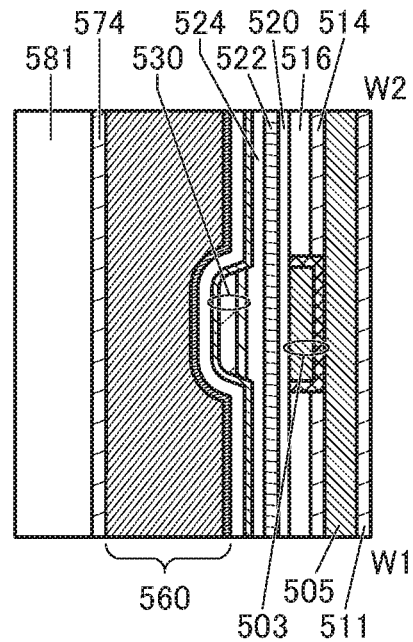
Figure 24B:
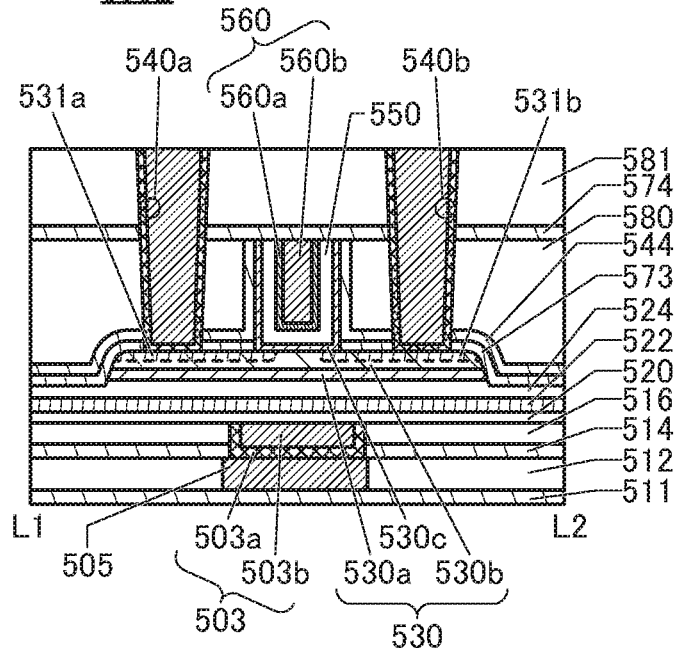

A structure example of a transistor 500E will be described with reference to FIG. 24(A) to FIG. 24(C). FIG. 24(A) is a top view of the transistor 500E. FIG. 24(B) is a cross-sectional view of a portion along the dashed-dotted line L1-L2 in FIG. 24(A). FIG. 24(C) is a cross-sectional view of a portion along the dashed-dotted line W1-W2 in FIG. 24(A). Note that for simplification of the drawing, some components are not illustrated in the top view in FIG. 24(A).

The transistor 500E is a variation example of the above transistors. Therefore, differences from the above transistors are mainly described to avoid repeated description.

In FIG. 24(A) to FIG. 24(C), the conductor 542a and the conductor 542b are not provided, and part of the exposed surface of the oxide 530b includes the region 531a and the region 531b. One of the region 531a and the region 531b functions as a source region, and the other functions as a drain region. Moreover, an insulator 573 is provided between the oxide 530b and the insulator 544.

The region 531a and the region 531b illustrated in FIG. 24 are regions where an element described below is added to the oxide 530b. The region 531a and the region 531b can be formed using a dummy gate, for example.

Specifically, a dummy gate is provided over the oxide 530*b*, and an element that reduces the resistance of some regions of the oxide 530*b* is added using the dummy gate as a mask. That is, the element is added to regions of the oxide 530 that do not overlap with the dummy gate, whereby the region 531*a* and the region 531*b* are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of some regions of the oxide 530*b* are boron and phosphorus. Moreover, hydrogen, carbon, nitrogen, fluorine, sulfur, chlorine, titanium, a rare gas, or the like may be used. Typical examples of a rare gas include helium, neon, argon, krypton, and xenon. The concentration of the element can be measured by secondary ion mass spectrometry (SIMS) or the like.

In particular, boron and phosphorus can be added by an apparatus in the manufacturing line for a Si transistor containing amorphous silicon, low-temperature polysilicon, or the like in its semiconductor layer; thus, the resistance of part of the oxide 530*b* can be reduced by using the apparatus in the manufacturing line. That is, part of the manufacturing line for a Si transistor can be used in the process of manufacturing the transistor 500E.

Next, an insulating film to be the insulator 573 and an insulating film to be the insulator 544 may be formed over the oxide 530*b* and the dummy gate. Stacking the insulating film to be the insulator 573 and the insulating film to be the insulator 544 can provide a region where the region 531*a* or the region 531*b*, the oxide 530*c*, and the insulator 550 overlap with each other.

Specifically, after an insulating film to be the insulator 580 is provided over the insulating film to be the insulator 544, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 544 and the insulator 573 are exposed at the side surface of the opening provided in the insulator 580, and the region 531*a* and the region 531*b* provided in the oxide 530*b* are partly exposed at the bottom surface of the opening. Next, an oxide film to be the oxide 530*c*, an insulating film to be the insulator 550, and a conductive film to be the conductor 560 are formed in this order in the opening, and then are partly removed by CMP treatment or the like until the insulator 580 is exposed; consequently, the transistor illustrated in FIG. 24 can be formed.

Note that the insulator 573 and the insulator 544 are not essential components. Design is appropriately determined in consideration of required transistor characteristics.

The cost of the transistor illustrated in FIG. 24 can be reduced because an existing apparatus can be used and the conductor 542*a* and the conductor 542*b* are not provided.

<<Transistor Structure Example 6>>

Although FIG. 19 illustrates the structure example in which the conductor 560 functioning as the gate is formed inside the opening in the insulator 580, it is possible to employ a structure where the insulator is provided above the conductor, for example. FIG. 25 and FIG. 26 illustrate a structure example of such a transistor.

Figure 25A:
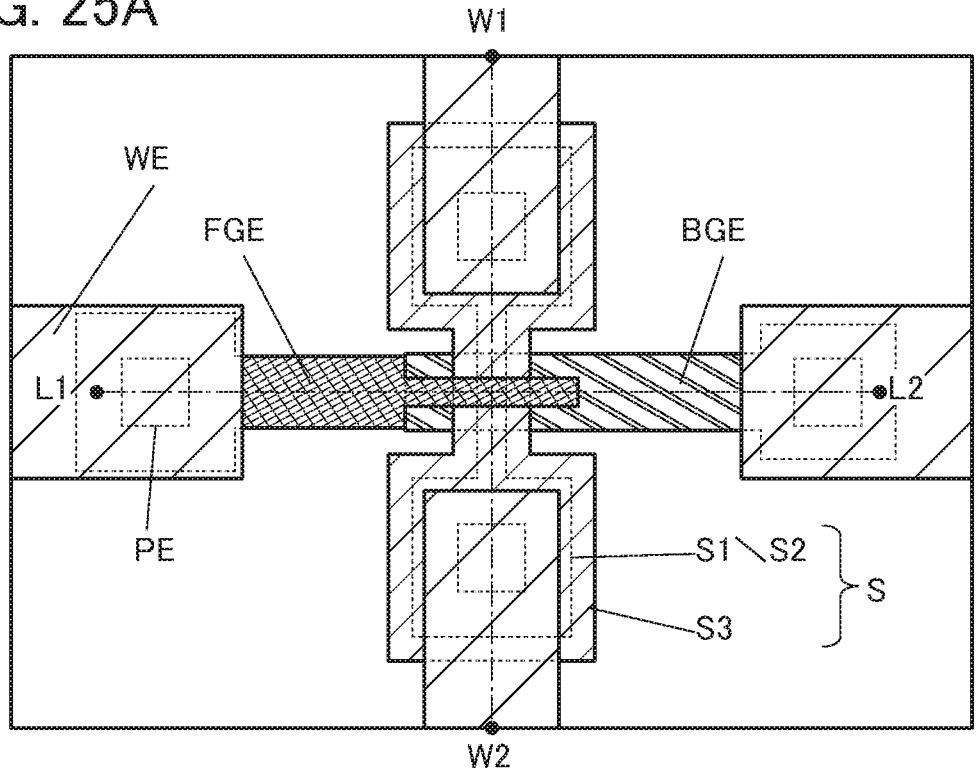
FIGS. 25A and 25B A top view and a perspective view illustrating a structure example of a transistor.
Figure 25B:
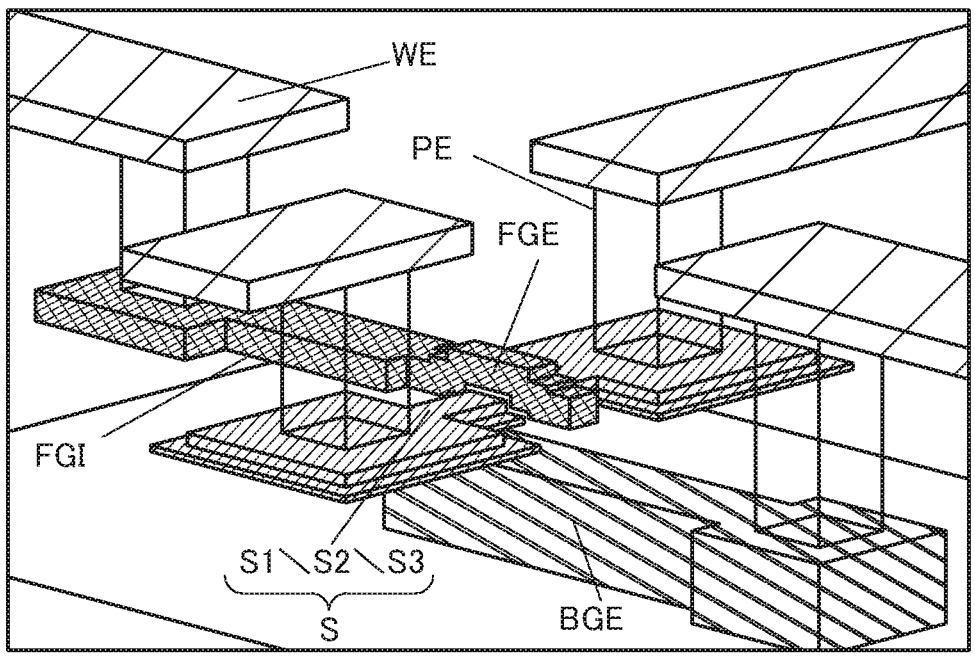
Figure 26A:
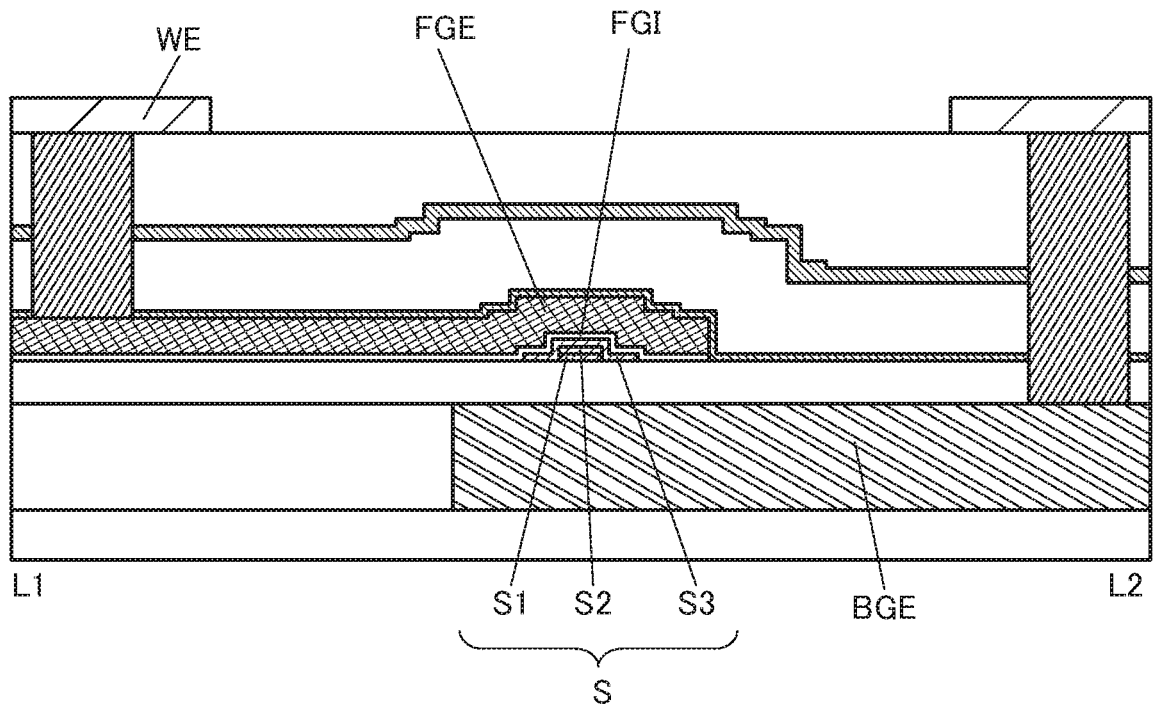
FIGS. 26A and 26B Cross-sectional views illustrating a structure example of a transistor.
Figure 26B:
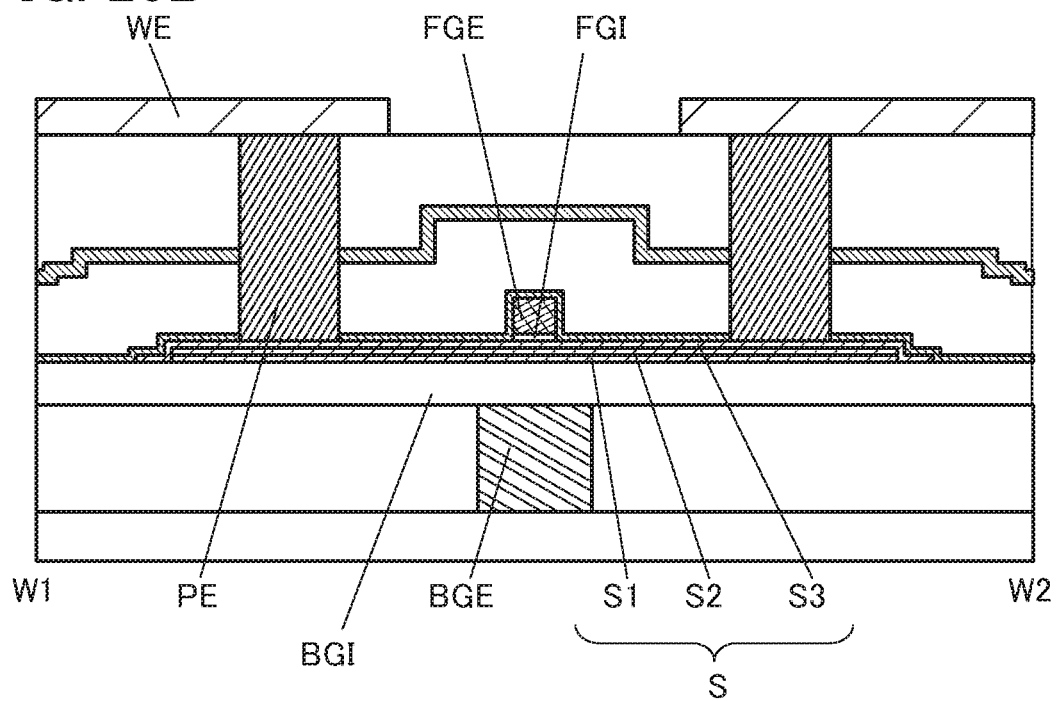

FIG. 25(A) is a top view of the transistor, and FIG. 25(B) is a perspective view of the transistor. FIG. 26(A) is a cross-sectional view along L1-L2 in FIG. 25(A), and FIG. 26(B) is a cross-sectional view along W1-W2.

The transistor illustrated in FIG. 25 and FIG. 26 includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S, the conductor BGE, or the conductor FGE. An example where the oxide semiconductor S includes three layers of oxides S1, S2, and S3 is shown here.

Note that this embodiment can be combined with the other embodiments and/or the example in this specification as appropriate.

Embodiment 4

In this embodiment, the compositions of a CAC-OS (Cloud-Aligned Composite Oxide Semiconductor) and a CAAC-OS (C-axis Aligned Crystalline Oxide Semiconductor), which are metal oxides that can be used in the OS transistor described in the above embodiments, will be described. Note that in the specification and the like, the CAC refers to an example of a function or a material composition, and the CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

Note that when the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8\times10^{11}$ $cm^{-3}$, preferably lower than $1\times10^{11}$ $cm^{-3}$, further preferably lower than $1\times10^{10}$ $cm^{-3}$, and greater than or equal to $1\times10^{-9}$ $cm^{-3}$.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with the other embodiments and/or the example in this specification as appropriate.

Embodiment 5

In this embodiment, examples of products in which the semiconductor device described in the above embodiments is used for an electronic device will be described.

<Laptop Personal Computer>

Figure 27A:
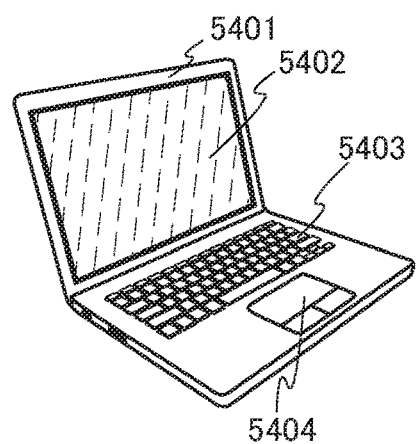
FIGS. 27A to 27H Perspective views illustrating examples of electronic devices.

The semiconductor device of one embodiment of the present invention can be used for a display provided in an information terminal device. FIG. 27(A) is a laptop personal computer, which is an information terminal device. The laptop personal computer includes a housing 5401, a display portion 5402, a keyboard 5403, a pointing device 5404, and the like.

<Smartwatch>

Figure 27B:
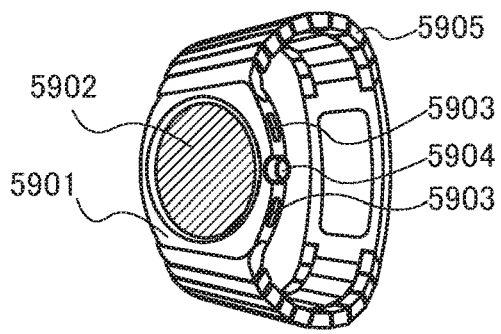

The semiconductor device of one embodiment of the present invention can be used for a wearable terminal. FIG. 27(B) is a smartwatch, which is a wearable terminal. The smart watch includes a housing 5901, a display portion 5902, operation buttons 5903, an operator 5904, a band 5905, and the like. A display device with a function of a position input device may be used for the display portion 5902. The function of the position input device can be added by provision of a touch panel in a display device. Alternatively, the function of the position input device can be added by provision of a photoelectric conversion element called a photosensor in a pixel portion of a display device. As the operation buttons 5903, any of a power switch for activating the smartwatch, a button for operating an application of the smartwatch, a volume control button, a switch for turning on or off the display portion 5902, and the like can be provided. Although the number of operation buttons 5903 is two in the smartwatch illustrated in FIG. 27(B), the number of operation buttons included in the smartwatch is not limited thereto. The operator 5904 functions as a crown used for setting the time on the smartwatch. In addition, the operator 5904 may be used as an input interface for operating an application of the smartwatch as well as the crown for time adjustment. Although the smartwatch illustrated in FIG. 27(B) has the operator 5904, without being limited thereto, a structure without the operator 5904 may be used.

<Video Camera>

Figure 27C:
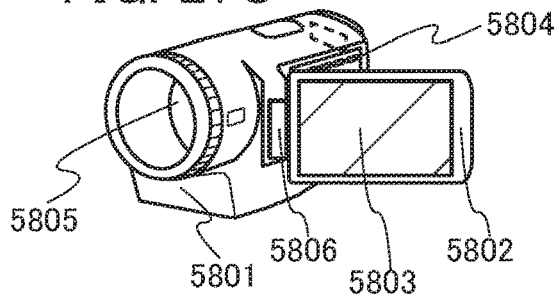

The semiconductor device of one embodiment of the present invention can be used for a video camera. The video camera illustrated in FIG. 27(C) includes a first housing 5801, a second housing 5802, a display portion 5803, operation keys 5804, a lens 5805, a joint portion 5806, and the like. The operation keys 5804 and the lens 5805 are provided in the first housing 5801, and the display portion 5803 is provided in the second housing 5802. The first housing 5801 and the second housing 5802 are connected to each other with the joint portion 5806, and the angle between the first housing 5801 and the second housing 5802 can be changed with the joint portion 5806. A structure in which images on the display portion 5803 are changed in accordance with the angle at the joint portion 5806 between the first housing 5801 and the second housing 5802 may be employed.

<Mobile Phone>

Figure 27D:
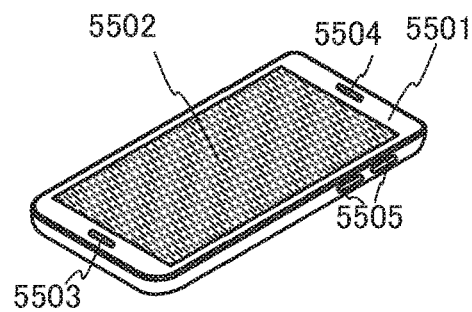

The semiconductor device of one embodiment of the present invention can be used for a mobile phone. FIG. 27(D) is a mobile phone that has a function of an information terminal and includes a housing 5501, a display portion 5502, a microphone 5503, a speaker 5504, and operation buttons 5505. A display device with a function of a position input device may be used for the display portion 5502. The function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the mobile phone illustrated in FIG. 27(D) includes two operation buttons 5505, the number of operation buttons included in the mobile phone is not limited thereto. Although not illustrated, the mobile phone illustrated in FIG. 27(D) may include a light-emitting device for use as a flash light or a lighting device.

<Stationary Game Console>

Figure 27E:
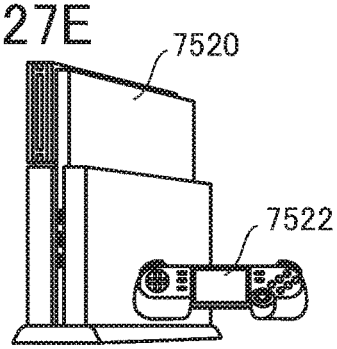

The semiconductor device of one embodiment of the present invention can be used for a stationary game console, which is an example of game machines. FIG. 27(E) illustrates a game console main unit 7520 and a controller 7522 as a stationary game console. The controller 7522 can be connected to the game console main unit 7520 with or without a wire. Although not illustrated in FIG. 27(E), the controller 7522 can include a display portion that displays a game image, and an input interface besides a button, such as a touch panel, a stick, a rotating knob, and a sliding knob, for example. The shape of the controller 7522 is not limited to that in FIG. 27(E) and may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game console may include a camera, a depth sensor, a microphone, and the like so that the game player can play a game using a gesture and/or a voice instead of a controller.

<Portable Game Console>

Figure 27F:
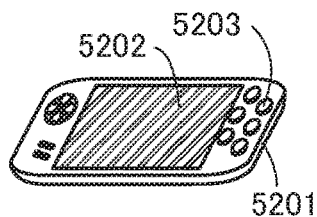

The semiconductor device of one embodiment of the present invention can be used for a portable game console, which is an example of game machines. A portable game console illustrated in FIG. 27(F) includes a housing 5201, a display portion 5202, a button 5203, and the like. Note that the portable game console illustrated in FIG. 27(F) is an example; the position, shape, and number of a display portion, a button, and the like of a portable game console using the semiconductor device of one embodiment of the present invention are not limited to those of the components illustrated in FIG. 27(F). The shape of the housing of the portable game console is not limited to that of the component illustrated in FIG. 27(F).

In the above description, a stationary game console and a portable game console are given as examples of game machines; the semiconductor device of one embodiment of the present invention can also be used for an arcade game machine and the like in addition to the above.

<Television Device>

Figure 27G:
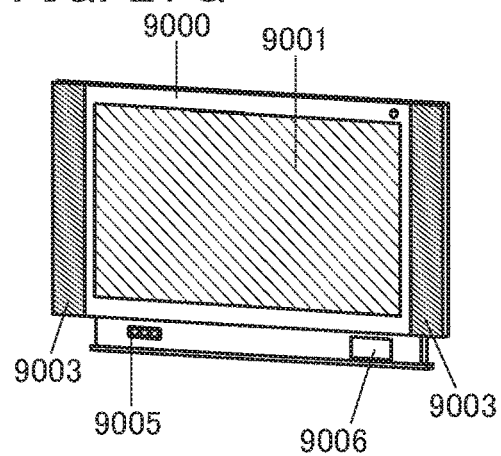

The semiconductor device of one embodiment of the present invention can be used for a television device. A television device illustrated in FIG. 27(G) includes a housing 9000, a display portion 9001, a speaker 9003, an operation key 9005 (including a power switch or an operation switch), a connection terminal 9006, and the like. The television device can include the display portion 9001 having a large screen size of, for example, 50 inches or more, or 100 inches or more.

<Vehicle>

The semiconductor device of one embodiment of the present invention can be used around a driver's seat in a car, which is a vehicle.

Figure 27H:
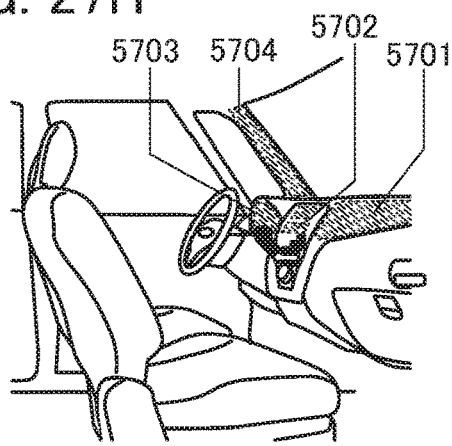

FIG. 27(H) illustrates a windshield and its vicinity inside a car, for example. FIG. 27(H) illustrates a display panel 5701, a display panel 5702, and a display panel 5703 that are attached to a dashboard and a display panel 5704 that is attached to a pillar.

The display panel 5701 to the display panel 5703 can display a variety of information such as navigation information, a speedometer, a tachometer, a mileage, a fuel meter, a gearshift state, and air-conditioner settings. The content, layout, and the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car leads to elimination of blind areas and enhancement of safety. In addition, showing an image for compensating for the area which a driver cannot see makes it possible for the driver to confirm safety more easily and comfortably. The display panel 5704 can also be used as a lighting device.

<Electronic Device for Electronic Advertisement>

Figure 28A:
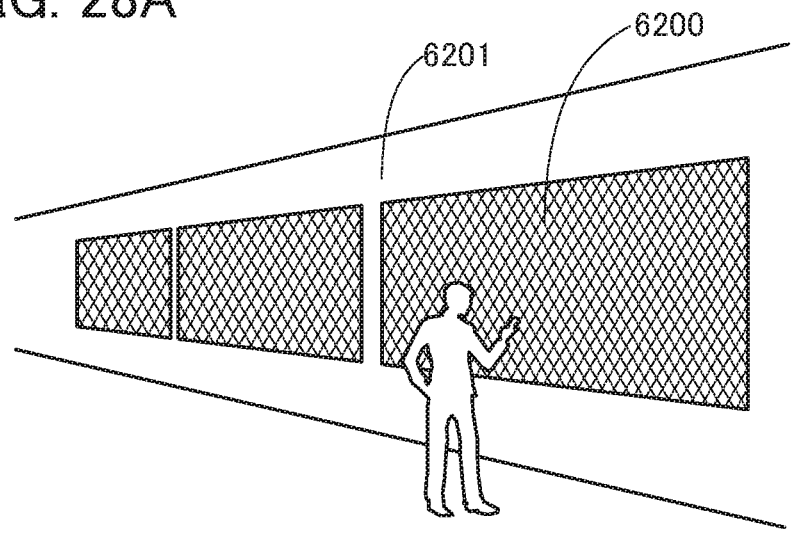
FIGS. 28A and 28B Perspective views illustrating examples of electronic devices.

The semiconductor device of one embodiment of the present invention can be used for a display used for an electronic advertisement. FIG. 28(A) shows an example of digital signage that can be attached to a wall. FIG. 28(A) illustrates how digital signage 6200 is attached to a wall 6201.

<Foldable Tablet Information Terminal>

Figure 28B:
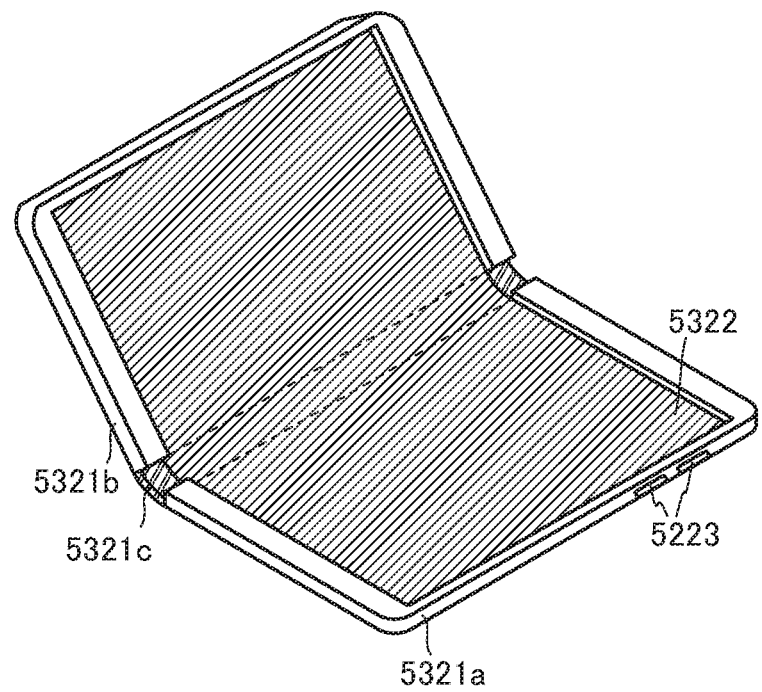

The semiconductor device of one embodiment of the present invention can be used for a tablet information terminal. FIG. 28(B) illustrates a tablet information terminal with a structure that can be folded. The information terminal in FIG. 28(B) includes a housing 5321a, a housing 5321b, a display portion 5322, and operation buttons 5323. In particular, the display portion 5322 includes a flexible base, and the base enables a structure that can be folded.

The housing 5321a and the housing 5321b are connected to each other with a hinge portion 5321c that allows the display portion 5322 to be folded in half. The display portion 5322 is provided in the housing 5321a, the housing 5321b, and the hinge portion 5321c.

Although not illustrated, the electronic devices illustrated in FIGS. 27(A) to 27(C) and 27(E) and FIGS. 28(A) and 28(B) may include a microphone and a speaker. With this structure, the above electronic devices can have an audio input function, for example.

Although not illustrated, the electronic devices illustrated in FIGS. 27(A), 27(B), and 27(D) and FIGS. 28(A) and 28(B) may include a camera.

Although not illustrated, the electronic devices illustrated in FIGS. 27(A) to 27(F) and FIGS. 28(A) and 28(B) may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) in the housing. In particular, when a detection device including a sensor for detecting inclination, such as a gyroscope sensor or an acceleration sensor, is provided for the mobile phone illustrated in FIG. 27(D), the direction of the mobile phone (which direction the mobile phone faces with respect to the vertical direction) is determined, so that the display on the display portion 5502 can be automatically changed in accordance with the direction of the mobile phone.

Although not illustrated, the electronic devices illustrated in FIGS. 27(A) to 27(F) and FIGS. 28(A) and 28(B) may include a device for obtaining biological information such as fingerprints, veins, iris, or voice prints. Employing this structure can achieve an electronic device having a biometric identification function.

A flexible base may be used for the display portion of each of the electronic devices illustrated in FIGS. 27(A) to 27(E) and FIG. 28(A). Specifically, the display portion may have a structure in which a transistor, a capacitor, a display element, and the like are provided over a flexible base. Employing this structure can achieve not only the electronic device having a housing with a flat surface as illustrated in FIGS. 27(A) to 27(E) and FIG. 28(A) but also an electronic device having a housing with a curved surface like the dashboard and the pillar illustrated in FIG. 27(F).

As a flexible base that can be used for the display portions in FIGS. 27(A) to 27(F) and FIGS. 28(A) and 28(B), any of the following materials that transmit visible light can be used: a poly(ethylene terephthalate) resin (PET), a poly (ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, and the like. Alternatively, a mixture or a stack including any of these materials may be used.

Note that this embodiment can be combined with the other embodiments and/or the example in this specification as appropriate.

Example

In this example, the operation of an arithmetic circuit of one embodiment of the present invention was verified using a circuit simulator, Silvaco, Inc.'s harmony version 4.13.3R.

Figure 29:
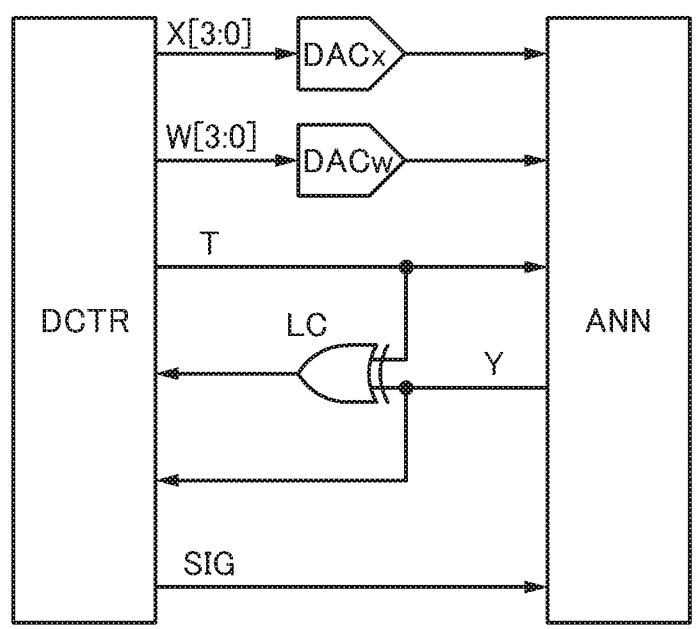
FIG. 29 A block diagram illustrating a circuit used for calculation in Example.

FIG. 29 is a block diagram of a circuit 150 configured by the circuit simulator. The circuit 150 includes a neural network circuit ANN, a digital controller DCTR, a digital-to-analog converter circuit DACx, a digital-to-analog converter circuit DACw, and an XOR (exclusive OR) circuit LC.

The neural network circuit ANN is the arithmetic circuit 100 described in Embodiment 1. In the arithmetic circuit 100 in this example, the memory cell array MCA has five rows, three columns of memory cells AM for holding the first data, three columns of memory cells AM for holding the first reference data, and three columns of memory cells AM for holding the second reference data.

The digital controller DCTR includes a memory device for holding a plurality of parameters to be input to the neural network circuit ANN. Examples of the plurality of parameters are first data W[3:0], second data X[3:0], and teacher data T.

The digital controller DCTR inputs digital first data W[3:0] (weight coefficients) to the digital-to-analog converter circuit DACw to convert the first data W[3:0] into analog values, and inputs the analog first data to the neural network circuit ANN. This operation corresponds to the operation of storing the first data, the first reference data, and the second reference data in the memory cells AM of the memory cell array MCA between Time T01 and Time T04 described in Operation example in Embodiment 1.

The digital controller DCTR inputs digital second data X[3:0] to the digital-to-analog converter circuit DACx to convert the second data X[3:0] into an analog value, and inputs the analog first data to the neural network circuit ANN. This operation corresponds to the operation of applying a potential corresponding to the second data to the wiring VL[1] and the wiring VL[2] between Time T05 and Time T07 described in Operation example in Embodiment 1.

The digital controller DCTR inputs the teacher data T to the neural network circuit ANN. This operation corresponds to the operation where the teacher data is input to the terminal gi3 of the learning circuit LEC between Time T07 and Time T08 described in Operation example in Embodiment 1. Moreover, the digital controller DCTR has a function of inputting the teacher data to a first input terminal of the XOR circuit LC.

The digital controller DCTR has a function of transmitting an instruction signal SIG to the neural network circuit ANN. When receiving the instruction signal SIG, the neural network circuit ANN performs operation such as product-sum operation of the first data and the second data, calculation of the value of an activation function, and updating of the first data with the teacher data. Moreover, when receiving the instruction signal, the neural network circuit ANN transmits the result of the operation to the digital controller DCTR. Specifically, the neural network circuit ANN transmits arithmetic result data Y (corresponding to the arithmetic result data described in Embodiment 1) as a calculated value of the activation function also to a second input terminal of the XOR circuit LC.

The XOR circuit LC has a function of performing exclusive OR of the teacher data T input to the first input terminal and the arithmetic result data Y input to the second input terminal. Furthermore, the XOR circuit LC has a function of transmitting "0" to the digital controller when the teacher data and the arithmetic result data match, and transmitting "1" as an error signal to the digital controller when the teacher data and the arithmetic result data do not match.

In the calculation of this example, test data were classified with the circuit configuration illustrated in FIG. 29. As the test data, the Iris data set (Fisher, R. A. (1936) The use of multiple measurements in taxnomicproblems. Annals of Eugenics, 7, Part II, 179-188) was used. The Iris data set includes data on the length and width of sepals and petals of three species of iris: *Setosa, Versicolor,* and *Virginica*.

In this example, the data on sepals and petals of two species of *Setosa* and *Versicolor* were classified as the test data.

Figure 30:
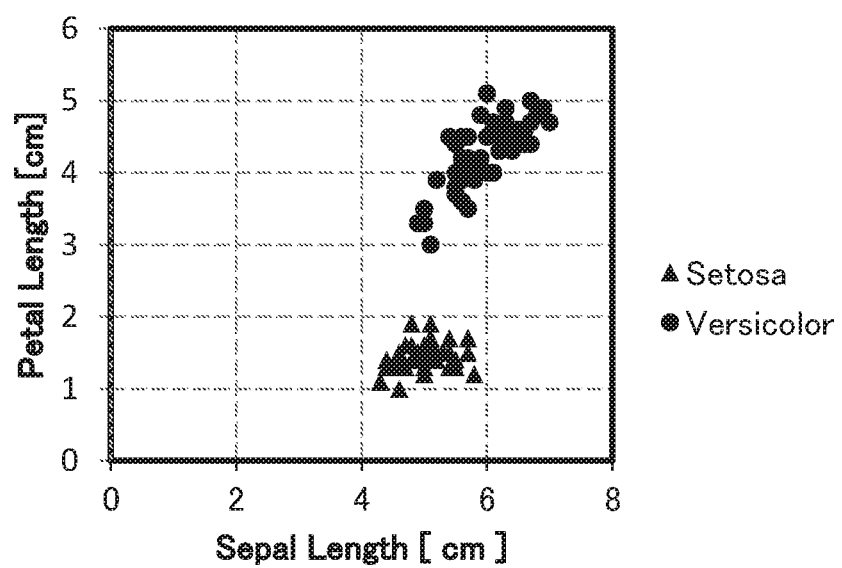
FIG. 30 A distribution chart showing classification of test data in Example.

FIG. 30 is a distribution chart of *Setosa* and *Versicolor* plotted with the sepal (Petal Length) as the vertical axis and the petal (Sepal Length) as the horizontal axis. Note that the number of plotted data points is 50 for each of *Setosa* and *Versicolor.*

First, the same value was input as all the first data W to be held in the memory cells AM of the neural network circuit ANN. Note that the first data W may have a given value or a random value. The neural network circuit ANN updates the first data W one or more times while learning is performed, as has been described in Embodiment 1.

In the circuit 150, the amount of two features of the sepal length and the petal length was converted into an 8-bit binary number (digital value) by using the digital controller DCTR. Next, the feature amount, which has been converted into a digital value, was converted into an analog value by the digital-to-analog converter circuit DACx, and the feature amount, which has been converted into an analog value, was input to the neural network circuit ANN as the second data X. Note that the feature amount is randomly selected from a total of 100 pieces of test data (50 pieces for each of *Setosa* and *Versicolor*). In addition, at the same time as the input of the second data X, the teacher data of the feature amount (the second data X) is also input to the neural network circuit ANN. The teacher data T input to the neural network circuit ANN at this time is 0 for *Setosa* and 1 for *Versicolor.*

Figure 31:
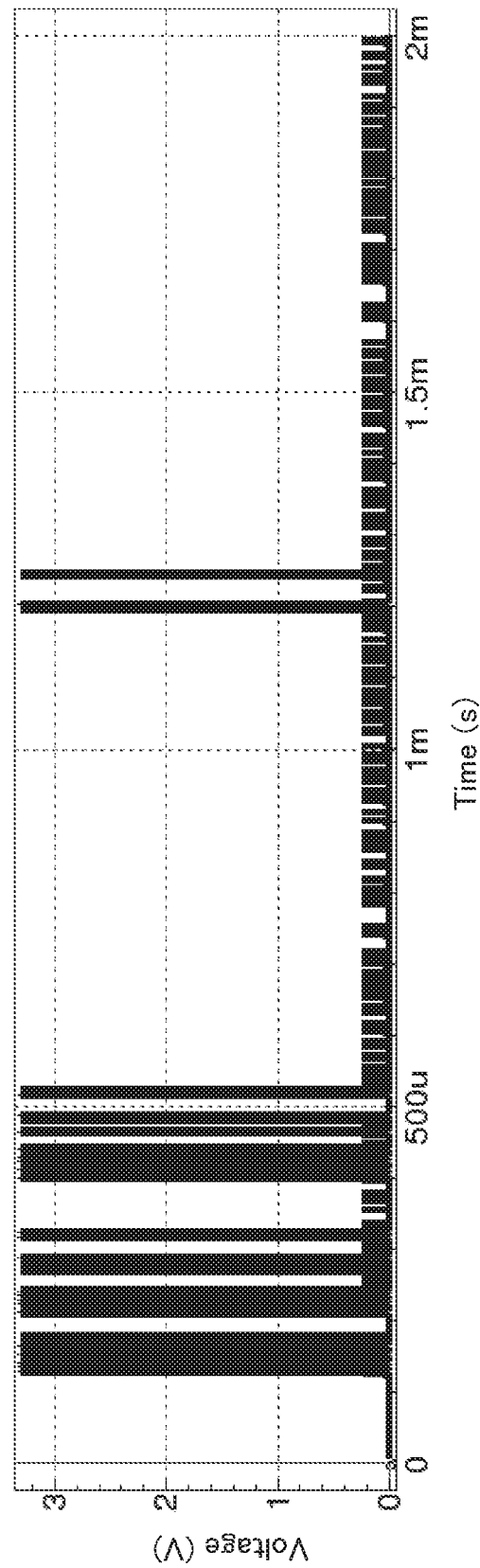
FIG. 31 A graph showing the frequency of updating in Example.

Updating the first data W by leaning is performed once per 4 µs. Every time updating is performed, a feature amount and its teacher data T are randomly selected from the remaining test data and are input to the neural network circuit ANN. FIG. 31 shows the results of classifying *Setosa* and *Versicolor* by the circuit 150 under the condition where the first data W (weight coefficient) is updated in the above manner. In FIG. 31, the vertical axis represents a potential output from an output terminal of the XOR circuit, and the horizontal axis represents time.

The XOR circuit in the circuit 150 outputs a high-level potential to the output terminal when data input to the first input terminal and data input to the second input terminal are different from each other. That is, FIG. 31 demonstrates that the number of mismatches between the arithmetic result data and the teacher data is large between approximately 0 s and 500 µs. Moreover, the number of matches between the arithmetic result data and the teacher data is large between approximately 500 µs to 2.0 ms.

FIGS. 32(A) and 32(B) are graphs showing changes in internal voltages of the circuit 150 when the first data (weight coefficient) was updated 50 times. FIG. 32(A) shows a potential output from the output terminal of the XOR circuit, and FIG. 32(B) shows potentials of first-row and second-row wirings that transmit the update amount (wirings corresponding to HW[1] and HW[2] that transmit the second reference data in the arithmetic circuit 100 illustrated in FIG. 1). As shown in FIGS. 32(A) and 32(B), it is found that the first data (weight coefficient) is updated at the time when a high-level potential is output from the output terminal of the XOR circuit.

The calculation results of this example demonstrate that the arithmetic circuit 100 can update the first data and learning is performed optimally.

Note that this example can be combined with any of the embodiments described in this specification as appropriate.

REFERENCE NUMERALS

MCA: memory cell array, IS: current supply circuit, WDD: circuit, WLD: circuit, VLD: circuit, ACTV: activation function circuit, LEC: learning circuit, AM[1]: memory cell, AM[2]: memory cell, AMxr[1]: memory cell, AMxr[2]: memory cell, AMwr[1]: memory cell, AMwr[2]: memory cell, CS: bias circuit, CM: current mirror circuit, CS1: circuit, CS2: circuit, CS3: circuit, CS4: circuit, CMx: circuit, CMw: circuit, CSx: circuit, CSw: circuit, CSxw: circuit, BL: wiring, BLxr: wiring, BLwr: wiring, WD: wiring, WDxr: wiring, WDwr: wiring, VL[1]: wiring, VL[2]: wiring, WL[1]: wiring, WL[2]: wiring, HW[1]: wiring, HW[2]: wiring, OL: wiring, OL[1]: wiring, OL[2]: wiring, OLxr: wiring, OLwr: wiring, BGL1: wiring, BGL2: wiring, BGL3: wiring, BGL4: wiring, OSP1: wiring, OSP2: wiring, ORP1: wiring, ORP2: wiring, XL: wiring, TL: wiring, VDDL: wiring, GNDL: wiring, VSSL: wiring, VR0: wiring, VaL: wiring, VbL: wiring, VrefL: wiring, RST: wiring, SWAL: wiring, ST: wiring, STB: wiring, CREF: wiring, SH: wiring, LT: wiring, LTB: wiring, VGCR: wiring, VGCB: wiring, CLKL: wiring, CLKLB: wiring, RSTL: wiring, STL: wiring, VBCS: wiring, VBIS: wiring, SET: wiring, SCO: wiring, SCOB: wiring, COMI: wiring, COMO: wiring, VCOM: wiring, SW1: wiring, SW2: wiring, SW3: wiring, SW3B: wiring, SW4: wiring, SW5: wiring, SW5B: wiring, SW6: wiring, SW7: wiring, SW7B: wiring, VBSL: wiring, NM: node, Na: node, Nb: node, NT1: node, NT2: node, NT3: node, co: terminal, coxr: terminal, cowr: terminal, ai: terminal, ao: terminal, afb: terminal, gi1: terminal, gi2[1]: terminal, gi2[2]: terminal, gi3: terminal, gi4: terminal, ii: terminal, io[1]: terminal, io[2]: terminal, m1: terminal, m2: terminal, m3: terminal, m4: terminal, m5: terminal, d1: terminal, d2: terminal, dx: terminal, dw: terminal, d: terminal, cp1: terminal, cp2: terminal, cp3: terminal, cp4: terminal, nt1: input terminal, nt2: input terminal, st1: output terminal, st2: output terminal, inn: terminal, inp: terminal, ILN: terminal, ILP: terminal, outn: terminal, outp: terminal, ct2: terminal, ct3: terminal, ct4: terminal, ip: terminal, in: terminal, op: terminal, on: terminal, INP: terminal, INN: terminal, OLP: terminal, OLN: terminal, VC1: constant voltage source, VC2: constant voltage source, VC3: constant voltage source, SWA: switch, SWB1: switch, SWB2: switch, SWB3: switch, SWB4: switch, SWB5: switch, SWB6: switch, SWC: switch, CMP: comparator, DIAa: differential amplifier, DIAb: differential amplifier, FDA: fully differential amplifier, LAT: circuit, CIRA: circuit, CIRB: circuit, CIRC: circuit, ADA[1]: adder circuit, ADA[2]: adder circuit, ADB[1]: adder circuit, ADB[2]: adder circuit, MLT[1]: multiplier circuit, MLT[2]: multiplier circuit, ITG[1]: integrator circuit, ITG[2]: integrator circuit, CC1: chopper circuit, CC2: chopper circuit, CC3: chopper circuit, Tr1: transistor, Tr2: transistor, Tr6: transistor, Tr7: transistor, Tr8: transistor, Tr11: transistor, Tr12: transistor, Tr13: transistor, Tr14: transistor, Tr15: transistor, Tr16: transistor, Tr17: transistor, Tr18: transistor, Tr19: transistor, Tr21: transistor, Tr22: transistor, Tr23: transistor, Tr24: transistor, Tr26: transistor, Tr27: transistor, Tr28: transistor, Tr29: transistor, A1: transistor, A2: transistor, A3: transistor, A4: transistor, A5: transistor, A6: transistor, A7: transistor, A8: transistor, A9: transistor, A10: transistor, A11: transistor, A12: transistor, A13: transistor, A14: transistor, A15: transistor, A16: transistor, A17: transistor, A18: transistor, A19: transistor, A20: transistor, A21: transistor, A22: transistor, A23: transistor, A24: transistor, A25: transistor, A26: transistor, A27: transistor, A28: transistor, A29: transistor, A30: transistor, X1: transistor, X2: transistor, X3: transistor, X4: transistor, X5: transistor, X6: transistor, X7: transistor, X8: transistor, X9: transistor, X10: transistor, M1: transistor, M2: transistor, M3: transistor, M4: transistor, M5: transistor, M6: transistor, M7: transistor, M8: transistor, M9: transistor, M10: transistor, M11: transistor, M12: transistor, M13: transistor, M14: transistor, M22: transistor, M23: transistor, M24: transistor, M27: transistor, M28: transistor, M29: transistor, M32: transistor, M33: transistor, M34: transistor, C1: capacitor, C2: capacitor, Cactv: capacitor, CL1: capacitor, CL2: capacitor, CE1: capacitor, CE2: capacitor, CD1: capacitor, CD2: capacitor, CD3: capacitor, CD4: capacitor, CD7: capacitor, CD8: capacitor, CD11: capacitor, CD12: capacitor, B1: capacitor, B2: capacitor, B3: capacitor, B4: capacitor, B5: capacitor, B6: capacitor, B7: capacitor, B8: capacitor, B9: capacitor, B10: capacitor, Y1: capacitor, Y2: capacitor, Y3: capacitor, Y4: capacitor, Y5: capacitor, Y6: capacitor, Y10: capacitor, R1: resistor, R2: resistor, FGE: conductor, BGE: conductor, WE: conductor, PE: conductor, FGI: insulator, BGI: insulator, DCTR: digital controller, DACx: digital-to-analog converter circuit, DACw: digital-to-analog converter circuit, LC: XOR circuit, ANN: neural network circuit, 100: arithmetic circuit, 150: circuit, 200: arithmetic circuit, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 500A: transistor, 500B: transistor, 500C: transistor, 500D: transistor, 500E: transistor, 503: conductor, 503*a*: conductor, 503*b*: conductor, 505: conductor, 510: insulator, 511: insulator, 512: insulator, 514: insulator, 516: insulator, 518: conductor, 520: insulator, 522: insulator, 524: insulator, 530: oxide, 530a: oxide, 530b: oxide, 530c: oxide, 531a: region, 531b: region, 540a: conductor, 540b: conductor, 542a: conductor, 542b: conductor, 543a: region, 543b: region, 544: insulator, 545: insulator, 546: conductor, 546a: conductor, 546b: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576a: insulator, 576b: insulator, 580: insulator, 581: insulator, 582: insulator, 586: insulator, 600: capacitor, 610: conductor, 612: conductor, 620: conductor, 630: insulator, 650: insulator, 5201: housing, 5202: display portion, 5203: button, 5321a: housing, 5321b: housing, 5321c: hinge portion, 5322: display portion, 5323: operation button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint portion, 5901: housing, 5902: display portion, 5903: operation button, 5904: operator, 5905: band, 6200: digital signage, 6201: wall, 7520: game console main unit, 7522: controller, 9000: housing, 9001: display portion, 9003: speaker, 9005: operation key, 9006: connection terminal

The invention claimed is:

1. A semiconductor device comprising:
a first circuit configured to perform first arithmetic operation using a first data and a second data according to a predetermined formula, in order to output a first result;
a second circuit configured to output a first potential using a first current corresponding to the first result;
a third circuit configured to perform second arithmetic operation using the first result, the second data, and teacher data, and to output a second potential corresponding to a second result of the second arithmetic operation; and
a first memory cell electrically connected to the third circuit, the first memory cell storing a third potential,
a second memory cell electrically connected to the first circuit, the second memory cell configured to store a fourth potential corresponding to the first data,
a third memory cell electrically connected to the first circuit and the third circuit, the third memory cell configured to store a fifth potential corresponding to the second data,
wherein the teacher data is data input from outside to the third circuit,
wherein the first circuit is configured to output the first current into the second circuit,
wherein the third circuit is configured to receive the first potential output from the second circuit,
wherein the first result is a result of the first arithmetic operation using the first data and the second data, and
wherein the second result is configured to be input to the third memory cell to update the second data.

2. The semiconductor device according to claim 1,
wherein the second memory cell comprises a plurality of nodes storing a plurality of first potentials independently,
wherein the third memory cell comprises a plurality of nodes storing a plurality of second potentials independently, and
wherein the third circuit is configured to output results of arithmetic operation substituting a data corresponding each of the plurality of first potentials and a data corresponding to each of the plurality of second potentials respectively, using the value corresponding to the third potential.

3. The semiconductor device according to claim 1, wherein the second arithmetic operation is performed a plurality of times to obtain the updated result.

4. The semiconductor device according to claim 1, wherein the third circuit comprises an integrator circuit.

5. The semiconductor device according to claim 4,
wherein the second arithmetic operation is performed a plurality of times, and
wherein the integrator circuit output a total of the second arithmetic operation performed the plurality of times.

6. The semiconductor device according to claim 1,
wherein the second circuit comprises a comparator and a resistor,
wherein one of an inverting input terminal and a non-inverting input terminal of the comparator is electrically connected to the resistor, and
wherein an output terminal of the comparator is electrically connected to the third circuit.

7. The semiconductor device according to claim 1,
wherein the first memory cell comprises a first transistor, a second transistor, a first capacitor and a second capacitor,
wherein a first terminal of the first transistor is electrically connected to each of a gate of the second transistor, a first terminal of the first capacitor and a first terminal of the second capacitor, and
wherein a first terminal of the second transistor is configured to output the first current.

8. The semiconductor device according to claim 7, wherein the first transistor and the second transistor overlap each other.

9. The semiconductor device according to claim 8, wherein each of the first transistor and the second transistor comprises a metal oxide in a channel formation region.

10. The semiconductor device according to claim 1,
wherein the first circuit comprises:
a first wiring configured to flow the first current;
a constant current circuit configured to supply current into the first wiring; and
a current sink circuit configured to draw or supply a current from the first wiring.

11. The semiconductor device according to claim 1, wherein each of the first circuit, the second circuit and the third circuit is a single-polarity circuit.

12. A semiconductor device comprising:
a first circuit electrically connected to a first memory cell through a first wiring;
a second circuit electrically connected to the first circuit through the first wiring; and
a third circuit electrically connected to the first memory cell through a second wiring,
wherein the third circuit is electrically connected to the first memory cell through a third wiring,
wherein the third circuit comprises an input terminal,
wherein the first memory cell comprises a retention node,
wherein the first memory cell is configured to change a potential of the retention node of the first memory cell in accordance with a change in a potential of the second wiring,
wherein the first memory cell is configured to change the potential of the retention node of the first memory cell in accordance with a change in a potential of the third wiring, wherein the first memory cell is configured to make a current corresponding to the potential of the retention node of the first memory cell flow between the first memory cell and the first wiring, wherein the first circuit is configured to supply a current to the first wiring, wherein the second circuit is configured to generate a first potential corresponding to a first current that flows between the first wiring and the second circuit and to output the first potential to the third circuit, wherein a second potential is input to the input terminal of the third circuit, and wherein the third circuit is configured to change the potential of the third wiring by the first potential, the second potential, and the potential of the second wiring.

13. The semiconductor device according to claim 12,
wherein the third circuit comprises an integrator circuit, and
wherein an output terminal of the integrator circuit is electrically connected to the third wiring.

14. The semiconductor device according to claim 12,
wherein the second circuit comprises a comparator, a resistor and a first switch,
wherein one of an inverting input terminal and a non-inverting input terminal of the comparator is electrically connected to the resistor,
wherein the one of the inverting input terminal and the non-inverting input terminal of the comparator is electrically connected to the first wiring through the first switch, and
wherein an output terminal of the comparator is electrically connected to the third circuit.

15. The semiconductor device according to claim 12,
wherein the first circuit comprises:
a first constant current circuit configured to supply current to the first wiring;
a second constant current circuit configured to supply current to the first wiring; and
a current sink circuit configured to draw current from the first constant current circuit or to draw current from the first wiring.

16. The semiconductor device according to claim 15,
wherein the first constant current circuit is configured to generate a second current that flows from the first circuit to the first wiring, as a constant current, when a first retention potential is held in the retention node of the first memory cell, a first initial potential is input from the second wiring, and a second initial potential is input from the third wiring,
wherein the second constant current circuit is configured to generate a third current that flows from the first circuit to the first wiring, as the constant current, when the first retention potential is held in the retention node of the first memory cell, a third potential is input from the second wiring, and the second initial potential is input from the third wiring,
wherein the current sink circuit is configured to draw the second current that flows from the first constant current circuit, as the constant current, when the first retention potential is held in the retention node of the first memory cell, the third potential is input from the second wiring, and the second initial potential is input from the third wiring,
wherein the first constant current circuit is configured to generate a fourth current that flows from the first circuit to the first wiring, as the constant current, when a second retention potential is held in the retention node of the first memory cell, the first initial potential is input from the second wiring, and the second initial potential is input from the third wiring, wherein the first memory cell is configured to make a fifth current corresponding to the second retention potential, the third potential, and the second initial potential flow between the first memory cell and the first wiring, when the second retention potential is held in the retention node of the first memory cell, the third potential is input from the second wiring, and the second initial potential is input from the third wiring, wherein the first circuit is configured to make a sum of the second to fourth currents generated by the first constant current circuit, the second constant current circuit, and the current sink circuit flow through the first wiring, when the second retention potential is held in the retention node of the first memory cell, the third potential is input from the second wiring, and the second initial potential is input from the third wiring, wherein the first current is a difference current between the fifth current and a sum of the second current, the third current and the fourth current, and wherein the third circuit is configured to change the second initial potential of the third wiring to a fourth potential corresponding to the first potential, the second potential, and a potential difference between the first initial potential of the second wiring and the third potential.

17. The semiconductor device according to claim 16,
wherein a difference between the first retention potential and the second retention potential is a potential difference corresponding to first data,
wherein a difference between the first initial potential and the third potential is a potential difference corresponding to second data,
wherein the first current is a current corresponding to a product of the first data and the second data, and
wherein the second potential is a potential corresponding to the teacher data, and a difference between the second initial potential and the fourth potential is a potential difference corresponding to update data.

18. The semiconductor device according to claim 17, further comprising:
a plurality of the first memory cells each electrically connected to the first wiring; and
a plurality of the third circuits,
wherein each of the plurality of first memory cells is electrically connected to the first wiring,
wherein each of the plurality of third circuits is electrically connected to one of the plurality of first memory cells through one of a plurality of second wirings,
wherein each of the plurality of third circuits is electrically connected to one of the plurality of first memory cells through one of a plurality of third wirings,
wherein each retention node of the plurality of first memory cells stores a potential difference corresponding to each of a plural pieces of the first data,
wherein each of potential differences corresponding to a plural pieces of the second data is applied to each of the plurality of second wirings,
wherein the first current is a current corresponding to a product-sum of the plural pieces of first data and the plural pieces of the second data, and
wherein the plurality of third circuits is configured to output potential differences corresponding to a plural pieces of the update data to the plurality of third wirings.

19. The semiconductor device according to claim 12,
wherein the first memory cell comprises a first transistor, a second transistor, a first capacitor, and a second capacitor,
wherein a first terminal of the first transistor is electrically connected to a gate of the second transistor, a first terminal of the first capacitor, and a first terminal of the second capacitor,
wherein a second terminal of the first capacitor is electrically connected to the second wiring,
wherein a second terminal of the second capacitor is electrically connected to the third wiring, and
wherein a first terminal of the second transistor is electrically connected to the first wiring.

20. The semiconductor device according to claim 12,
wherein a channel formation region of each of the first transistor and the second transistor comprises a metal oxide, and
wherein each of the first circuit, the second circuit and the third circuit is a single-polarity circuit.

* * * * *